United States Patent [19]

Sugawara et al.

[11] Patent Number: 5,153,889
[45] Date of Patent: Oct. 6, 1992

[54] SEMICONDUCTOR LIGHT EMITTING DEVICE

[75] Inventors: Hideto Sugawara, Tokyo, Japan; Masayuki Ishikawa, Goleta, Calif.; Yoshihiro Kokubun, Yokohama, Japan; Yukie Nishikawa, Narashino, Japan; Shigeya Naritsuka, Yokohama, Japan; Kazuhiko Itaya, Tokyo, Japan; Genichi Hatakoshi, Yokohama, Japan; Mariko Suzuki, Yokohama, Japan

[73] Assignee: Kabushiki Kaisha Toshiba, Kawasaki, Japan

[21] Appl. No.: 747,128

[22] Filed: Aug. 19, 1991

Related U.S. Application Data

[63] Continuation-in-part of Ser. No. 530,120, May 29, 1990, Pat. No. 5,048,035.

[30] Foreign Application Priority Data

| May 31, 1989 | [JP] | Japan | 1-138869 |
| Aug. 31, 1989 | [JP] | Japan | 1-225641 |
| Nov. 29, 1989 | [JP] | Japan | 1-310247 |
| Aug. 20, 1990 | [JP] | Japan | 2-217080 |
| Aug. 20, 1990 | [JP] | Japan | 2-218608 |
| Mar. 15, 1991 | [JP] | Japan | 3-51358 |

[51] Int. Cl.$^5$ ............................................ H01S 3/19
[52] U.S. Cl. ............................... 372/45; 372/46; 357/16; 357/17
[58] Field of Search ................ 372/46, 46; 357/16, 357/17

[56] References Cited

U.S. PATENT DOCUMENTS

| 4,494,237 | 1/1985 | Di Forte Poisson et al. | 372/45 |
| 4,761,790 | 8/1988 | Hayakawa et al. | 372/45 |
| 4,792,958 | 12/1988 | Ohba et al. | 372/45 |
| 4,809,287 | 2/1989 | Ohba et al. | 372/45 |
| 4,893,313 | 1/1990 | Hatakoshi et al. | 372/45 |
| 4,910,743 | 3/1990 | Ohba et al. | 372/45 |
| 4,922,499 | 5/1990 | Nitta et al. | 372/45 |
| 4,949,349 | 8/1990 | Ohba et al. | 372/45 |

OTHER PUBLICATIONS

Y. K. Su et al., The Fabrication of Single Heterojunction AlGaAs/InGaP Electroluminescent, J. Appl. Phys. vol. 62, pp. 2541-2544.

Isao Hino et al., Room-Temperature Pulsed Operation of AlGaInP/GaInP/AlGaInP Double Heterostructure Visible Light Laser Diodes Grown by Metalorganic Chemical Vapor Deposition, Appl. Phys. Ltt., vol. 43, 1983, pp. 987-989.

H. Asahi et al., Molecular Beam Epitaxial Growth of INGaAIP Visible Laser Diodes Operating at 0.66-0.68 $\mu$m at Room Temperatures, J. Appl. Phys., vol. 54, 1983, pp. 6958-6964.

Primary Examiner—Georgia Y. Epps
Attorney, Agent, or Firm—Oblon, Spivak, McClelland, Maier & Neustadt

[57] ABSTRACT

Disclosed is a semiconductor light emitting device, comprising a semiconductor substrate, a double hetero structure portion formed on the front surface of the substrate and consisting of an InGaAlP active layer and lower and upper clad layers having the active layer sandwiched therebetween, a first electrode formed in a part of the surface of the double hetero structure portion, and a second electrode formed on the back surface of the substrate. A current diffusion layer formed of GaAlAs is interposed between the double hetero structure portion and the first electrode, said current diffusion layer having a thickness of 5 to 30 microns and a carrier concentration of $5 \times 10^{17}$ cm$^{-3}$ to $5 \times 10^{18}$ cm$^{-3}$.

10 Claims, 31 Drawing Sheets

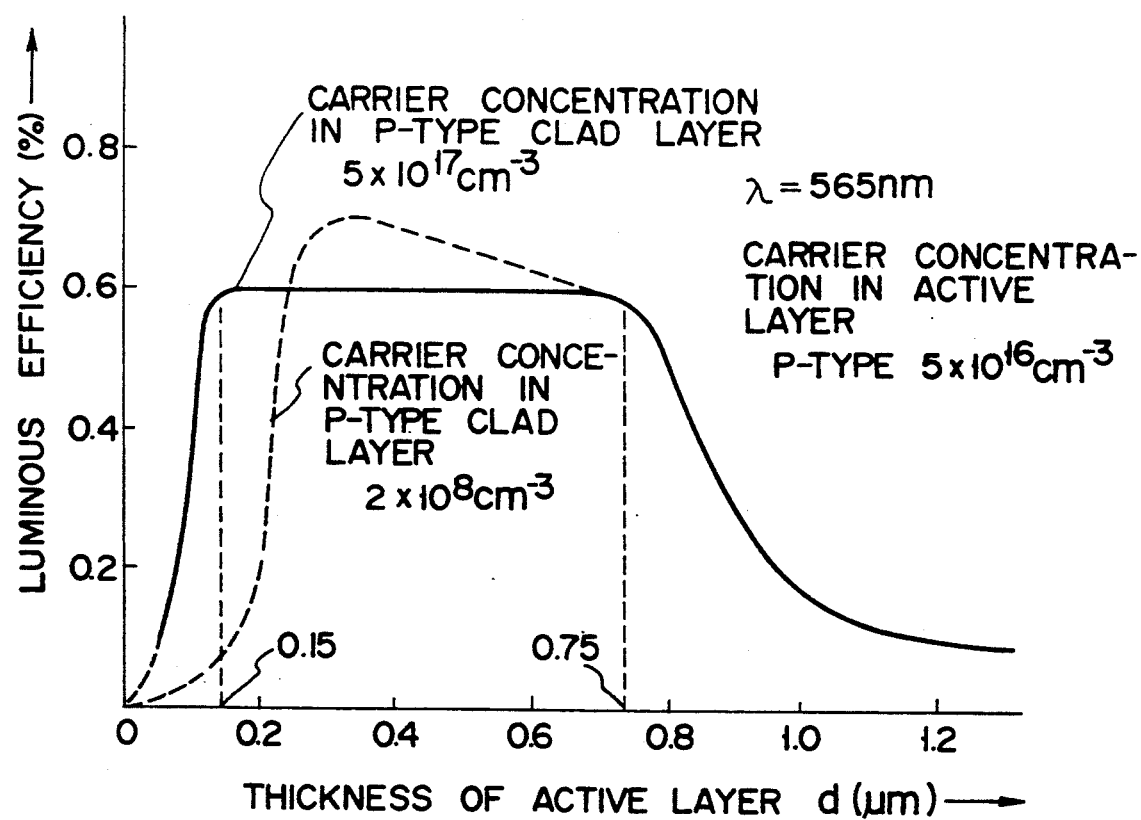
F I G. 4

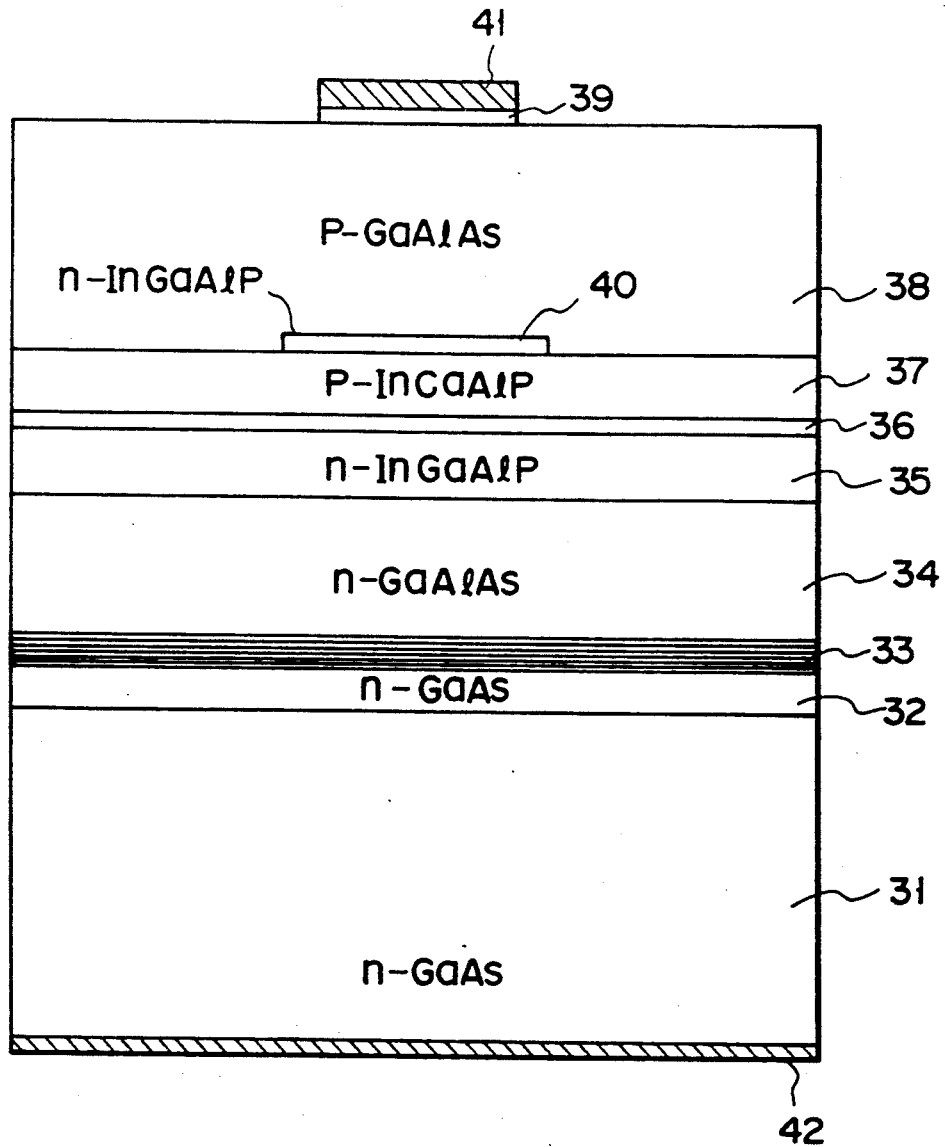
F I G. 6

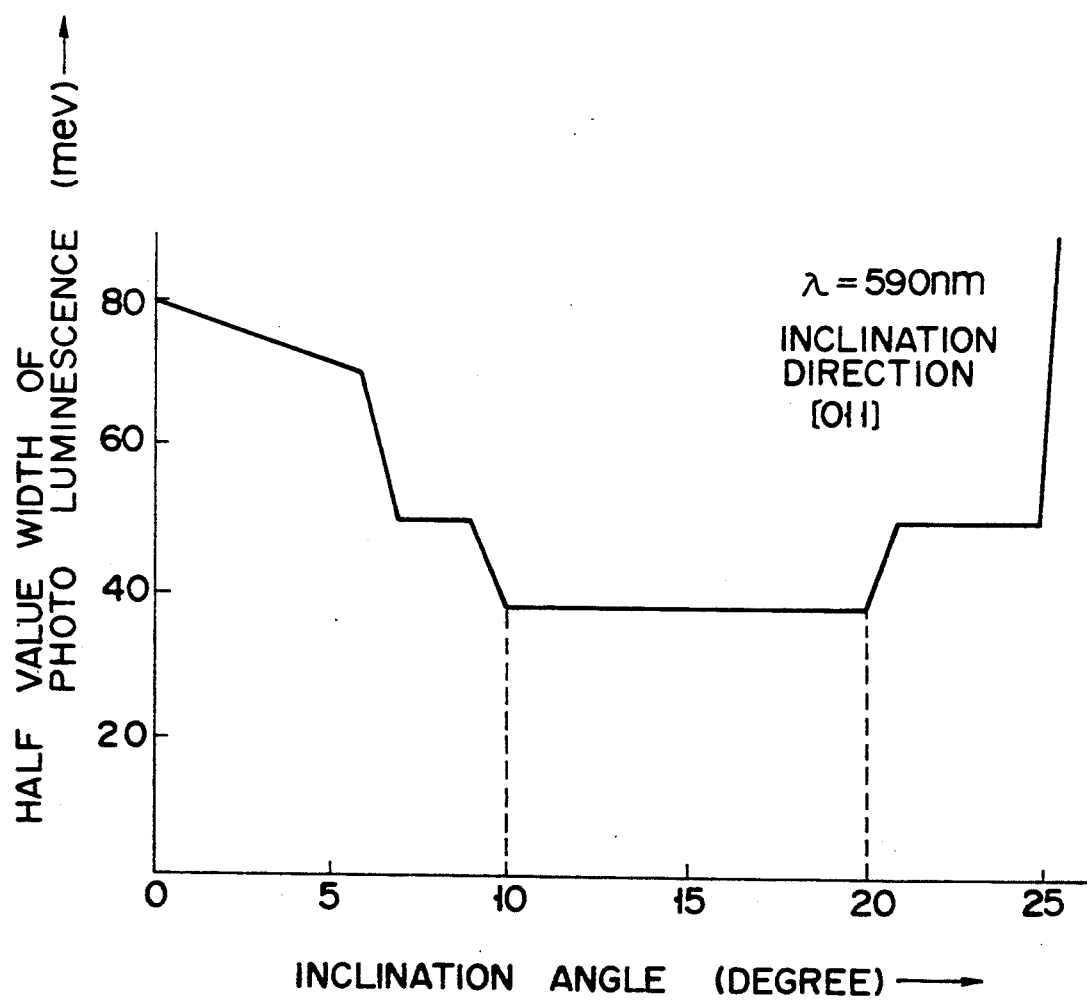
F I G. 8

LIGHT ABSORBENT

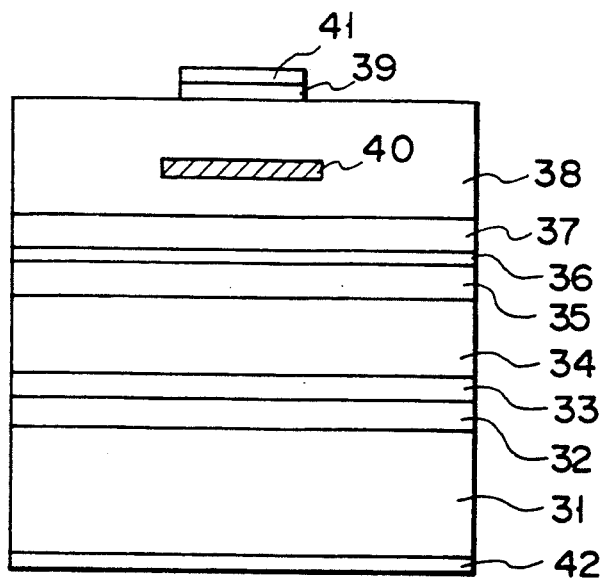
F I G. 21A
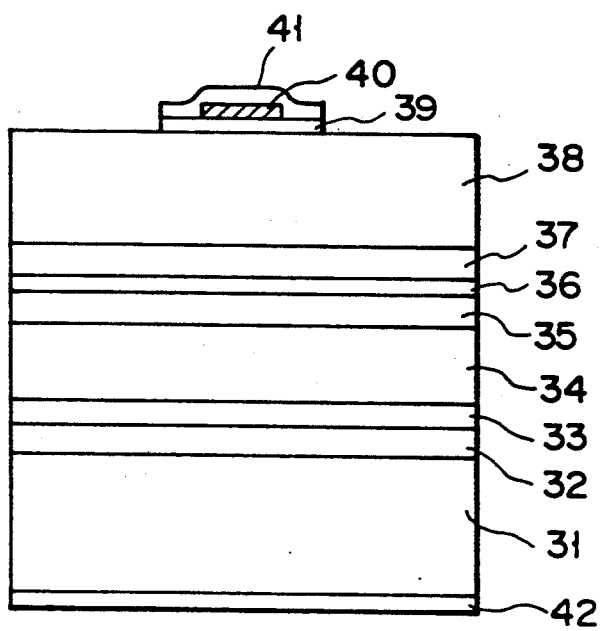
F I G. 21B

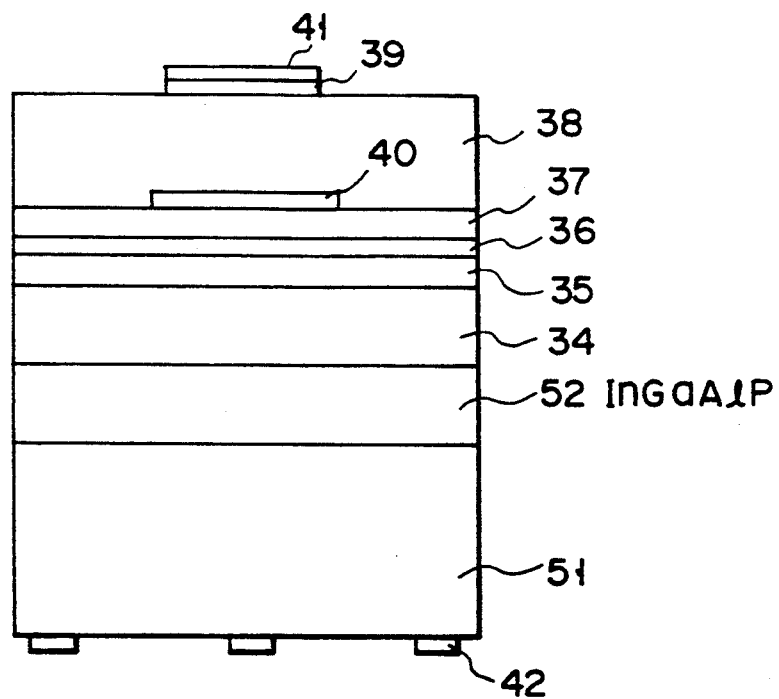
F I G. 24

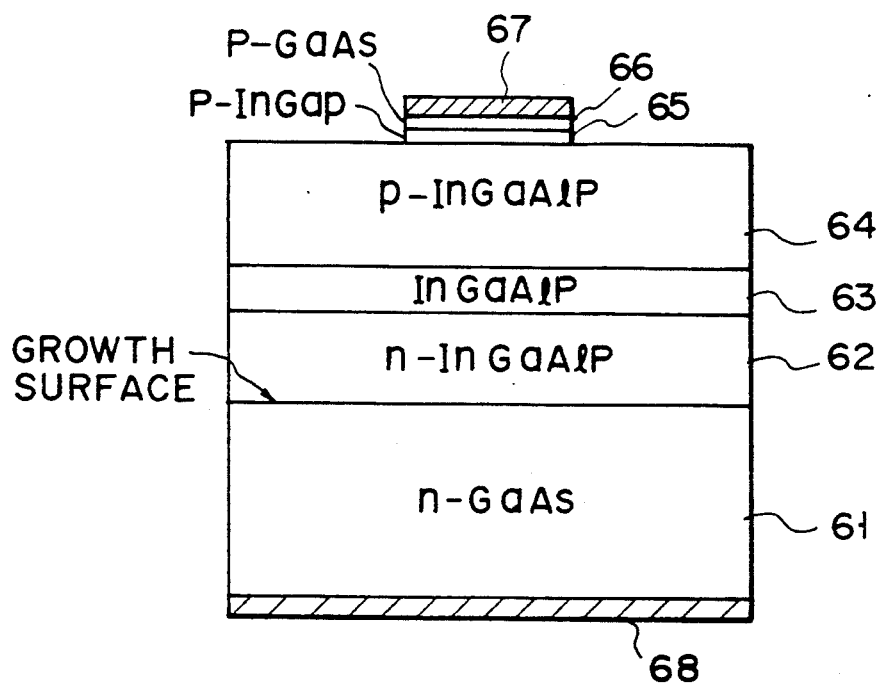
F I G. 25
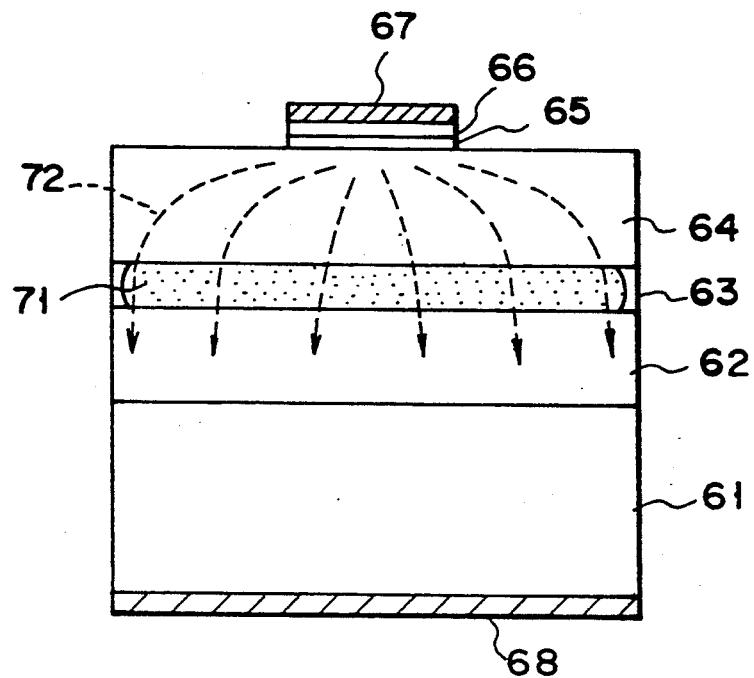
F I G. 26

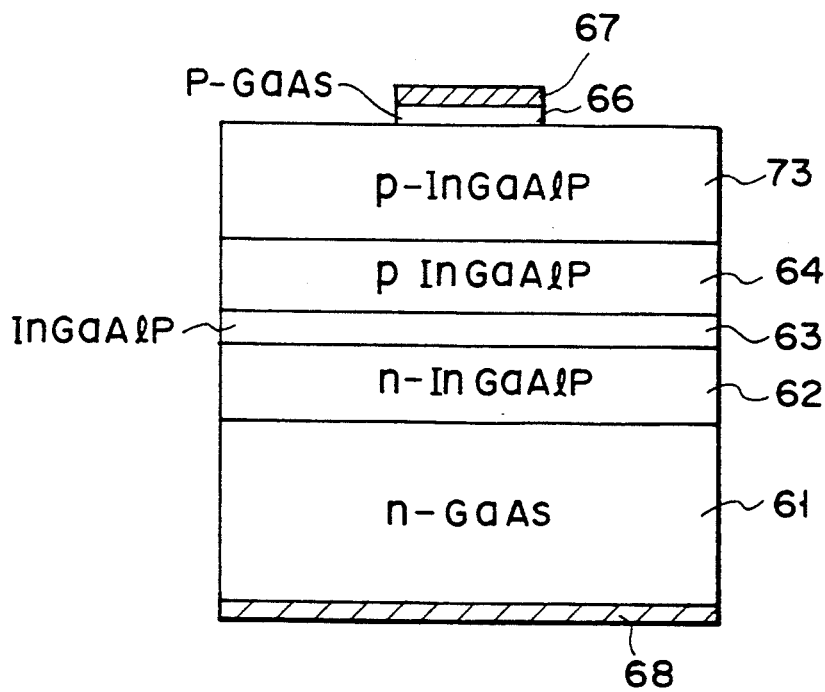
F I G. 30
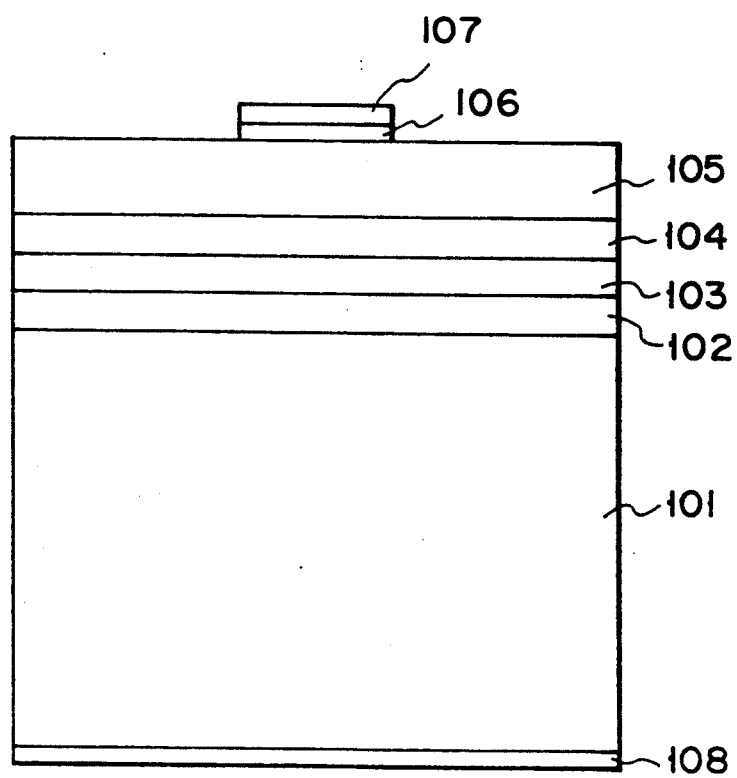
F I G. 31

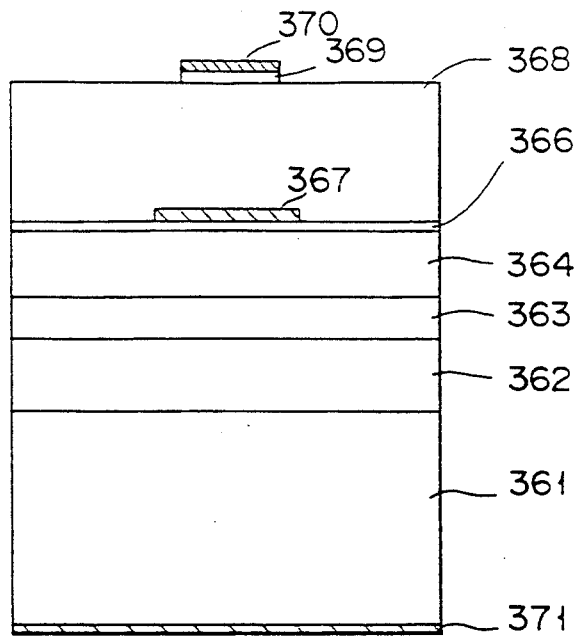
F I G. 39
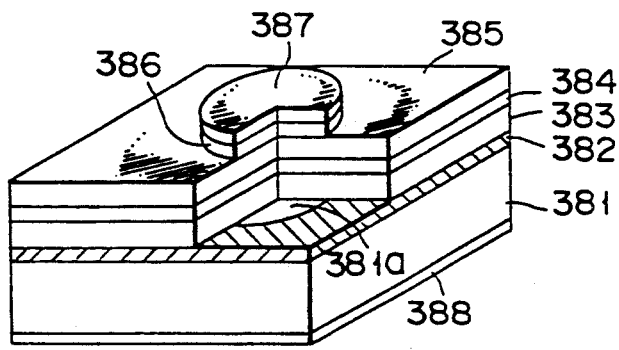
F I G. 40
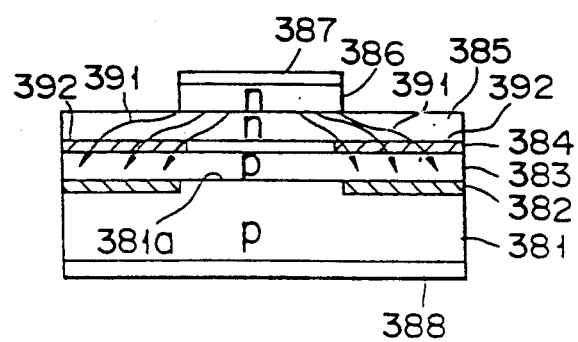
F I G. 41

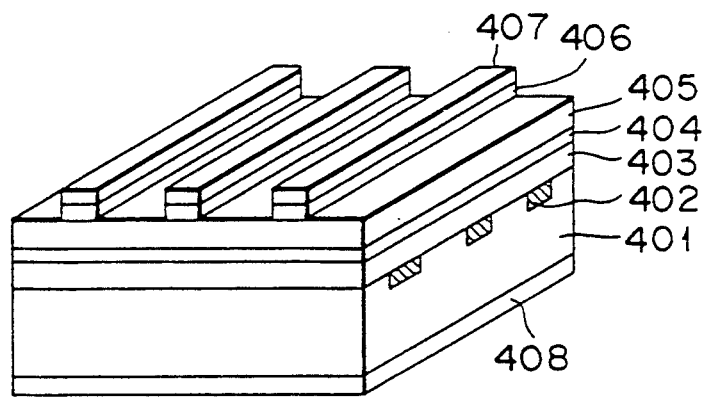
F I G. 42
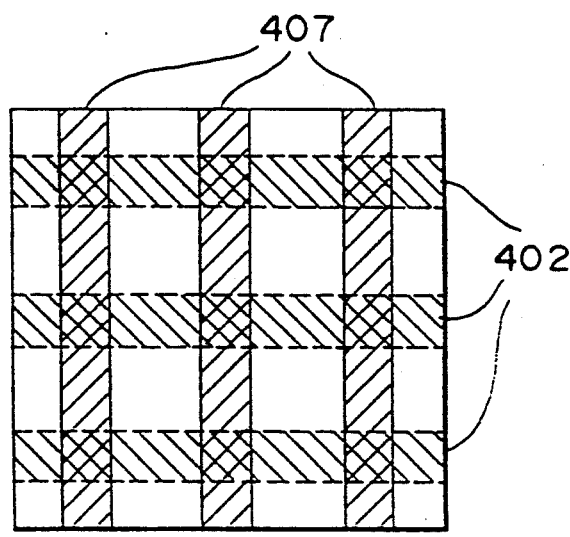
F I G. 43

SEMICONDUCTOR LIGHT EMITTING DEVICE

CROSS-REFERENCES TO THE RELATED APPLICATIONS

This is application is a continuation-in-part of application Ser. No. 530,120, filed on May 29, 1990, now U.S. Pat. No. 5,048,035.

BACKGROUND OF THE INVENTION

The present invention relates to a semiconductor light emitting device using a compound semiconductor material, particularly, to a semiconductor light emitting device using an InGaAlP series material for forming the active layer.

DESCRIPTION OF THE RELATED ART

A light emitting diode (LED) is widely used in various fields such as an optical communication and an optical information processing as a light source which permits a low power consumption, a high efficiency and a high reliability. Particularly, compound semiconductors such as GaP (green), GaAsP (yellow, orange, red) and GaAlAs (red) are widely used as the materials of the light emitting layers within a visible wavelength region.

However, the light emitting efficiency of each of GaP and GaAsP, which are indirect transition type semiconductors, is as low as about 0.5% even if a transparent substrate is used so as to eliminate the influence of absorption. On the other hand, GaAlAs permits an efficiency of about 8% at 660 nm. However, the efficiency is affected by the indirect transition in a shorter wavelength region. For example, the light emitting efficiency at a wavelength of 635 nm is about 1%.

In view of the visual sensitivity of the human eye, the light emitting efficiency of the GaAlAs series compound semiconductor corresponds to 3 cd (candela) at 660 nm and to 1 cd at 635 nm. On the other hand, the light emitting efficiency of GaP is 0.5 cd or less, and that of GaAsP is 0.3 cd or less. Naturally, it is of vital importance in this technical field to develop an LED which exhibits a high brightness in the wavelength regions of orange, yellow and green.

Among the III-V compound semiconductor mixed crystals excluding nitrides, the InGaAlP mixed crystal exhibits the largest energy gap of the direct transition type, and attracts attentions as a material of a light emitting element which emits light having wavelengths of 0.5 to 0.6 micron. Particularly, an LED comprising a GaAs substrate and an InGaAlP layer whose lattice is aligned with the GaAs substrate is expected to emit light of green to red wavelength regions with a high brightness. Even in the LED of this kind, however, the light emitting efficiency is not sufficiently high in the short wavelength region.

FIG. 1 shows the construction of the conventional LED having an InGaAsP light emitting portion. As seen from the drawing, the conventional LED comprises an n-GaAs substrate 1 having (100) plane as a main surface, an n-InGaAlP clad layer 2, an InGaAlP active layer 3, a p-InGaAlP clad layer 4, a p-GaAlAs current spreading layer 5, a p-GaAs contact layer 6, a AuZn electrode 7 on the p-side, and a AuGe electrode 8 on the n-side.

The composition of the mixed crystals is determined such that the energy gap of the InGaAlP active layer 3 is smaller than that of the clad layers 2 and 4, and the active layer 3 is of a double hetero structure which permits confining the light and carriers to the active layer 3. On the other hand, the composition of the p-GaAlAs current spreading layer 5 is determined such that the layer 5 becomes substantially transparent to the wavelength of the light emitted from the InGaAlP active layer 3.

In the element of the construction shown in FIG. 1, the active layer 3 was formed of an undoped layer of $In_{0.5}(Ga_{1-x}Al_x)_{0.5}P$, where x was 0.4. In this case, the layer 3 exhibited an n-type conductivity and had an impurity concentration of about 1 to $5 \times 10^{16}$ cm$^3$. The emitted light had a wavelength of 565 nm (green), and the light emitting efficiency was about 0.07% under a DC 20 mA. Where the value of "x" in the formula give above was set at 0.3, the emitted light had a wavelength of 585 nm (yellow), and the light emitting efficiency was as low as about 0.4% under a DC 20 mA. In short, the InCaAlP active layer 3 was not particularly advantageous over the GaP or GaAsP active layer. On the other hand, where the value of "x" was set at 0.2, the emitted light had a wavelength of 620 nm (orange), and the light emitting efficiency was about 1.5% under a DC of 20 mA. In this case, it was possible to obtain a light emitting efficiency higher than that for the GaAlAs system without removing the GaAs substrate 1 serving to provide an absorber with respect to the wavelength of the emitted light. The present inventors have conducted an extensive research in an attempt to clarify why the light emitting efficiency depends on the composition of the light emitting layer, finding that the mobility in the n-type conductivity is deeply related to the light emitting efficiency. To be more specific, the mobility was rapidly decreased when the value of "x", i.e., the aluminum content, was set at about 0.3. It was also observed that the donor level was deepened with decrease of the mobility. It was considered reasonable to understand that the generation of a deep level within the n-type conductivity region brings about recombination which does not achieve light emission, leading a low light emitting efficiency. Also, where the active layer 3 has a high aluminum content (large value of "x") and the emitted light has a short wavelength, it is impossible to provide a sufficient energy gap between the clad layers 2 and 4. As a result, electrons having small effective mass are considered to overflow prominently into the p-type clad layer 4, leading to reduction in the light emitting efficiency.

On the other hand, the current spreading layer 5 is included in the element shown in FIG. 1 so as to expand the flow of current injected from the electrode 7. Where the current spreading layer 5 is not included in the element, the expansion of the injected current is diminished as explained below, with the result that the light emitting region is restricted to a small region right under the electrode. Specifically, it is necessary for the aluminum content of each of the clad layers 2 and 4 to be sufficiently larger than that of the active layer 3 in order to provide a sufficient band gap between the active layer and the clad layer. If the p-clad layer 4 has a high aluminum content, it is impossible to increase the carrier concentration, leading to a high resistance. It follows that the expansion of the flow of current in the p-clad layer 4 is diminished, with the result that the light emitting region is restricted to a small region right under the electrode. In this case, the light emitted from the light emitting region is intercepted by the electrode 7, if the element is constructed such that the emitted light is taken out from the upper surface of the element, leading to reduction in the light output.

Also, if the aluminum content of the active layer is increased in a semiconductor light emitting element using an InGaAlP series material in order to obtain a light emission of a shorter wavelength, the number of non-light emitting centers within the active layer is increased, leading to an increase in the recombination which does not emit light and, thus, to reduction in the light emitting efficiency.

As described above, it was difficult to obtain, particularly, the yellow and green light emission with a high light emitting efficiency in the conventional InGaAlP series LED. Also, current concentration takes place in a small light emitting region right under the electrode, leading to reduction in the light take-out efficiency and increase in recombination which does not emit light within the active layer. Under the circumstances, it was difficult to provide an LED of a high brightness.

SUMMARY OF THE INVENTION

An object of the present invention is to provide a semiconductor light emitting device which permits light emission with a high efficiency even within a short wavelength region of yellow, green, etc.

Another object is to provide a semiconductor light emitting device which permits improving the current distribution in the light emitting portion so as to improve the light take-out efficiency and brightness.

The semiconductor light emitting device of the present invention comprises an InGaAlP active layer, and the emitted light is taken out from the surface opposite to the semiconductor substrate except for the electrode mounted to a part of said surface of the device. In the present invention, the carrier concentration and thickness of the active layer are made optimum so as to improve the light emitting efficiency.

According to the present invention, there is provided a semiconductor light emitting device, comprising a semiconductor substrate, a double hetero structure portion formed on the substrate and consisting of an InGaAsP active layer and clad layers having the active layer sandwiched therebetween, a first electrode formed on a part of the surface of the double hetero structure portion, and a second electrode formed on the surface of the substrate opposite to the double hetero structure portion, wherein the active layer is set to be of p-type having a carrier concentration of $1 \times 10^{17}$ cm$^{-3}$ or less or of n-type having a carrier concentration of $5 \times 10^{16}$ cm$^{-3}$ or less and has a thickness falling within a range of between 0.05 and 0.75 micron, and a current spreading layer is interposed between the double hetero structure portion and the first electrode.

The present invention also provide a semiconductor light emitting device constructed such that emitted light is taken out from a surface except an electrode region of a substrate on the opposite side of an active layer, said device comprising a semiconductor substrate of a first conductivity type, a reflective layer of the first conductivity type formed on the front surface of the substrate, a transparent buffer layer of the first conductivity type formed on the reflective layer, a double hetero structure portion formed on the transparent buffer layer and consisting of an InGaAlP active layer and clad layers of first and second conductivity types, respectively, having the active layer sandwiched therebetween, a current spreading layer of the second conductivity type formed on the double hetero structure portion, a first electrode formed on a part of the surface of the current spreading layer, a second electrode formed on the back surface of the substrate, and a current inhibiting layer of the first conductivity type formed in a part of the region between the double hetero structure portion and the first electrode in a manner to face the first electrode.

Further, the present invention provides a semiconductor light emitting device, comprising a semiconductor substrate, a double hetero structure portion formed on the front surface of the substrate and consisting of an InGaAlP active layer and clad layers having the active layer sandwiched therebetween, a first electrode formed on a part of the surface of the double hetero structure portion, and a second electrode formed on the back surface of the substrate, wherein the substrate is formed of, for example, an n-type GaAs and the plane direction on the major surface of the crystal growth of the substrate is inclined from the (100) plane in the direction of [011] by at least 5°, and a current spreading layer is interposed between the double hetero structure portion and the first electrode.

BRIEF DESCRIPTION OF THE DRAWINGS

FIG. 4 is a graph showing the relationship between the thickness of the active layer and the light emitting efficiency;

FIG. 6 is a cross sectional view showing the construction of a semiconductor light emitting device according to a second embodiment of the present invention;

FIG. 8 is a graph showing the relationship among the inclination angle of the substrate, the Al content and the half value width;

FIGS. 21A and 21B are cross sectional views showing where a current spreading layer is formed;

FIG. 24 is a cross sectional view showing the construction of an element using a transparent substrate in accordance with a modification of the present invention;

FIG. 25 is a cross sectional view showing the construction of a semiconductor light emitting device according to a third embodiment of the present invention;

FIG. 26 schematically shows the current distribution and the light emitting region within the device according to the third embodiment of the present invention;

FIG. 30 is a cross sectional view showing the construction of a semiconductor light emitting device according to a fourth embodiment of the present invention;

FIG. 31 is a cross sectional view showing the construction of a semiconductor light emitting device according to a fifth embodiment of the present invention;

FIGS. 38 and 39 are sectional views showing an LED having a current blocking layer according to still another modification of the present invention;

FIG. 40 is a perspective view showing an LED having an intermediate band gap region according still another modification of the present invention;

FIG. 41 is a sectional view showing the LED shown in FIG. 40; and

FIGS. 42 and 43 are perspective and plan views, respectively, showing a relationship between an intermediate band gap region and an electrode at an n-type side in a modification of the LED shown in FIG. 40.

DETAILED DESCRIPTION OF THE PREFERRED EMBODIMENTS

In the present invention, the active layer consisting of InGaAlP is of p-type having a carrier concentration of $1 \times 10^{17}$ cm$^{-3}$ or n-type having a carrier concentration of $5 \times 10^{16}$ cm$^{-3}$. The particular construction of the active layer makes it possible to suppress the influence of the recombination which does not emit light described previously. Also, the thickness of the active layer is defined to fall within a range of between 0.15 and 0.75 micron in the present invention so as to obtain a light emission with a high efficiency. Further, the inclination in the plane direction of the substrate, the carrier concentration and thickness of each of the layers included in the light emitting device of the present invention are made optimum in the present invention so as to improve the light emitting efficiency.

Figure 1:
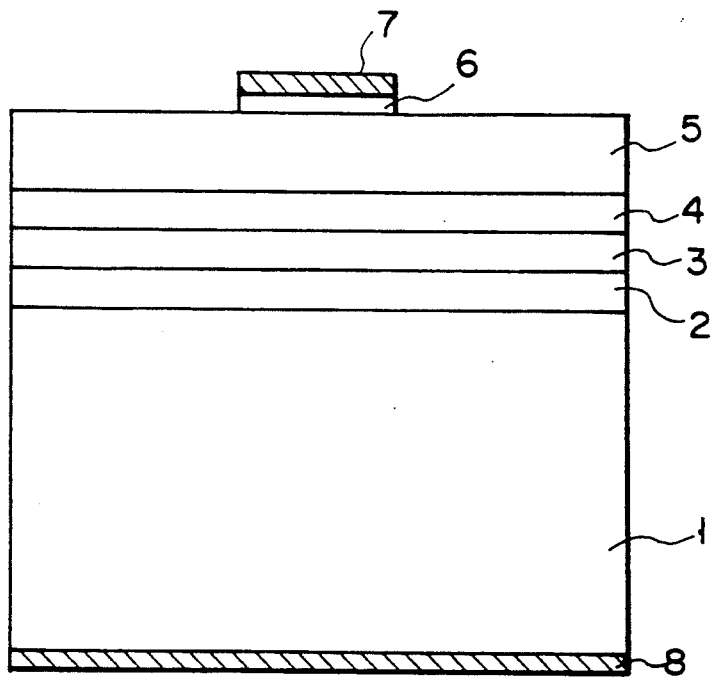
FIG. 1 is a cross sectional view showing the construction of a conventional semiconductor light emitting device.
Figure 2:
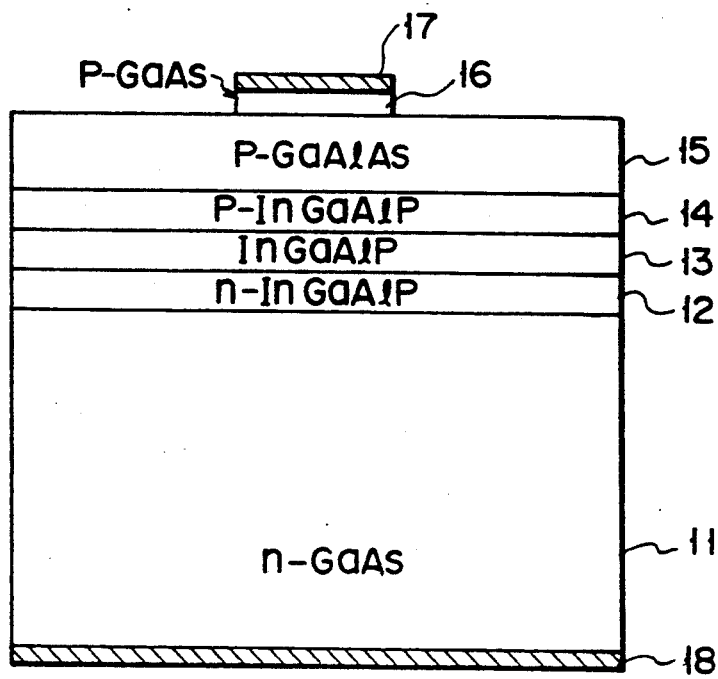
FIG. 2 is a cross sectional view showing the construction of a semiconductor light emitting device according to a first embodiment of the present invention.

Let us describe in detail some embodiments of the present invention with reference to the accompanying drawings. First of all, FIG. 2 is a cross sectional view showing the construction of a semiconductor lignt emitting device according to a first embodiment of the present invention. As seen from the drawing, the light emitting device comprises an n-GaAs substrate 11, and a double hetero structure portion formed on the front surface of the substrate 11, i.e., the structure consisting of an n-InGaAlP clad layer 12, a p-InGaAlP active layer 13, and a p-InGaAlP clad layer 14. A p-GaAlAs current spreading layer 15 is formed on the upper surface of the double hetero structure portion. Further, a GaAs contact layer 16 is formed on a part of the surface of the current spreading layer 15. Still further, a p-side electrode 17 consisting of AuZn is formed on the contact layer 16, with an n-side electrode 18 being formed on the back surface of the substrate 11, said electrode 18 consisting of AuGe.

The composition of the mixed crystals is determined to permit the energy gap of the p-InGaAlP active layer 13 to be greater than that of each of the clad layers 12 and 14, and these layers 13, 14 and 15 collectively form a double hetero structure such that the light and carriers are confined to the active layer 13. The composition of the p-GaAlAs current spreading layer 15 is determined such that the layer 15 is substantially transparent to the wavelength of the light emitted from the active layer 13. In the embodiment shown in FIG. 2, the substrate side is of n-conductivity type. However, the same technical idea can be applied even if the conductivity type is reversed.

In the embodiment of FIG. 2, the thickness and carrier concentration of each layer of the device are defined to be as follows:

| | Thickness | Carrier Concentration |
|---|---|---|
| n-GaAs substrate 11 | 250 μm | $3 \times 10^{18}$ cm$^{-3}$ |
| n-InGaAlp clad layer 12 | 1 μm | $5 \times 10^{17}$ cm$^{-3}$ |

-continued

| | Thickness | Carrier Concentration |
|---|---|---|
| p-InGaAlp active layer 13 | 0.5 μm | $5 \times 10^{16}$ cm$^{-3}$ |
| p-InGaAlp clad layer 14 | 1 μm | $7 \times 10^{17}$ cm$^{-3}$ |
| p-GaAlAs current spreading layer 15 | 7 μm | $3 \times 10^{18}$ cm$^{-3}$ |
| p-GaAs contact layer 16 | 0.1 μm | $3 \times 10^{18}$ cm$^{-3}$ |

The p-side electrode 17 is circular and has a diameter of 200 microns. The composition of each of the active layer 13 and the clad layers 12, 14 is defined to be $In_{0.5}(Ga_{1-x}Al_x)_{0.5}P$. Where the value of "x" was 0.4 or 0.7, the emitted light had a wavelength of 565 nm (green), and the light emitting efficiency under DC 20 mA was about 0.7%, which was 10 times as high as in the prior art.

Figure 3:
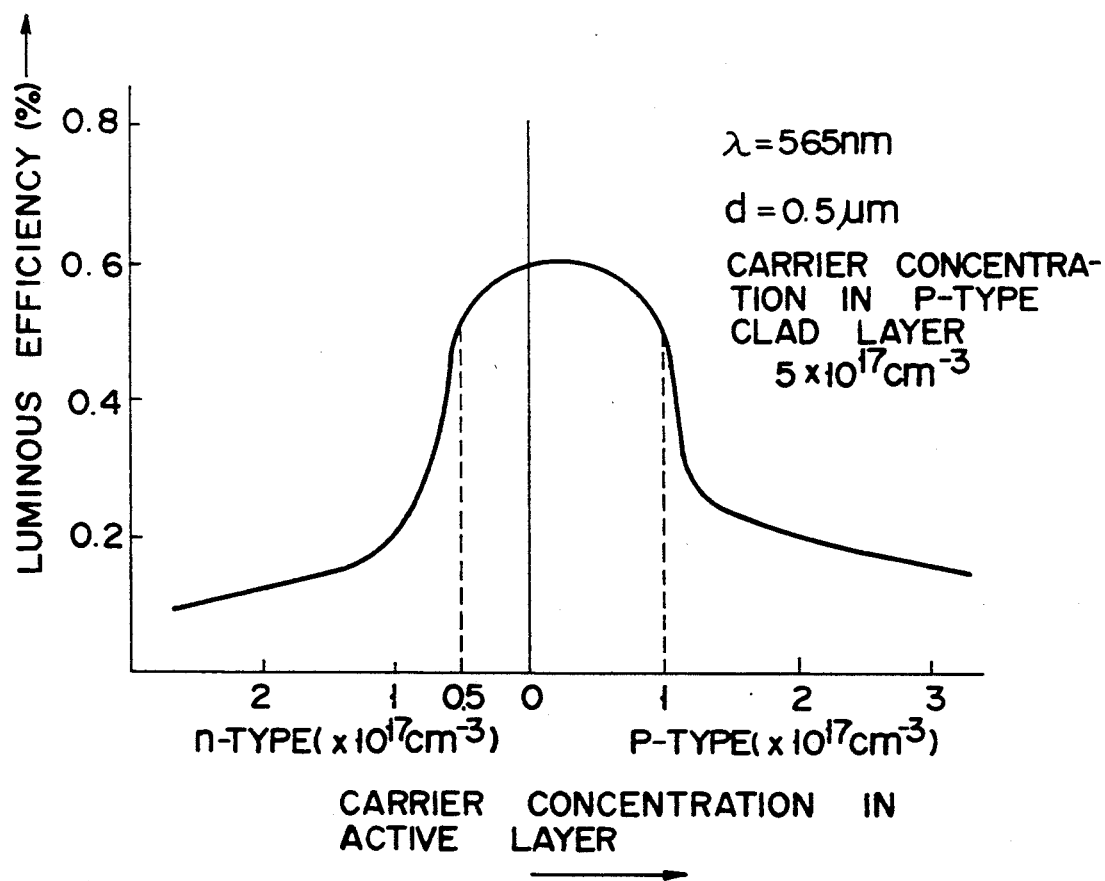
FIG. 3 is a graph showing the relationship between the carrier concentration and the light emitting efficiency.

FIG. 3 shows the dependence of the light emitting efficiency on the carrier concentration of the active layer, covering the case where the thickness of the active layer 13 is 0.5 micron. The p-type region shown in FIG. 3 was prepared by Zn doping. The n-type region having a carrier concentration of $5 \times 10^{16}$ cm$^{-3}$ or less denotes an undoped region. Further, the n-type region having a carried concentration higher than that of the undoped region was prepared by Si doping. As seen from the graph. The light emitting efficiency was lowered with increase in the carrier concentration in the n-type region. It is considered reasonable to understand that the generation of deep levels causes an increased recombination which does not emit light, and the diffusion length of the minority carrier holes is shortened so as to bring about reduction in the light emitting efficiency in the n-type region.

On the other hand, the light emitting efficiency was markedly lowered in the p-type region in the case where the carrier concentration was increased to exceed $1 \times 10^{17}$ cm$^{-3}$. The low light emitting efficiency is considered to have been caused by the phenomenon that the doping with a large amount of Zn forms centers which bring about recombination not emitting light. Similar experiments were conducted by changing the thickness of the active layer 13. However, the change of the thickness simply caused shifting of the curve of FIG. 3 in the upward or downward direction. In other words, the range of the carrier concentration within which a high efficiency of light emission can be obtained remains unchanged. It follows that it is desirable for the active layer 13 to be of p-type having a carrier concentration of $1 \times 10^{17}$ cm$^{-3}$ or less, or of n-type having a carrier concentration of $5 \times 10^{16}$ cm$^{-3}$ or less.

FIG. 4 shows the dependence of the light emitting efficiency on the thickness of the active layer, covering the case where the carrier concentration (p-type) of the active layer 13 is set at $5 \times 10^{16}$ cm$^{-3}$. As seen from the graph of FIG. 4, the light emitting efficiency is high where the thickness of the active layer 13 fall within a range of between 0.15 and 0.75 micron, though the light emitting efficiency is also dependent on the carrier concentration of the p-clad layer 14.

Incidentally, where the active layer was of n-type having a carrier concentration of $5 \times 10^{16}$ cm$^{-3}$, the light emitting efficiency was lower than the case where the active layer of the same thickness was of Zn-doped p-type, though the particular case is not shown in FIG. 4. In addition, the peak value of the light emitting efficiency was present on the thinner side of the active layer where the active layer was of n-type as noted above. It should be noted that the the density of the carriers injected into the active layer is determined by the injected current density and by the thickness of the active layer. It follows that the reduction of the light emitting efficiency in a thin active layer is considered to be caused by the fact that the carriers injected at a high density into the active layer prominently overflow into the clad layer. Where the active layer 13 is of p-type, holes constitute the majority carriers, and the light emission is caused by the electron injection. Thus, it is considered difficult to make comparison with the case of undoping with respect to the influence given by the overflow. On the other hand, if the thickness of the active layer is greater than the diffusion length of the injected carriers within the active layer, the double hetero structure fails to produce its effect sufficiently. As a result, reduction in the light emitting efficiency is considered to be brought about by the absorption within the active layer and by the relative increase in the recombination which does not emit light.

As described above, the carrier concentration and thickness of the active layer 13 consisting of InGaAlP are made optimum in the embodiment shown in FIG. 2 so as to suppress the effect given by the recombination which does not emit light and, thus, to improve the light emitting efficiency. It follows that it is possible to provide a semiconductor light emitting device which permits light emission with a high efficiency even in a short wavelength region such as yellow and green regions.

Figure 5:
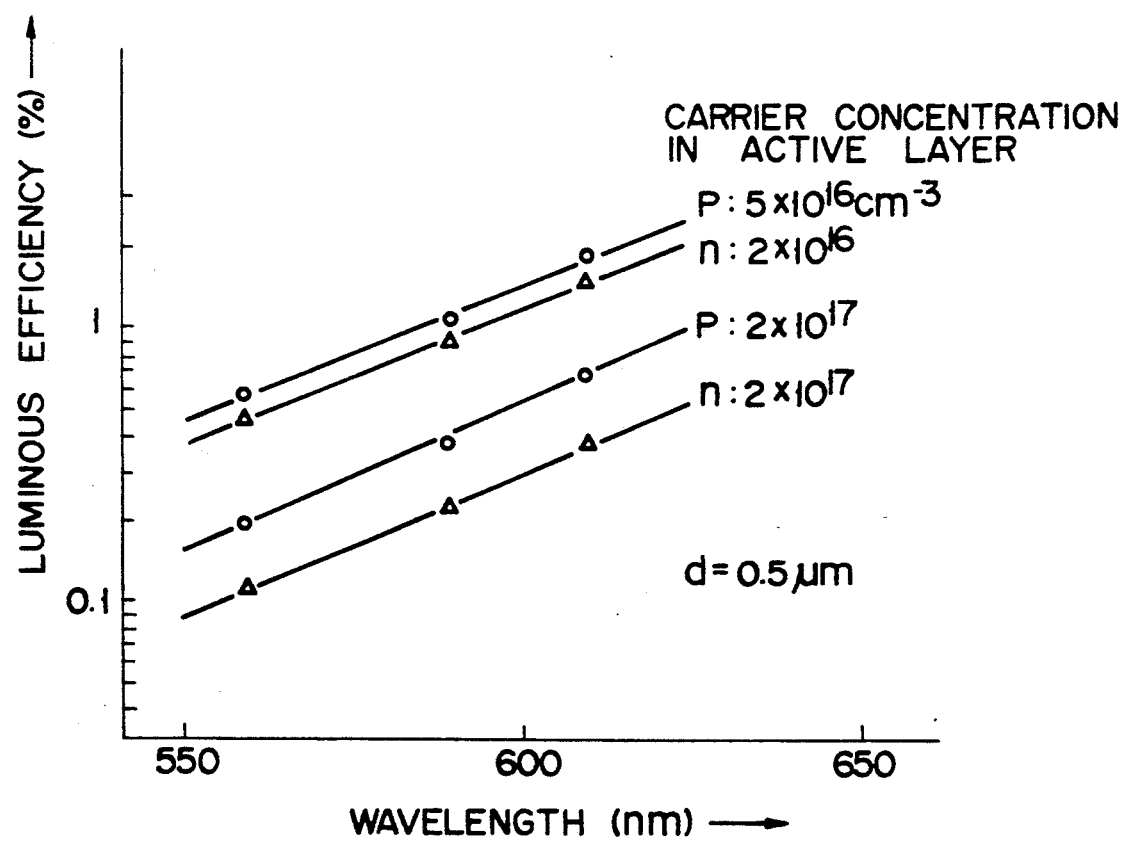
FIG. 5 is a graph showing the relationship between the wavelength and the light emitting efficiency.

In the embodiment described above, the aluminum content of the active layer 13, i.e., the value of "x" in the composition of the active layer 13, was set at 0.4. Similar effects were also obtained where the aluminum content was changed. It should be noted that a change of the aluminum content "x" brings about a change in the wavelength of the emitted light regardless of the carrier concentration. As shown in FIG. 5, the light emitting efficiency is lowered with shortening of the wavelength of the emitted light, which is caused by the increase in the aluminum content "x". Even in this case, it is possible to obtain an improved light emitting efficiency, if the active layer is of p-type having a carrier concentration of $1 \times 10^{17}$ cm$^{-3}$ or less or of n-type having a carrier concentration of $5 \times 10^{16}$ cm$^{-3}$.

FIG. 6 is a cross sectional view schematically showing the construction of a semiconductor light emitting device according to a second embodiment of the present invention. As seen from the drawing, the device of this embodiment comprises a semiconductor substrate 31 of a first conductivity type, a buffer layer 32 of the first conductivity type grown on the front surface of the substrate 31, a reflective layer 33 formed on the buffer layer 32, and a transparent buffer layer 34 formed on the reflective layer 33. In this embodiment, a double hetero structure portion consisting of a lower clad layer 35 of the first conductivity type, an active layer 36, and an upper clad layer 37 of a second conductivity type is formed on the transparent buffer layer 34.

Further, a current spreading layer 38 of the second conductivity type is grown on the double hetero structure portion, and a contact layer 39 of the second conductivity type is formed on a part of the upper surface of the current spreading layer 38. It should be noted that a current inhibiting layer 40 of the first conductivity type is formed in that region of the interface between the double hetero structure portion and the current spreading layer 38 which faces the contact layer 39.

Still further, an upper electrode 41 is formed on the contact layer 39, with a lower electrode 42 being formed on the back surface of the substrate 31.

Let us describe in the following the various conditions, such as the carrier concentration and thickness of the substrate and of each of the layers formed on the substrate, of the semiconductor light emitting device of the construction described above. It should be noted that the conditions described below also apply to the device according to the first embodiment of the present invention described previously.

The substrate 31 consists of an n-GaAs having a carrier concentration of $2 \times 10^{18}$ cm$^{-3}$ to $4 \times 10^{18}$ cm$^{-3}$. If the carrier concentration is lower than $2 \times 10^{18}$ cm$^{-3}$, is impossible to obtain a substrate having a low defect density. On the other hand, if the carrier concentration of the substrate 31 is higher than $4 \times 10^{18}$ cm$^{-3}$, it is difficult to form satisfactorily the InGaAlP layers on the substrate 31. Further, the substrate 31 should have a thickness falling within a range of between 50 and 450 microns. If the substrate 31 is thinner than 50 microns, it is difficult to handle the wafer. Also, warping is generated by a slight difference in the lattice constant between the substrate and a layer formed thereon, with the result that it is difficult to manufacture a pellet-like device if the substrate is thicker than specified in the present invention.

Figure 7:
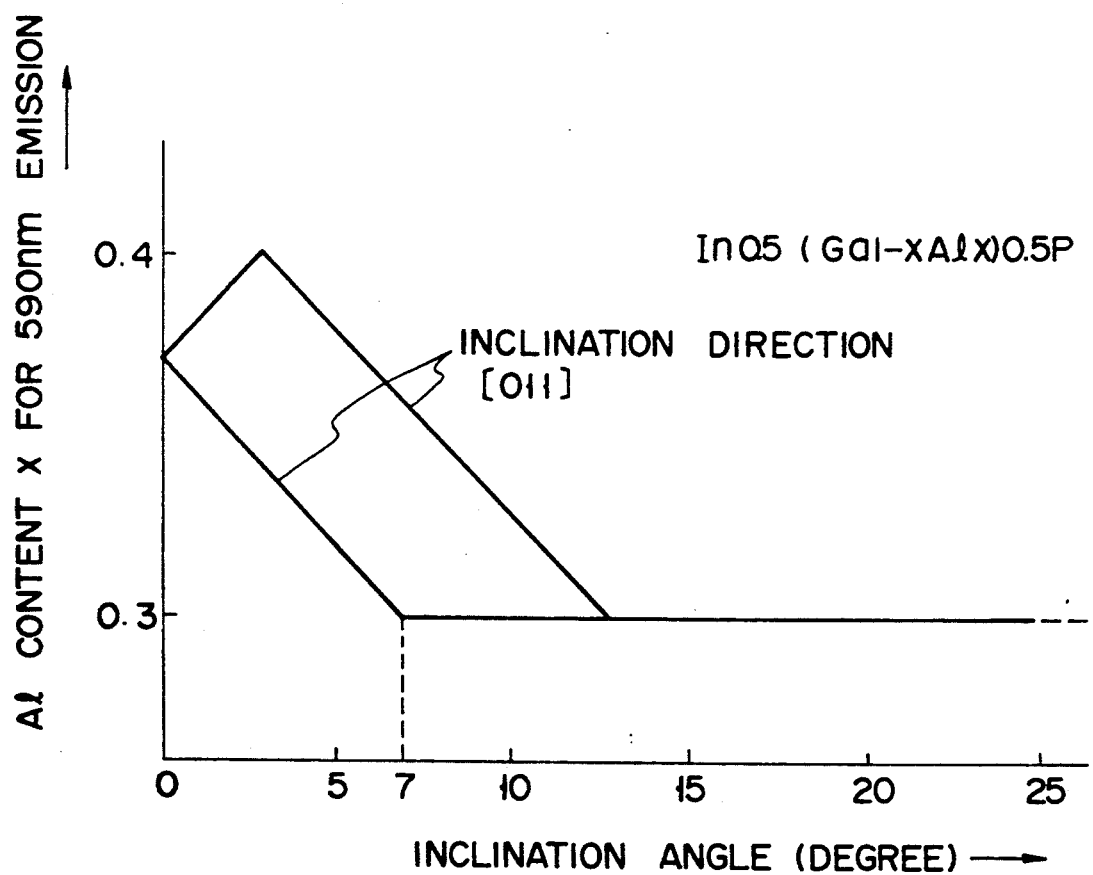
FIG. 7 is a graph showing the relationship among the inclination angle of the substrate, the Al content and the half value width.

On the other hand, the plane direction of the n-GaAs substrate 31 should be (100) plane or should be inclined from the (100) plane by 25° or less. It should be noted in this connection that the composition of the active layer 36 for emitting a light of the same wavelength differs depending on the direction and angle of inclination. The defect density on the active layer also differs depending on the direction and angle of inclination. It follows that the crystallinity of the active layer is changed by the direction and angle of inclination so as to affect the light emitting efficiency. FIG. 7 shows the relationship between the angle of inclination of the substrate surface and the aluminum content "x" for obtaining a light emission of 590 nm. As apparent from the graph of FIG. 7, the aluminum content "x" can be set at as small as 0.3 if the angle of inclination in the direction of [111] is 7° or more.

FIG. 8 shows the relationship between the half value width of phot luminescence. It is seen that the smallest half value width can be obtained where the angle of inclination falls within a range of between 10° and 20°. It follows that the plane direction of the substrate 31 should desirably be inclined from (100) plane by 7° to 25° in the direction of [011], particularly desirably, by 10° to 20°.

The buffer layer 32, which consists of, for example, n-GaAs, serves to prevent defect generation caused by, for example, contamination on the substrate surface and to prevent the defect from being expanded to reach the light emitting layer. The buffer layer 32 should have a carrier concentration of $4 \times 10^{17}$ cm$^{-3}$ and a thickness of 0.6 micron. The material of the buffer layer 32 need not be restricted n-GaAs, as far as the objects noted above are satisfied. For example, the buffer layer 32 may be formed of n-InGaP, n-GaAlAs or n-InGaAlP. It is also possible to employ a super lattice structure of these materials including n-GaAs having a total thickness of about 100 nm with a period from the atomic layer order to 100 atomic layer order. Further, it is possible to eliminate the buffer layer 32 as far as the light emitting layer is not adversely affected.

The reflective layer 33 is intended to reflect the emitted light in a direction opposite to the direction leading to the substrate 31 so as to prevent the emitted light from reaching the substrate 31 acting as an absorber of the emitted light wavelength and the buffer layer 32. In order to achieve the object, it is desirable for the reflective layer 33 to consist of a laminate structure of two kinds of semiconductor layers differing from each other in the refractive index u with respect to the wavelength r of the emitted light, said semiconductor layers being laminated in a thickness of r/(4n).

Where, for example, the emitted light has a wavelength of 590 nm, it is possible to alternately laminate at least 20 layers of n-GaAs (u=3.94; thickness=37.5 nm) and n-Ga$_{0.3}$Al$_{0.7}$As (u=3.425; thickness=43 nm) so as to form the reflective layer 33. In this case, the reflective layer permits reflecting about 30% of the light running toward the substrate before the light reaches the absorber such as the substrate so as to achieve a high efficiency of light emission. The amount of the dopant is determined such that a large voltage drop in the step of conducting current may not cause elevation of the operating voltage. For example, the dopant (carrier) concentration should be set at $4 \times 10^{17}$ cm$^{-3}$. It should be noted that the n-GaAs forming the reflective layer 33 acts as an absorber with respect to the wavelength of the emitted light. However, the particular effect produced by the refractive index defined above permits sufficiently producing the effect of reflection.

Further, the reflective layer may be formed of, for example, n-InGaAlP, n-InGaP, n-InGaAlAs, n-GaAs or a combination thereof. Of course, the reflective layer formed of these materials permits achieving a high efficiency of light emission. Incidentally, the reflective layer 33 need not be used in the case where the light absorption on the side of the substrate does not lead to a significant demerit in terms of the light emitting efficiency.

Figure 9:
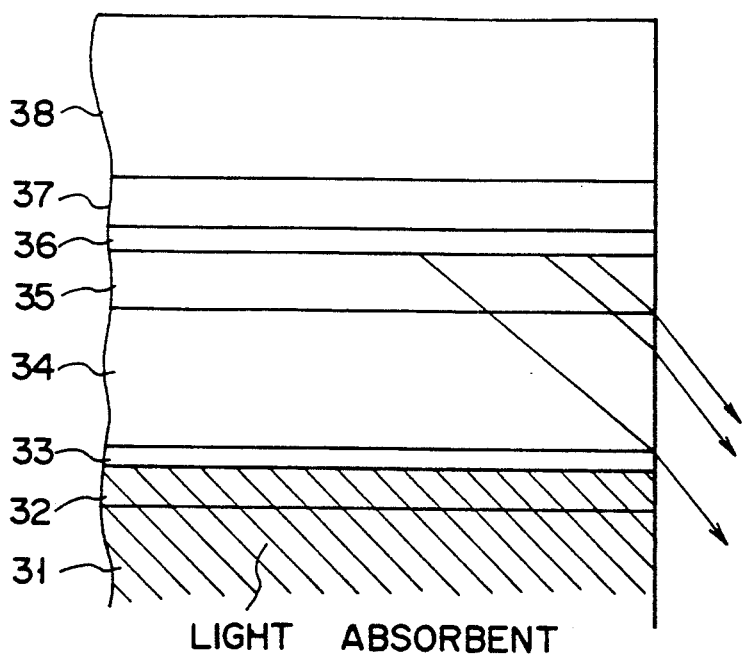
FIG. 9 is a cross sectional view for explaining the function of a transparent buffer layer.

The transparent buffer layer 34 is formed of a transparent material having a sufficiently small absorption coefficient with respect to the wavelength of the emitted light, and serves to effectively take out the light emitted from the side surface. In this connection, attentions should be paid to FIG. 9. Where the transparent buffer layer 34 is sufficiently thick, the emitted light beam running directly toward the substrate and the light beam reflected by total reflection from the pellet surface to run again toward the substrate are released effectively to the outside from the side surface of the pellet before the light beams reach the light absorbers such as the substrate. From example, where the pellet is sized 300 microns square and the emitted light has a wavelength of 590 nm, the transparent buffer layer 34 formed of n-Ga$_{0.3}$Al$_{0.7}$As and having a thickness of 30 microns permits improving the light emitting efficiency by about 30% because the amount of light taken out from the side surface is increased. The prominent effect is considered to support that the light emission in the vicinity of the side surface of the pellet is effectively taken out over a range of distance substantially equal to the thickness of the transparent buffer layer 34.

Figure 10:
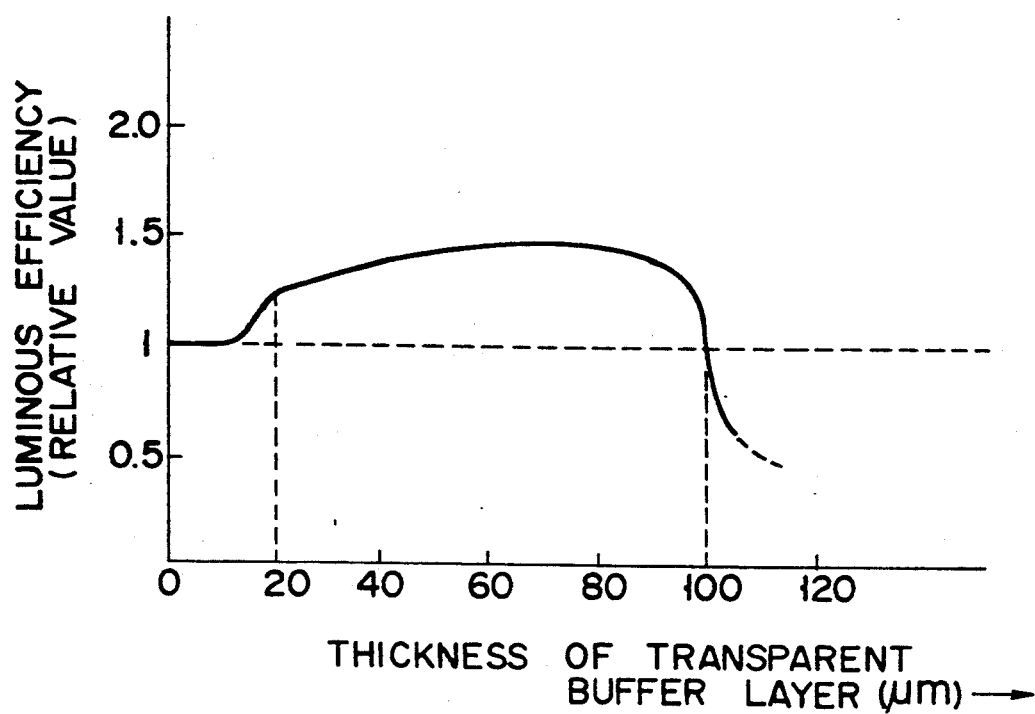
FIG. 10 is a graph showing the relationship between the thickness of the transparent buffer layer and the light emitting efficiency.

The amount of the dopant in the transparent buffer layer 34 is determined such that the elevation in the operating voltage is not caused by a large voltage drop in the step of conducting current through the pellet. In this embodiment, the carrier (dopant) concentration is set at $4 \times 10^{17}$ cm$^{-3}$. For determining the thickness of the transparent buffer layer 34, it is necessary for the region in the vicinity of the side surface of the pellet from which the emitted light can be effectively taken out to be significantly large relative to the pellet size. In practice, the thickness of the transparent buffer layer 34 should be at least about 5% of the pellet size. Where the chip is sized at, for example, 300 microns square, a sufficient improvement in the light emitting efficiency can be achieved if the thickness of the transparent buffer layer 34 is at least 15 microns, as seen from FIG. 10. As apparent from FIG. 10, the light emitting efficiency is improved with increase in the thickness of the transparent buffer layer 34. If the thickness exceeds 100 microns, however, the wafer is warped so as to generate defects and planar distribution, leading to a low light emitting efficiency.

Figure 11:
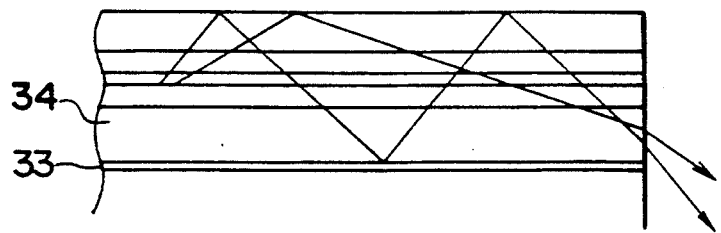
FIG. 11 is a cross sectional view for explaining the function of a transparent buffer layer.

As shown in FIG. 11, combination of the transparent buffer layer 34 and the reflective layer 33 permits the emitted light to be subjected to total reflection repeatedly at the reflective layer 33 and the pellet surface, with the result that the emitted light beam runs zig-zag. Needless to say, the light beam released to the side surface can be taken out effectively in this case. The particular effect can also be obtained in the case where the transparent buffer layer 34 is of laminate structure consisting of a plurality of layers differing from each other in the refractive index. In this case, it is important for the lower layer, which is positioned closer to the substrate, of the laminate structure to have a lower refractive index.

In this embodiment, the transparent buffer layer 34 is formed of n-GaAlAs. In addition, the transparent buffer layer 34 may be formed of a material transparent to the wavelength of the emitted light such as n-InGaAlP or n-InAlP, with substantially the same effect. Also, it is possible for the reflective layer 33 to be positioned within the transparent buffer layer 34. Incidentally, it is possible to eliminate the transparent buffer layer 34, if the light absorption on the side of the substrate does not lead to a significant demerit in terms of the light emitting efficiency.

The lower clad layer 35 serves to confine the carriers injected into the active layer 36 to the active layer 36 so as to improve the light emitting efficiency. Specifically, the lower clad layer 35 serves to prevent the carriers injected into the active layer 36 from being diffused into the lower clad layer 35 in each of the cases where the active layer 36 is of n-conductivity type, and the carrier concentration is lower than the injected carrier density (the minority carriers are holes), where the active layer 36 is of p-conductivity type, and the carrier concentration is lower than the injected carrier density (the minority carriers are electrons), and where the injected carrier density is higher than the carrier concentration of the active layer 36 (state of so-called double injection). In this case, it is necessary for the lower clad layer 35 to have an energy gap greater than that of the active layer 36.

In this embodiment, the lower clad layer 35 is formed of n-In$_{1-y}$(Ga$_{1-x}$Al$_x$)$_y$P, where x=0.7 and y=0.5. The lower clad layer 35 of this construction has an energy gap large enough to confine the injected carriers to the active layer 36 even if the light emitted from the active layer 36 has such a short wavelength as 555 nm. Also, the lattice constant of the lower clad layer 35 in this case coincides with that of the GaAs substrate 31, making it possible to obtain a good crystal condition. It was found possible to obtain these prominent effects in the case where the value of "x" in the formula given above falls within a range of between 0.6 and 1. Where the value of "x" alls within the range noted above, the n-InGaAlP forming the lower clad layer 35 has an energy gap of substantially indirect transition type. The energy gap is increased with increase in the value of "x" within this region, with the result that the carrier confining effect is prominently high if the value of the "x" is large within the range noted above.

When it comes to the InGaAlP series material, the atomic arrangement tends to form an ordered structure, resulting in a difference in the energy gap among the materials of the same composition. Among the materials of the same composition, the greatest energy gap is given by the material which does not form an ordered structure, i.e., the material in which the atoms are arranged at random. It follows that the material which does not form an ordered structure permits effectively confining the carriers. The disordered structure can be easily formed by using the inclined direction described previously in the substrate 31.

Figure 12:
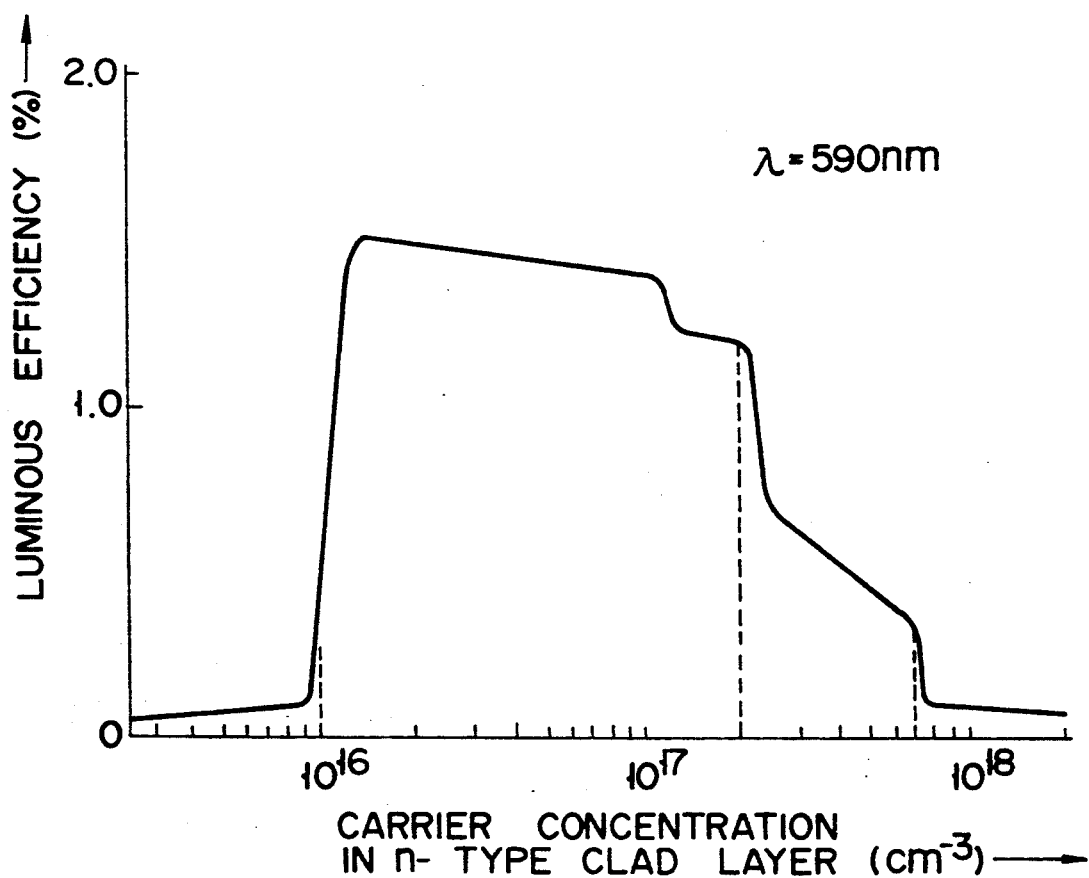
FIG. 12 is a graph showing the relationship between the carrier concentration in the n-clad layer and the light emitting efficiency.

On the other hand, the lower clad layer 35 has a carrier concentration of $1 \times 10^{17}$ cm$^{-3}$. FIG. 12 shows the relationship between the carrier concentration in the lower clad layer 35 (n-clad layer) and the light emitting efficiency. As seen from the graph of FIG. 12, the carrier concentration desirable in terms of the light emitting efficiency falls within a range of between $1 \times 10^{16}$ cm$^{-3}$ and $7 \times 10^{17}$ cm$^{-3}$. It should be noted in this connection that the emitted light cannot be taken out from a region right under the electrode 41. In order to expand the current flow outside the particular region right under the electrode 41, the resistivity of the lower clad layer 35 should desirably be high and, thus, the carrier concentration should desirably be low as noted above in view of the relationship with the resistivity of the upper clad layer 37, the current diffusion layer 36, etc. What should also be noted is that the dopant in the InGaAlP material such as Si or Se forms deep levels in accordance with the dopant concentration. In this case, the carriers injected into the active layer 36 form recombinations which do not emit light via these deep levels present in the n-InGaAlP lower clad layer 35 in the vicinity of the active layer.

The lower limit of the desirable carrier concentration range is determined by the lowest concentration required for preventing the elevation in the operating voltage which is caused by a large voltage drop in the step of conducting an electric current. On the other hand, the upper limit is determined in view of the increase in the recombination which does not emit light. It is particularly desirable to set the carrier concentration to fall within a range of between $1 \times 10^{16}$ cm$^{-3}$ and $2 \times 10^{17}$ cm$^{-3}$. The upper limit of this range is determined in view of the fact that, if the resistivity of the lower clad layer 35 is unduly low, the effect of expanding the current flow is diminished.

Where the lower clad layer 35 is directly bonded to the buffer layer 32 or the reflective layer 33, formed is a hetero junction with n-InGaAlP or n-GaAs. Where electrons are injected into the device having such a hetero junction on the side of the GaAs layer having a small energy gap, an excessive voltage drop is required for jumping over the barrier wall formed by the hetero junction. As a result, the current flows uniformly along the interface over the entire pellet, resulting in reduction in the current density. Since the current flows in a manner to prevent voltage drop, it is possible to obtain a large expansion in the flow of current. The expansion of the current flow was found to be greatly dependent on the carrier concentration of the n-InGaAlP layer. To be more specific, the expansion was most prominent in the case where the carrier concentration was $1 \times 10^{17}$ cm$^{-3}$ or less.

In this embodiment, the thickness of the lower clad layer 35 is set at 1 micron. In order to prevent the carriers injected into the active layer 36 from being diffused into the lower clad layer 35, the thickness of the lower clad layer 35 should be at least 0.5 micron. On the other hand, the thickness of the lower clad layer should not exceed 2 microns in order to achieve expansion of the current flow. Such being the situation, the thickness is set at 1 micron as noted above. The lower clad layer 35 may be equal to the transparent buffer layer 34 in the material. Specifically, it is possible for the lower clad layer to be formed of an n-GaAlAs. Incidentally, it is possible to eliminate the lower clad layer 35 when it comes to a single hetero structure or a homogeneous junction structure in which the light emitting efficiency is not adversely affected even if the carriers injected into the active layer are not prevented from being diffused toward the substrate.

The active layer 36 is formed of $In_{1-y}(Ga_{1-x}Al_x)_yP$. The energy gap of the active layer 36 is determined by the values "x" of the formula noted above and the state of ordered structure of the material. When the injected carriers are recombined, the active layer emits light of a wavelength corresponding to the energy gap. As shown in FIG. 5, the wavelength of the emitted light is shortened with increase in the aluminum content "x", leading to reduction in the light emitting efficiency. It should be noted that a difference between the direct transition type energy gap and the indirect transition type energy gap is diminished with increase in the aluminum content "x". Particularly, where deep levels are prominently generated in the n type, it is considered difficult to obtain good crystals, leading to reduction in the light emitting efficiency noted above.

Several methods are proposed for overcoming the difficultly noted above. It is proposed to employ a disordered structure of the active layer 36 in order to obtain light emission of the same wavelength with the aluminum content "x" which is set as low as possible. The disordered structure can be easily formed by using the inclined direction referred to previously in the substrate 31. It has also been found possible to achieve the light emission of a short wavelength by employing the multiple quantum well (MQW) structure. In this case, the energy level is made quantum so as to make it possible to achieve the light emission of a short wavelength even in a well layer in which a layer having a small aluminum content acts as a light emitting layer.

Figure 13:
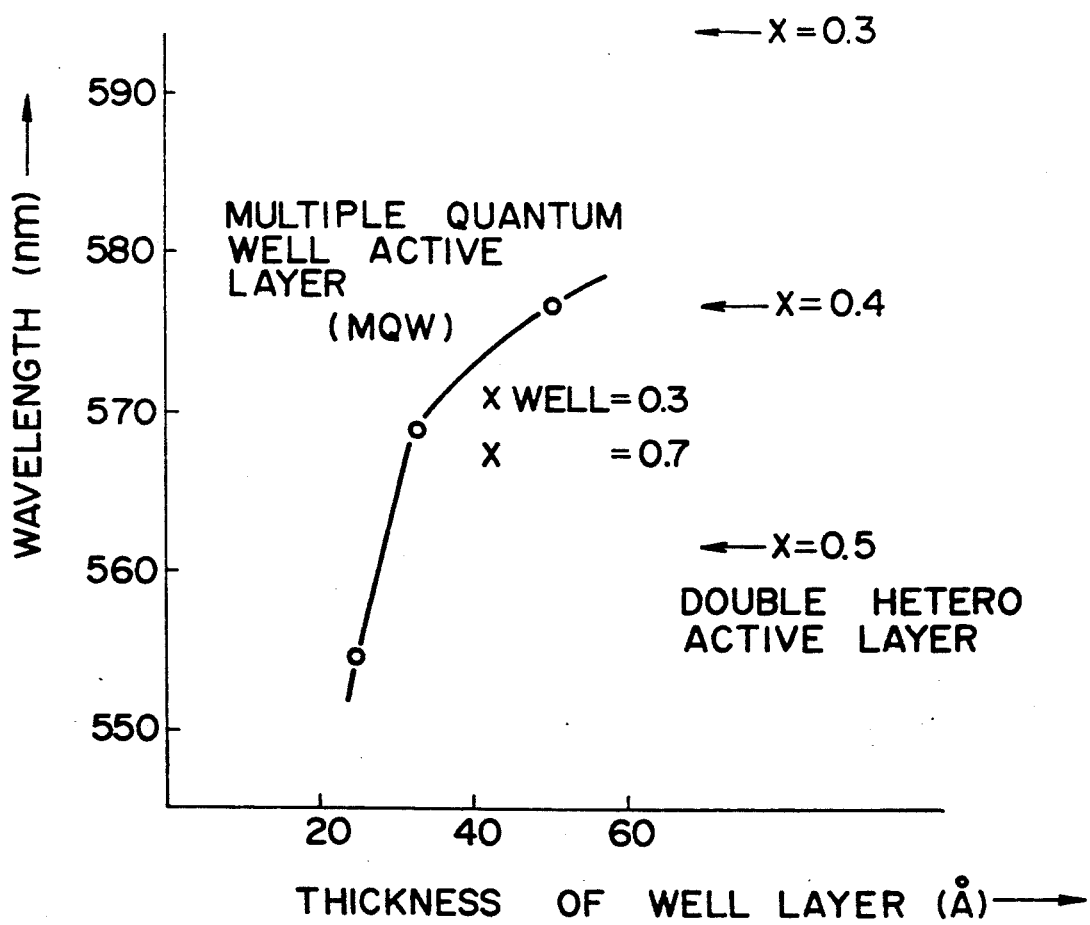
FIG. 13 is a graph showing the relationship between the thickness of a well layer and the wavelength.

For example, an active layer was formed by providing 10 to about 100 periods of a well layer, in which the values "x" and "y" in the formula noted previously were 0.3 and 0.5, respectively, and a barrier layer, in which the values "x" and "y" were 0.7 and 0.5, respectively. In this case, it was possible to obtain the light emission of a wavelength (575 to 555 nm) substantially equal to the use of an active layer formed of a bulk having the values "x" and "y" of (0.4, 0.5) to (0.5, 0.5), as shown in FIG. 13.

It is possible to decrease the aluminum content by disregarding the lattice alignment with GaAs, i.e., by making the lattice constant of the InGaAlP active layer smaller than that of GaAs. By the contrary, it is possible to enlarge the difference between the direct transition type energy gap and the indirect transition type energy gap by making the lattice constant of the InGaAlP active layer larger than that of GaAs. In any case, the produced effect is prominent where the degree of the lattice non-alignment is about 0.5%, and the upper limit is determined in view of the increase in the recombination which does not emit light, which is caused by the generation of transition. The generation of transition depends on the thickness. Where the thickness was about 0.3 micron, limit was found at about 1%.

Figure 14:
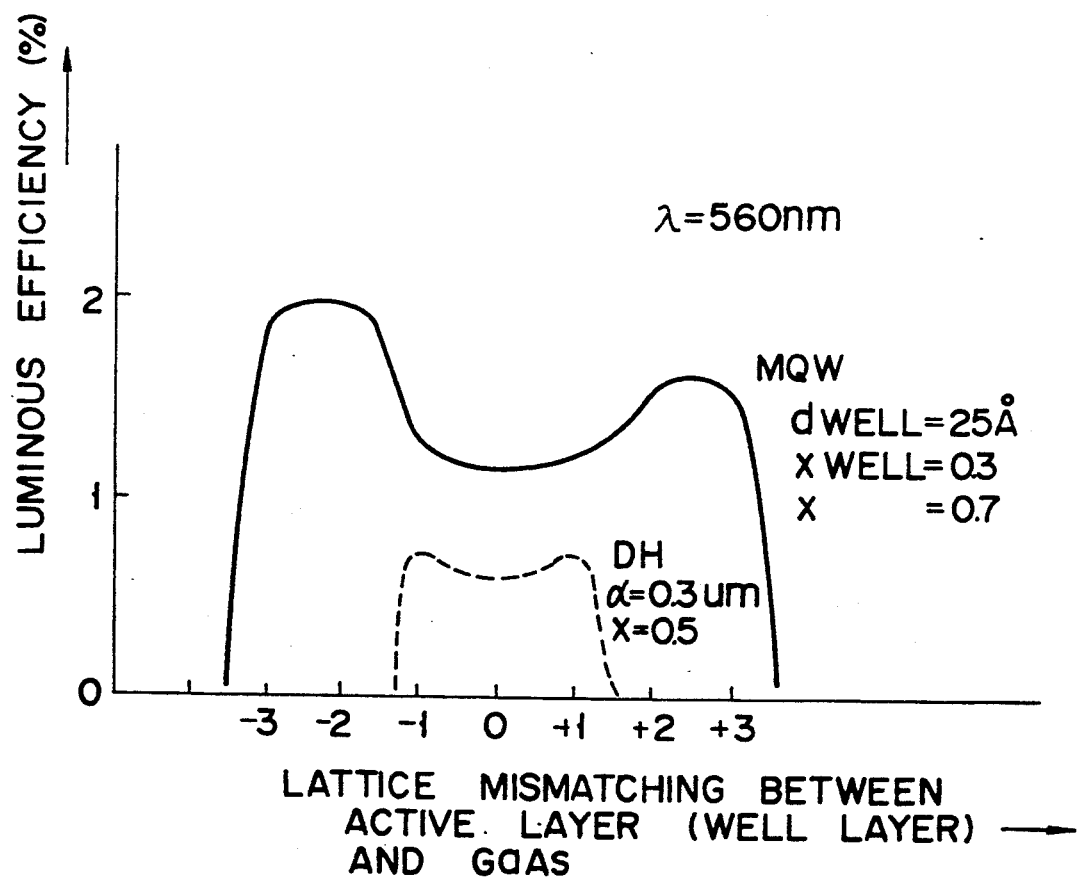
FIG. 14 is a graph showing the relationship between the lattice non-alignment of the well layer and the light emitting efficiency.

In order to avoid the difficulty noted above, it was found effective to use a layer having a deviant lattice constant as a well layer of the active layer employing the MQW structure noted previously. Since the well layer was very thin, the degree of lattice non-alignment giving a limit to the transition generation was more than about 3%, as shown in FIG. 14, making it possible to use a very wide range of composition. Incidentally, it was possible to obtain the light emission with a high efficiency in the case where the active layer 36 was of n-type having a carrier concentration of $5 \times 10^{16}$ cm$^{-3}$ or less or of p-type having a carrier concentration of $1 \times 10^{17}$ cm$^{-3}$ or less, as in the first embodiment (see FIG. 3). Also, the light emission with a high efficiency was obtained in the case where the active layer 36 had thickness falling within a range of between 0.15 and 0.75 micron in the case of using a pellet size of 30n microns square, as in the first embodiment (see FIG. 4).

Like the lower clad layer 35, the upper clad layer 37 also serves to confine the injected carriers, i.e., the carriers injected into the active layer 36, to the active layer 36 so as to achieve a high light emitting efficiency. To be more specific, the upper clad layer 37 permits suppressing the diffusion of the carriers injected into the active layer 36 into the upper clad layer 37 in the case where the holes and electrons constitute the majority carrier and the minority carrier, respectively, or in the case of a double injection. In this case, it is necessary for the upper clad layer 37 to have an energy gap greater than that of the active layer 36.

Figure 15:
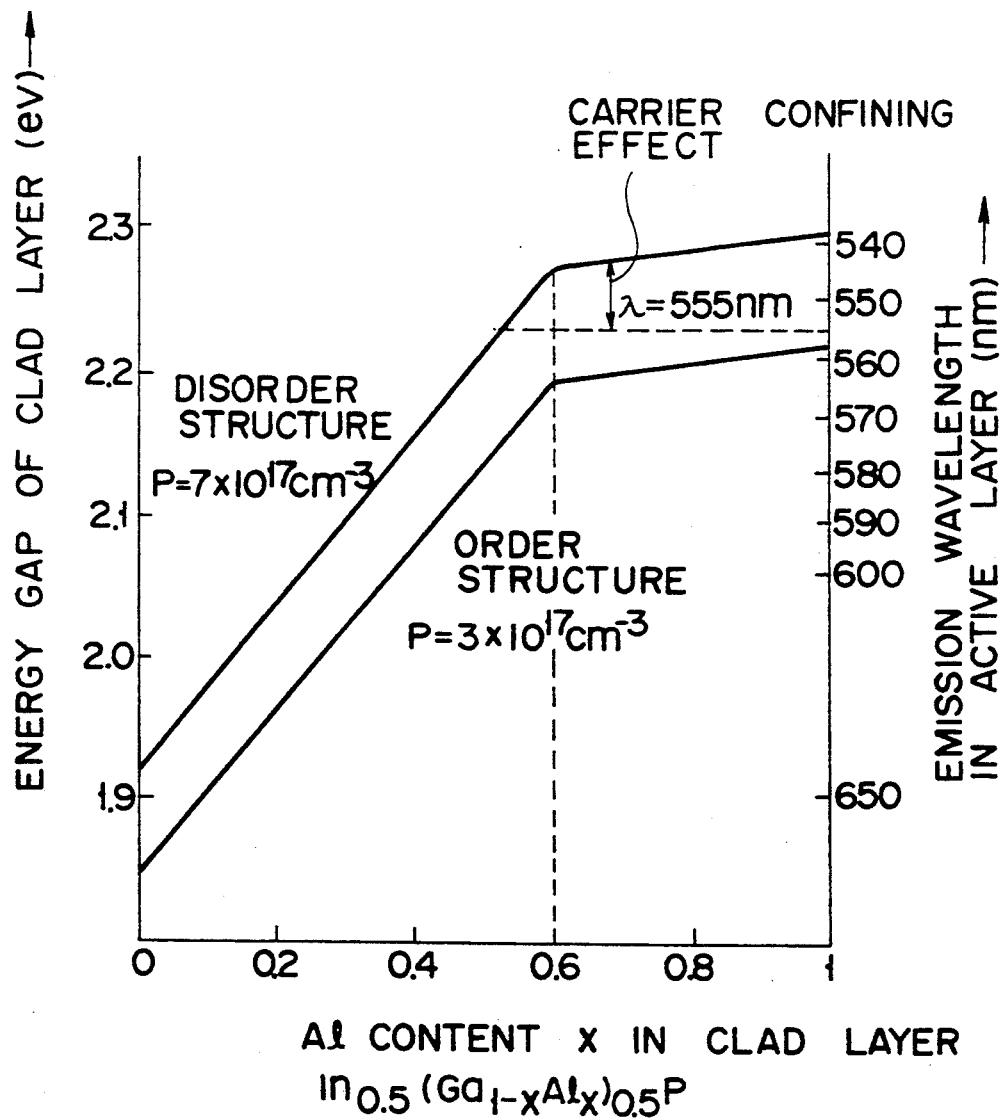
FIG. 15 is a graph showing the relationship between the Al content of the clad layer and the energy gap.

In this embodiment, the upper clad layer 37 is formed of p $In_{1-y}(Ga_{1-x}Al_x)_yP$, where x=0.7, y=0.5. The upper clad layer 37 of this construction was found to exhibit an energy gap which permitted sufficiently confining the injected carriers even if the wavelength of the light emitted from the active layer 36 was shortened to 555 nm. Also, the upper clad layer of this construction was found to be equal to the GaAs substrate in the lattice constant, making it possible to obtain a good crystal. To enable the p-clad layer 37 to exhibit the effects described above, the aluminum content "x" in the formula given above should fall within a range of between 0.6 and 1, as shown in FIG. 15. It should be noted that, where the aluminum content "x" falls within the range noted above, the p-InGaAlP clad layer substantially exhibits an indirect transition type energy gap. Within the particular region, the energy gap is increased with increase in the aluminum content "x", with the result that the carrier confining effect is increased with increase in the aluminum content "x".

When it comes to the InGaAlP series material, the atomic arrangement tends to form an ordered structure, resulting in a difference in the energy gap among the materials of the same composition. Among the materials of the same composition, the greatest energy gap is given by the material which does not form an ordered structure, i.e., the material in which the atoms are arranged at random. It follows that the material which does not form an ordered structure permits effectively confining the carriers. The disordered structure can be easily formed by using the inclined direction described previously in the substrate 31 and by applying a sufficiently high concentration of doping.

Figure 16:
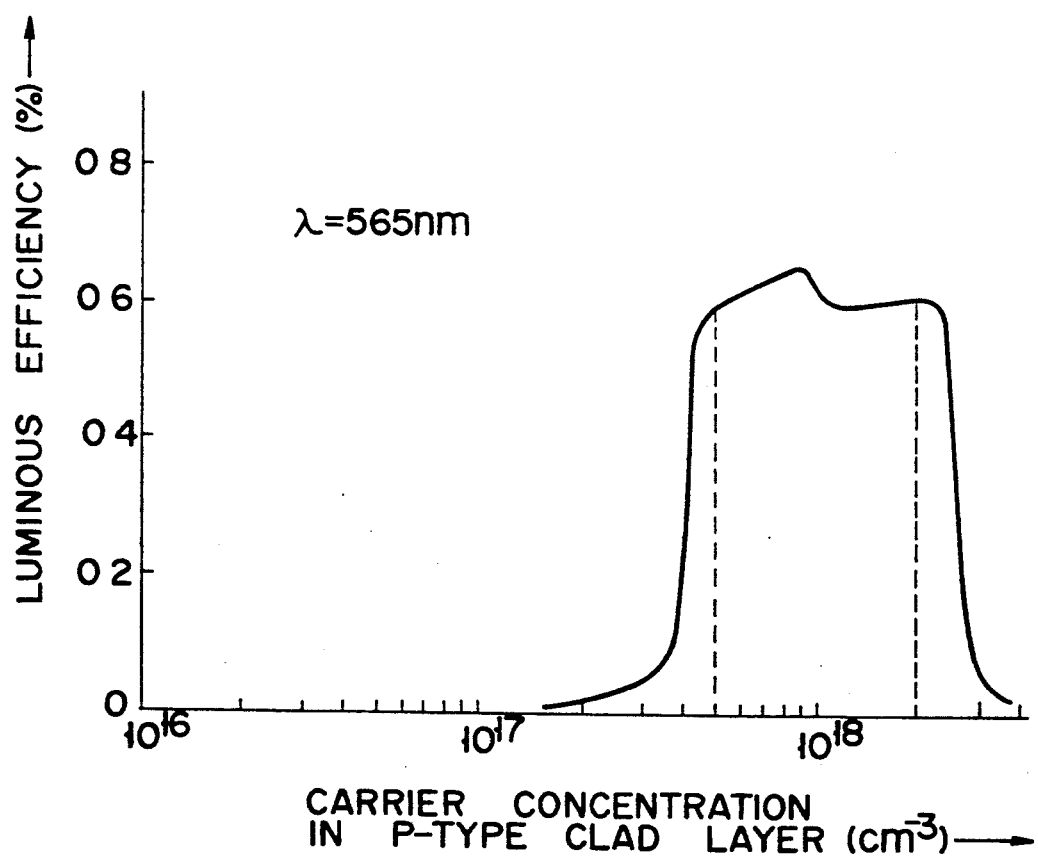
FIG. 16 is a graph showing the relationship between the carrier concentration of the clad layer and the light emitting efficiency.

On the other hand, the carrier concentration of the upper clad layer 37 is set at $7 \times 10^{17}$ cm$^{-3}$. FIG. 16 shows the relationship between the carrier concentration of the p-clad layer 37 and the light emitting efficiency. As seen from the graph of FIG. 16, the carrier concentration which is desirable in terms of the light emitting efficiency falls within a range of between $5 \times 10^{17}$ cm$^{-3}$ and $2 \times 10^{18}$ cm$^{-3}$. It should be noted in this connection that the emitted light cannot be taken out from a region right under the electrode 41. In order to expand the current flow outside the particular region right under the electrode 41, the resistivity of the upper clad layer 37 should desirably be low and, thus, the carrier concentration should desirably be high as noted above in view of the relationship with the resistivity of the lower clad layer 35, the current diffusion layer 38, etc. What should also be noted is that a disordered structure can be formed easily by setting the carrier concentration at a high level, making it possible to increase the energy gap and, thus, to confine the injected carriers effectively.

In this embodiment, the thickness of the upper clad layer 37 is set at 1 micron. In order to prevent the carriers injected into the active layer 36 from being diffused into the upper clad layer 37 the thickness of the upper clad layer 37 should be at least 0.5 micron. On the other hand, the thickness of the upper clad layer 37 should not exceed 2 microns in order to achieve expansion of the current flow. Such being the situation, the thickness is set at 1 micron as noted above. The upper clad layer 37 may be equal to the current spreading layer 38 in the material. To be more specific, it is desirable for the upper clad layer to be formed of a p-GaAlAs. Incidentally, it is possible to eliminate the upper clad layer when it comes to a single hetero structure or a homogeneous junction structure in which the light emitting efficiency is not adversely affected even if the carriers injected into the active layer are not prevented from being diffused in a direction away from the substrate.

The current spreading layer 38 serves to expand the flow of current which is limited by the presence of the electrode 41 to a region right under the electrode 41. The current spreading layer 38 is formed of a transparent material having a sufficiently small absorption coefficient wit respect to the wavelength of the emitted light. For example, the current spreading layer 38 formed of p-Ga$_{0.3}$Al$_{0.7}$As and having a carrier concentration of $3 \times 10^{18}$ cm$^{-3}$, which is formed in a thickness of 15 microns, permits expanding the flow of current over the entire region of the chip so as to improve the light emitting efficiency by about 30 times as much as that in the case where said current spreading layer is not used, in the case where the pellet is sized at 300 microns square, the electrode is circular and has a diameter of about 150 microns, and the emitted light has a wavelength of 590 nm.

Figure 17:
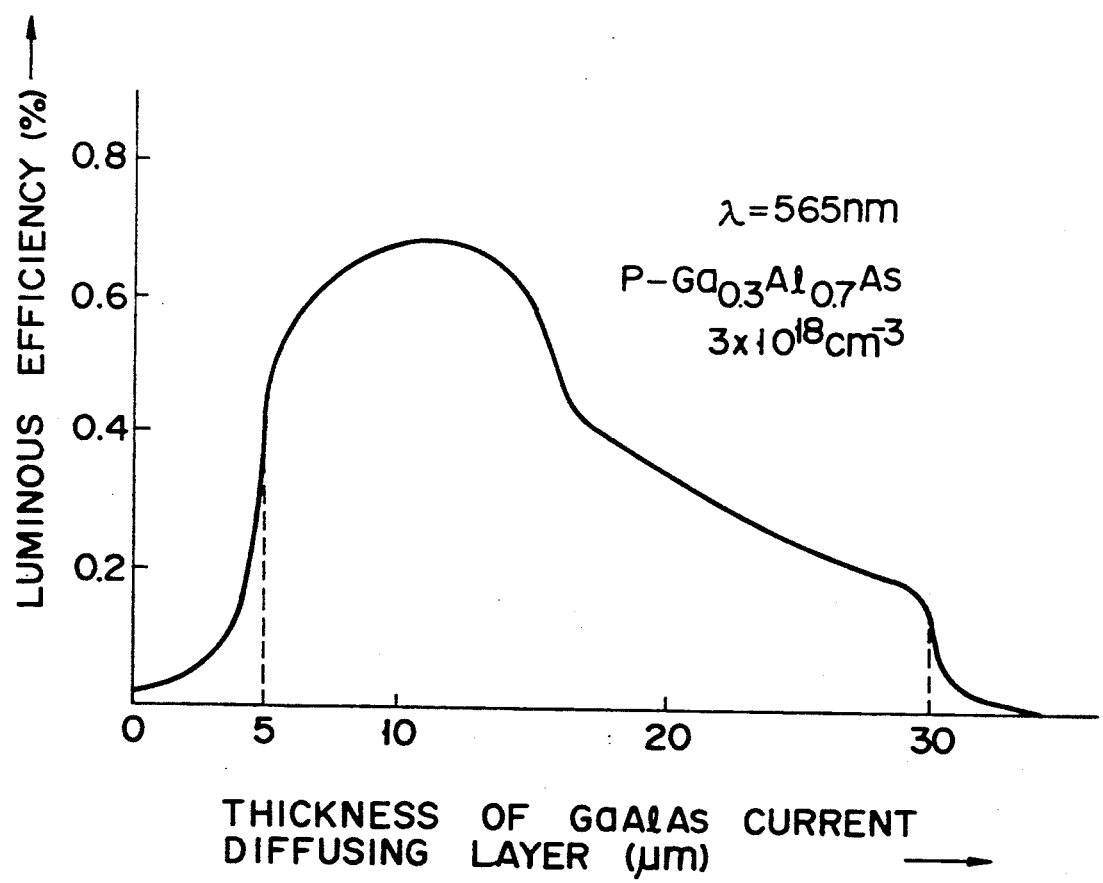
FIG. 17 is a graph showing the relationship between the thickness of a current spreading layer and the light emitting efficiency.

It is desirable to determine the thickness of the current spreading layer 38 such that the current flow can be expanded as much as possible. As shown in FIG. 17, the flow of current was effectively expanded in the case where the thickness of the current spreading layer was set at 5 microns. If the thickness exceeds 30 microns, however, saturation is reached with respect to the effect of expanding the flow of current. In addition, impurities are diffused from the upper clad layer 37 into the active layer 36 because of the growth over a long period of time, leading to reduction in the light emitting efficiency. As a result, the light emitting efficiency of the entire element is lowered.

Figure 18:
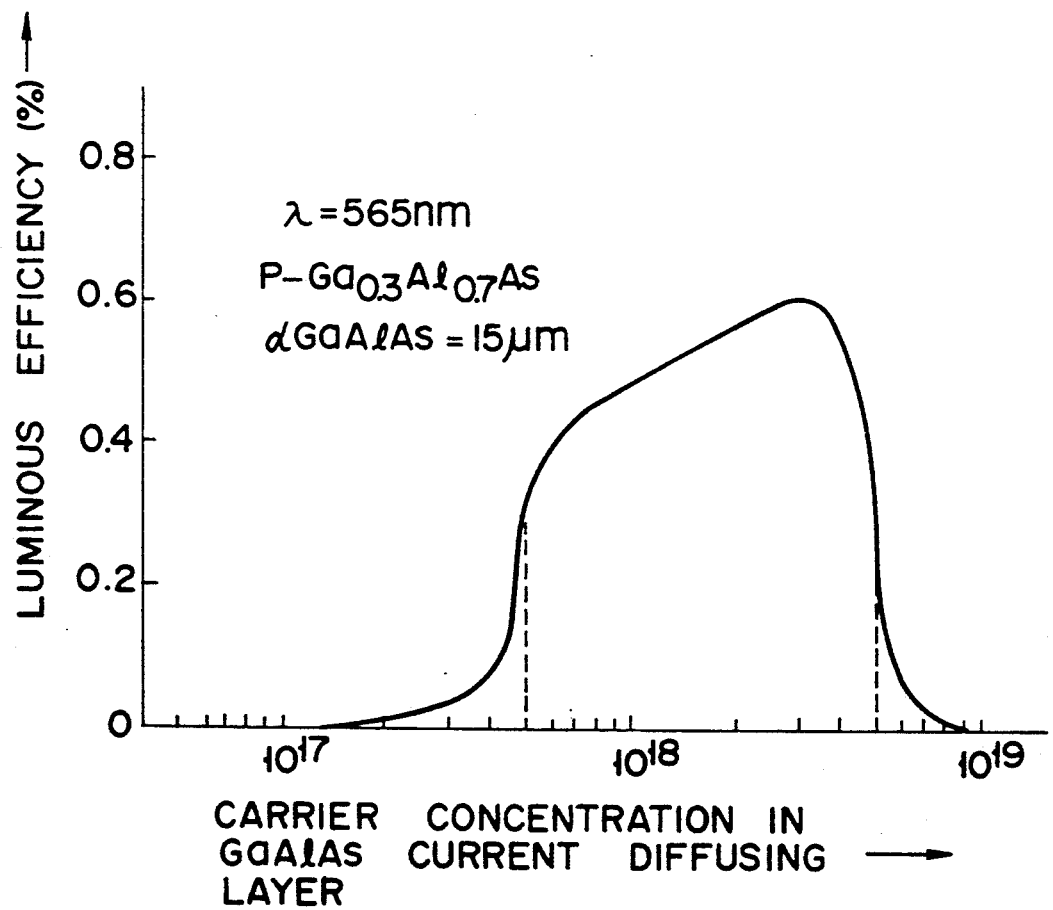
FIG. 18 is a graph showing the relationship between the thickness of a current spreading layer and the light emitting efficiency.

In order to obtain a sufficient expansion in the flow of current, the carrier concentration of the current spreading laver 38 should desirably be at least $5 \times 10^{17}$ cm$^{-3}$, as shown in FIG. 18. On the other hand, the doping in a carrier concentration of $5 \times 10^{18}$ cm$^{-3}$ or more certainly permits expanding the flow of current, but results in an increased absorption of the wavelength of the emitted light. It follows that the light emitting efficiency as a whole is lowered.

Figure 19:
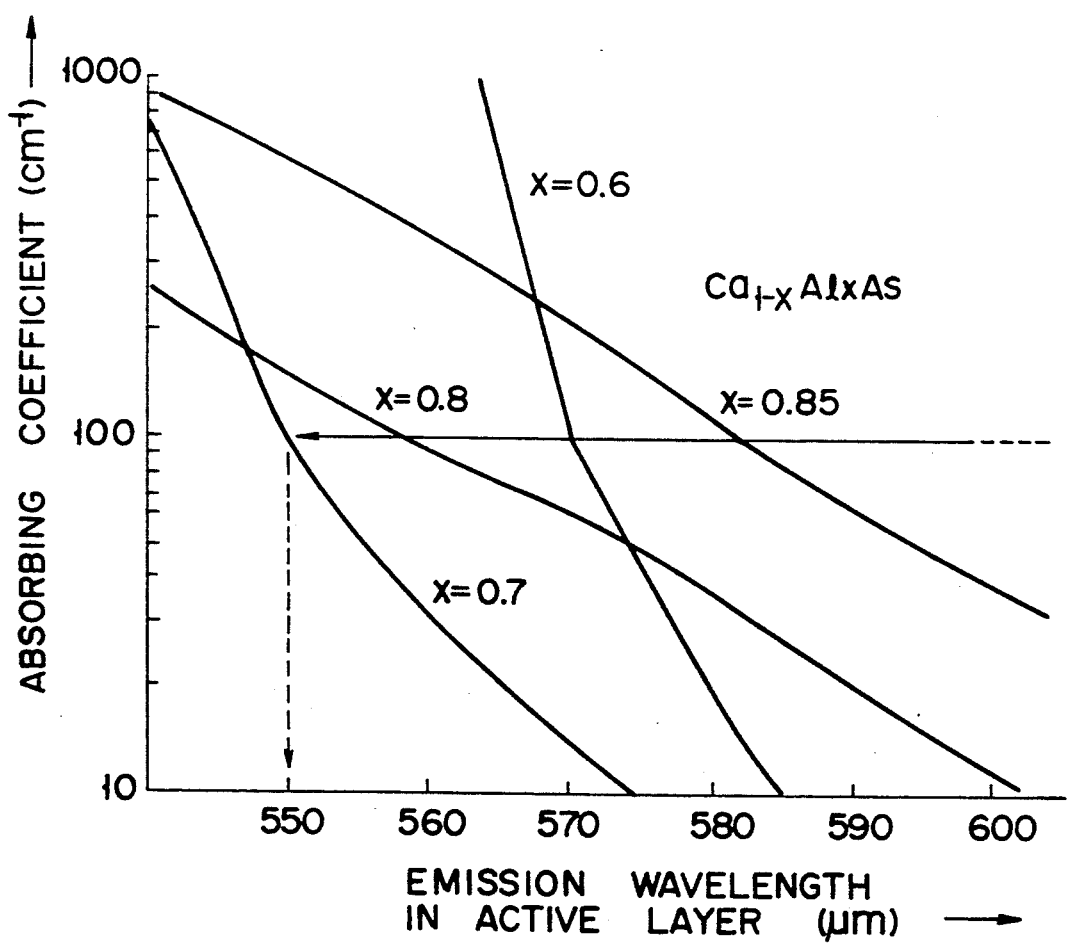
FIG. 19 is a graph showing the relationship between the wavelength of the emitted light and the absorption coefficient of the current spreading layer.

The aluminum content "x" of the current spreading laver 38 should desirably be as low as possible, provided that the absorption coefficient with respect to the wavelength of the emitted light is about 100 cm$^{-1}$ or less. It should be noted that absorption coefficient for a certain wavelength is diminished with increase in the value of "x" in the composition of p-Ga$_{1-x}$Al$_x$As, as shown in FIG. 19. With respect to the wavelength region of the light emitted from InGaAlP, the value of "x" should desirably be at least 0.6. On the other hand, it is difficult to obtain GaAlAs of good crystallinity in the case where the value of "x" is unduly large, leading to an increased absorption coefficient. Such being the situation, the aluminum content "x" should desirably be 0.8 or less.

A hetero junction is formed between the p-GaAls current spreading layer 38 and the p-InGaAlP upper clad layer 37. Where holes are injected through the p-GaAlAs layer having a smaller energy gap, required was an excessive voltage drop capable of jumping over the barrier wall provided by the hetero junction. As a result, the current was allowed to flow along the interface uniformly over the entire pellet region so as to decrease the current density and, thus, to prevent the voltage drop, leading to a prominent expansion in the flow of current. The expansion in the flow of current was found to be greatly dependent on the carrier concentration in the p-InGaAlP layer. To be more specific, a prominent effect was obtained in the case where the carrier concentration was $1 \times 10^{18}$ cm$^{-3}$ or less.

In this embodiment, the current spreading layer 38 is formed of p-GaAlAs. Needless to say, however, it is also possible to use a material transparent to the wavelength of the emitted light such as p-InGaAlP or p-InAlP for forming the current spreading layer 38, with substantially the same effect. Incidentally, it is possible to eliminate the current spreading layer 38 if the elimination does not bring about a significant demerit in terms of the light emitting efficiency.

Figure 20A:
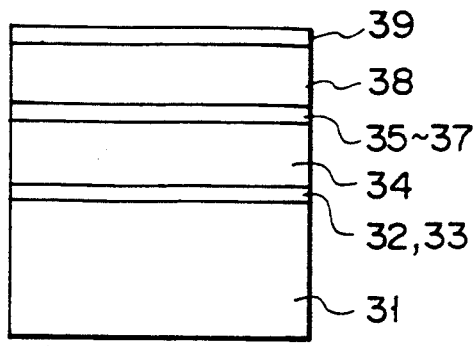
FIGS. 20A to 20D are cross sectional views showing the process of forming an upper electrode.
Figure 20B:
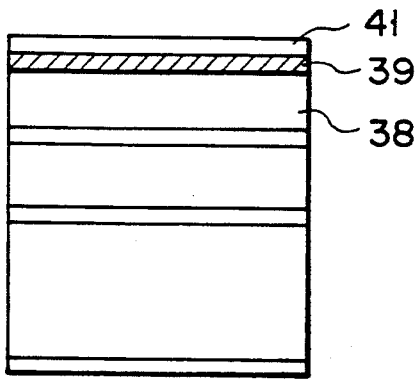
Figure 20C:
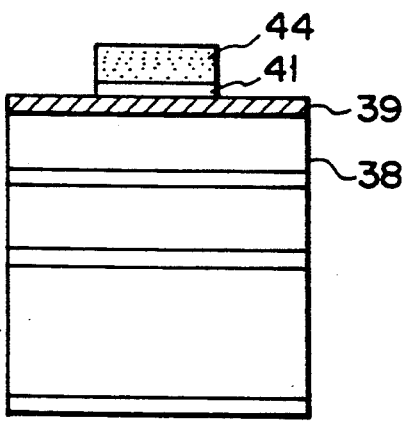
Figure 20D:
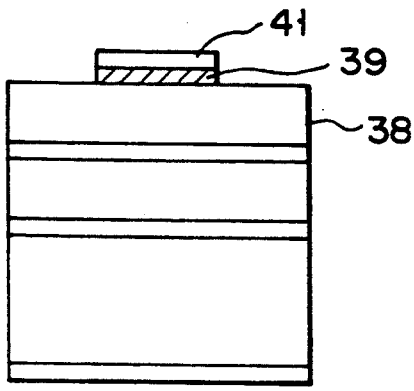

The contact layer 39 serves to enable the electrode 41 to make an ohmic contact with the current spreading layer 38. For example, p-GaAs is used for forming the contact layer 39. FIG. 20 shows how to form the contact layer 39. As seen from FIG. 20A, a p-GaAs layer 39 is formed first on the current spreading layer 38, followed by forming the upper electrode 41 on the layer 39 (FIG. 20B). Further, these electrode 41 and the p-GaAs layer 39 noted above are subjected to a selective etching, with a resist 44 used as a mask (FIG. 20C). Finally, the resist 44 is removed as shown in FIG. 20D, so as to form the contact layer 39 as desired.

In order to sufficiently lower the contact resistance easily, it is desirable to set the carrier concentration of the contact layer 39 at $1 \times 10^{18}$ cm$^{-3}$ or more. Also, it was found important to set the thickness of the contact layer 39 at 50 nm or more for providing a good contact with a high reproducibility. It is not absolutely necessary for the contact layer 39 to be transparent to the wavelength of the emitted light. It should be noted in this connection that the effect of absorption can be avoided by selectively removing the region other than the electrode. In this case, an additional merit can also be obtained that it is possible to remove simultaneously by the damaged portion which is formed by the alloying in the step of forming the electrode.

It should also be noted that, if the contact layer 39 is unduly thick, the contact layer in the edge portion of the electrode 41 is eliminated in the process of removal, with the result that the electrode 41 tends to peel off easily. To overcome the difficulty, it is necessary for the contact layer 39 to have a thickness of 150 nm or less. Further, if the contact layer 39 is sufficiently thin, the absorption can be eliminated, making it possible to remove the contact layer in a region other than the electrode region.

In this embodiment, the contact layer 39 is formed of p-GaAs. In addition, it is possible to use, for example, p-InGaP, p-InGaAlP or p-GaAlAs for forming the contact layer 39. Further, it is possible not to form the contact layer 39 such that the electrode is formed in direct contact with the current spreading layer.

The upper electrode 41 consists of AuZn/Au. Current is injected through the upper electrode 41 into the pellet. Also, the upper electrode 41 acts as a pad for the wire bonding. The upper electrode 41 is effective for expanding the flow of current over the entire region of the pellet. Further, it is important for the electrode 41 not to interrupt the light emission.

The current inhibiting layer 40 serves to expand the flow of current such that the current flows into the region other than the region right under the electrode 41. To be more specific, the current inhibiting layer 40 serving to inhibit the current injection into a part or entire region right under the electrode is used in the present invention so as to avoid the useless current injection into the region right under the electrode. It suffices for the current inhibiting layer 40 to be positioned between the electrode 41 and the active layer 36. For example, it is possible for the current inhibiting layer 40 to be positioned between the upper clad layer 37 and the current spreading layer 38 as shown in FIG. 5, within the current spreading layer 38 as shown in FIG. 21A, between the current spreading layer 38 and the contact layer 39, or between the contact layer 39 and the electrode 41, as shown in FIG. 21B. In order to diminish the current entering the region right under the current inhibiting layer 40, it is desirable for the current inhibiting layer 40 to be positioned as close to the active layer 36 as possible.

The current inhibiting layer 40 can be formed of a semiconductor material having a conductivity opposite to that of the upper clad layer 37. For example, it is possible to use n-GaAs, n-GaAlAs, n-InGaP or n-InAlP for forming the current inhibiting layer 40. It is also possible to use a semiconductor material having a high resistivity such as GaAs, GaAlAs, InGaP, InGaAlP or InAlP. Further, it is possible to use a semiconductor layer having a conductivity type equal to that of the upper clad layer 37 and requiring an excessive voltage drop capable of jumping over the barrier wall formed by the hetero junction which is formed together with the adjacent layer. To be more specific, the current inhibiting layer 40 may be formed of p-GaAs/p-InGaAlP, p-GaAS/p-InAlP, p-GaAlAs/p-InGaAlP or p-GaAlAs/p-InAlP. Still further, an insulating material such as $SiO_2$, $Al_2O_3$ or $Si_3N_4$ may be used for forming the current inhibiting layer.

Where the current inhibiting layer 40 is formed of a material transparent to the wavelength of the emitted light, it is possible to take out the emitted light more effectively. Specifically, if the current inhibiting layer 40 transparent to the wavelength of the emitted light is disposed in a region including the region right under the electrode 41, the useless current flowing into the region right under the electrode can be diminished. In addition, the light emission caused by the current flowing into the region right under the current inhibiting layer 40 is not affected by the absorption and can be taken out.

In this embodiment, the current inhibiting layer 40 formed of n-In$_{1-y}$(Ga$_{1-x}$Al$_x$)$_y$P (x=0.7, y=0.5) was interposed between the upper clad layer 37 and the current spreading layer 38, in the case where the pellet was sized at 300 microns square, the electrode was circular and had a diameter 150 microns, and the emitted light had a wavelength of 590 nm. The carrier concentration of the current inhibiting layer 40 was $1 \times 10^{18}$ cm$^{-3}$, and the thickness of the layer 40 was 150 nm. In this case, current was hardly injected into the region right under the electrode 41. Also, the light emission was concealed by the electrode 41. Further, the light emission caused by the current flowing into the region right under the current inhibiting layer 40 was taken out to the outside through the transparent current inhibiting layer 40. In other words, the particular current noted above was not useless. Incidentally, the current inhibiting layer 40 may be omitted, if the omission does not bring about a significant demerit in terms of the light emitting efficiency.

An element pellet of the construction described above, in which the pellet was sized at 300 microns square and the electrode was circular and had a diameter of 150 microns, was molded with resin such that the expansion half value width was about 8 so as to manufacture an element. Where the values of "x" and "y" in the active layer 36 formed of In$_{1-y}$(Ga$_{1-x}$Al$_x$)$_y$P were set at 0.2 and 0.5, respectively (x=0.2, y=0.5), it was possible to obtain an orange light emission having a wavelength of 610 nm with a brightness of 10 cd (candela). Where the values of "x" and "y" noted above were set at 0.3 and 0.5, respectively, it was possible to obtain a yellow light emission having a wavelength of 590 nm with a brightness of 7 cd. Where the values of "x" and "y" noted above were set at 0.4 and 0.5, respectively, it was possible to obtain a yellowish green light emission having a wavelength of 570 nm with a brightness of 3 cd. Further, where the values of "x" and "y" noted above were set at 0.5 and 0.5, respectively, it was possible to obtain a green light emission having a wavelength of 555 nm with a brightness of 1 cd. In short, it was possible to obtain a light emission with a high efficiency by suitably selecting the carrier concentration and thickness of each of the layers included in the device and the planar direction of the substrate, even in the case where the emitted light had a short wavelength.

In the second embodiment described above, the semiconductor substrate 31 of the first conductivity type was formed of n-GaAs. However, it is also possible to use a substrate of the second conductivity type, e.g., p-GaAs, though in this case it is necessary to reverse the conductivity type of each of the layers formed on the substrate. On the other hand, it is desirable to set the thickness of each of the layers formed on the substrate as in the case where the substrate 31 is formed of an n-GaAs as in the second embodiment described above.

It should be noted, however, that the optimum value of the carrier concentration in each of the layers formed on the substrate differs from that in the case of using the n-GaA substrate in view of the expansion of the current flow and the light emitting efficiency. When it comes to the clad layers, the lower clad layer 35 was formed of n-InGaAlP and the upper clad layer 37 was formed of p-InGaAlP in the second embodiment using the n-GaAs substrate 31. In the case of using a p-GaAs substrate, however, the upper and lower clad layers should be formed of n-InGaAlP and p-InGaAlP, respectively, with the conditions of the n-InGaAlP and p-InGaAlP, being set as in the second embodiment.

It is necessary to reverse the conductivity type in each of the buffer layer 32, the reflective layer 33, the transparent buffer layer 34, the current spreading layer 38, the contact layer 39 and the current inhibiting layer 40 in the case of using p-GaAs substrate, though it suffices to set the carrier concentration as in the case of using the n-GaAs substrate. When it comes to the active layer 36, it is desirable to set the conditions of the active layer regardless of the conductivity type of the substrate as in the case of using the n-GaAs substrate.

Figure 22:
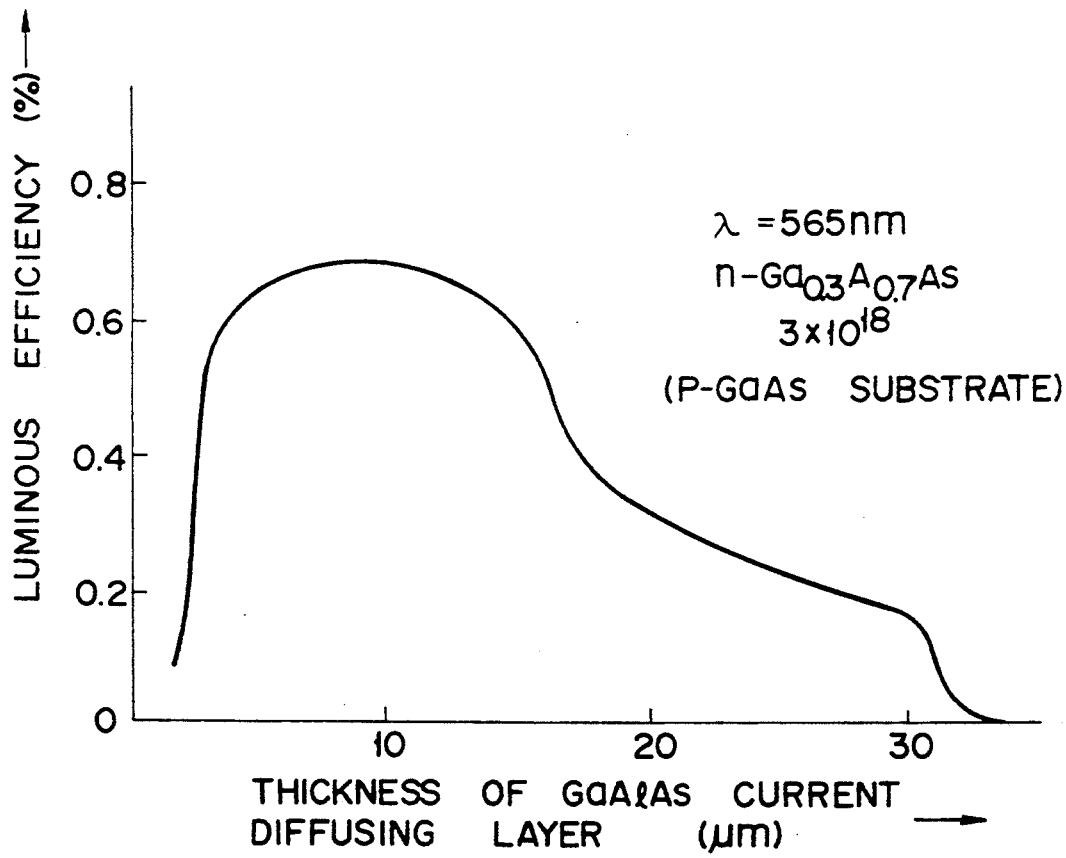
FIG. 22 is a graph showing the relationship between the thickness of a current spreading layer and the light emitting efficiency with respect to a light emitting device according to a modification of the present invention.
Figure 23A:
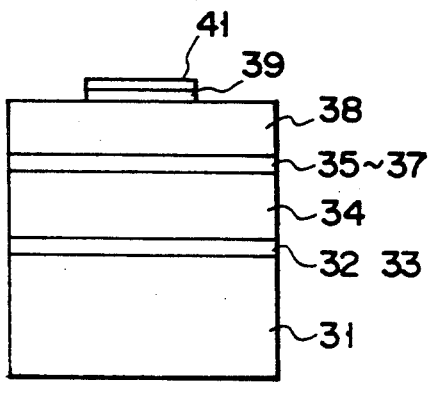
FIGS. 23B and 23B are cross sectional views showing the construction of an element from which the substrate has been removed in accordance with a modification of the present invention.
Figure 23B:
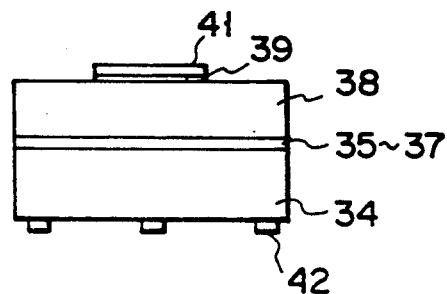

In the case of using a p-GaAs substrate, it is possible to achieve expansion of the current flow more easily than in the case of using an n-type substrate. It should be noted in this connection that the combination of n-InGaAlP and n-GaAlAs permits a greater movability than the combination of p-InGaAlP and p-GaAlAs within the composition range described previously, if the comparison is made on the basis of the same carrier concentration. Thus, the combination n-InGaAlP and n-GaAlPs permits easily forming a layer of a low resistivity. If the particular combination is employed on the side of the upper electrode with respect to the active layer, it is possible to achieve the expansion of the current flow and, thus, the expansion of the light emitting portion more easily. In particular, where the current spreading layer 38 is formed of n-GaAlAs, the resistivity of the current spreading layer is lowered to half the value in the case of using p-GaAlAs. It follows that, even if the thickness (thickness on the side of the lower limit) of the current spreading layer 38 is lowered to a half, it is possible to obtain substantially the same expansion of the current flow, as shown in FIG. 22, leading to substantially the same light emitting efficiency. This was found to be effective in terms of the shortening of the time for the crystal growth operation, leading to a high productivity.

Where an n-GaAs or a p-GaAs is used for forming the semiconductor substrate 31 of the first conductivity type, the substrate acts as an absorber with respect to the wavelength of the emitted light, as described in detail in conjunction with the first and second embodiments. It is impossible to take out the light absorbed by the substrate, with the result that about half the light emitted from the active layer 35 does not contribute to the light emitting efficiency. In order to take out the absorbed light, it is effective to remove the substrate 31 and the buffer layer 32, etc. acting as an absorber with respect to the wavelength of the emitted light, as shown in FIG. 23.

In the case of removing the substrate, the buffer layer, etc., it is important to increase the thickness of each of the transparent buffer layer 34 and the current spreading layer 38 so as to maintain a sufficient mechanical strength of the pellet. In this case, the thickness of the wafer after the substrate removal should be set at 50 microns or more. In the case of removing the substrate, the lower electrode 42 is mounted on the transparent buffer layer 34. The light running downward is reflected by the lower electrode 42 or a reflective plate formed in the assembling step, with the result that the emitted light is free from absorption and can be taken out to the outside.

The descriptions given above cover the case where the semiconductor substrate 31 of the first conductivity type is formed of an n-GaAs, a p-GaAs or the substrate is removed from the device. In addition, it is possible in the present invention to use a substrate formed of a semiconductor material such as GaP, ZnSe, ZnS, Si, or Ge or a mixed crystal thereof. In this case, the technical idea of the present invention applies as it is with respect to the conductivity type. In other words, the substrate of the material exemplified above may be either an n-type or a p-type. In the case of using a substrate formed of GaP, ZnSe, ZnS, GaAsP, InGaP, etc., the substrate becomes transparent to the wavelength of the emitted light, making it unnecessary to remove the substrate as exemplified previously.

In these cases, however, a difficulty which does not take place in the case of using a GaAs substrate is brought about. Specifically, it is difficult in some cases to achieve alignment of lattice between the material of the active layer and the substrate. In such a case, it is important to provide a lattice constant gradient layer of the conductivity type equal to that of the substrate so as to suppress the generation of dislocation within the active layer and, thus, to suppress the recombination which does not emit light. The lattice constant gradient layer noted above should be constructed such that the lattice constant of the layer is gradually changed on the side of the substrate toward the active layer. Of course, the lattice constant in the region close to the substrate should be substantially equal to that of the substrate. Likewise the lattice constant in the region close to the active layer should be substantially equal to that of the active layer. The material of the lattice constant gradient layer should desirably be transparent to the wavelength of the emitted light. For example, it is desirable to use InGaAlP for forming the lattice constant gradient layer. Where the active layer has a lattice constant equal to that of the GaAs substrate, it is desirable to form the transparent buffer layer of GaAlAs on the lattice constant gradient layer. In this case, the formation of a layer having a lattice constant substantially equal to that of the active layer permits effectively suppressing the dislocation. FIG. 24 shows the construction of the particular case. As shown in the drawing, the device comprises a transparent substrate 51 and a lattice constant gradient layer 52.

It should be noted that Si and Ge are opaque to the wavelength of the emitted light. However, these semiconductor materials permit forming a good substrate crystal and, thus, are desirable for use as the substrate material in view of the capability of mass production and productivity. In the case of using Si, it is impossible to achieve lattice alignment between the substrate and the active layer. Thus, it is important to provide a lattice constant gradient layer of the conductivity type equal to that of the substrate so as to suppress the occurrence of dislocation within the active layer and, thus, to suppress the recombination which does not emit light. In this case, the lattice constant of the lattice constant gradient layer is gradually changed from the side of the substrate, in which the lattice constant of the lattice constant gradient layer is substantially equal to that of the substrate, toward the active layer, in which the lattice constant of the lattice constant gradient layer is substantially equal to that of the active layer. The lattice constant gradient layer meeting the particular requirements described above should be formed of a mixed crystal or super lattice of GaP, AlP, GaAs, Inp, etc. In the case of using Ge, no difficulty is brought about in terms of the lattice alignment.

In any case, the transparent buffer layer formed of GaAlAs is effective for suppressing the dislocation. Also, it is desirable to remove these substrates after the crystal growth as in the use of a GaAs substrate.

The modifications described above, in which the substrate is formed of materials other than n-GaAs, produce prominent effects on the improvement of the light emitting efficiency as in the first and second embodiments using an n-GaAs substrate, i.e. the effects in terms of the expansion of the current flow which is caused by the current spreading layer, etc., the reduction of the useless current achieved by the current inhibiting layer, as well as the carrier concentrations, thicknesses and degrees of disordering, etc. of the active layer and the clad layers.

FIG. 25 is a cross sectional view showing a semiconductor light emitting device according to a third embodiment of the present invention. As seen from the drawing, the light emitting device comprises an n-GaAs substrate 61. The major surface of the substrate 61 is inclined from (100) plane by 15° in the direction of [011]. Formed on the substrate 61 is a laminate structure consisting of an n-$In_{0.5}(Ga_{1-x1}Al_{x1})_{0.5}P$ clad layer 62, a $In_{0.5}(Ga_{1-x2}Al_{x2})_{0.5}P$ active layer 63, a p-$In_{0.5}(Ga_{1-x3}Al_{x3})_{0.5}P$ clad layer 64 (Zn doping), a p-$In_{0.5}Ga_{0.5}$ intermediate band gap layer 65, and a p-GaAs contact layer 66 Further, a p-side electrode 67 consisting of AuZn is formed on the contact layer 66, with an n-side electrode 68 consisting of AuGe being formed on the back surface of the substrate 61.

FIG. 26 schematically shows the current distribution and the light emitting region in the light emitting device shown in FIG. 25. Specifically, the broken arrows shown in FIG. 26 denote the current distribution within the light emitting device. On the other hand, the dotted region in FIG. 26 denotes the light emitting region 71. The aluminum content in each of the InGaAlP layers is set to meet the conditions of $x2 \leq x1$, $x2 \leq x3$ in order to obtain a high light emitting efficiency. For example, the aluminum content is set:

$x1 = x3 = 0.7$; $x2 = 0.3$.

In the construction shown in FIGS. 25 and 26, the thickness and the carrier concentration of each layer is set to be as shown within the paranthesis in the table given below:

n-GaAs substrate 61 (80 microns; $3 \times 10^{18}$ cm$^{-3}$);
n-InGaAlP clad layer 62 (1 micron; $5 \times 10^{17}$ cm$^{-3}$);
InGaAlP active layer 63 (0.5 micron; undoped;
p-InGaAlP clad layer 64 (2 microns; $2 \times 10^{18}$ cm$^{-3}$);
p-InGaP intermediate
band gap layer 65 (0.05 micron; $1 \times 10^{18}$ cm$^{-3}$);

Further, the p-side electrode 67 was circular and had a diameter of 200 microns.

The third embodiment shown in FIG. 25 differs in construction from the conventional device in that, in the third embodiment, the major surface of the GaAs substrate 61 on which is laminated an element structure is inclined from the (100) plane by 15° in the direction of [011]. The inclination noted above produces a prominent effect as described below.

Specifically, in the conventional device constructed such that the (100) plane of the GaAs substrate 61 is used as the main crystal growth surface, the expansion of the current flow in the p-InGaAlP clad layer 64 is small because the p-clad layer 64 has a high resistivity. It may be reasonable to understand that the expansion of the current flow can be increased by increasing the thickness of the p-clad layer 64. However, the InGaAlP series materials have a low thermal conductivity. It follows that the thickness of the p-clad layer 64 is increased, the crystalline structure is impaired. Also, the upper layers are adversely affected. What should also be noted is that the rate of crystal growth is restricted in the case of the InGaAlP series material in view of the quality of the grown crystal. It follows that the operation for the crystal growth must be carried out for a longer time in order to form a thick crystal layer of the p-clad layer 64. The longer operating time indicates that, in the case where an impurity having a high diffusion rate is used as the impurity contained in the p-clad layer 64, the impurity is diffused into the active layer 63, with the result that the element characteristics are impaired. Under the circumstances, it is difficult to increase the thickness of the p-InGaAlP clad layer 64.

What should also be noted is that, where the InGaAlP series material is doped with Zn, it is difficult to obtain a high carrier concentration because the rate of activation of Zn is low. In addition, Zn has a high diffusion rate, with the result that the Zn doping with a high concentration brings about the Zn diffusion into the active layer 63. It follows that the element characteristics are impaired.

It is desirable to provide a wide band gap between the clad layers 62, 64 and the active layer 63 so as to enable the clad layers to confine effectively the light and carriers to the active layer 63. In order to provide a wide band gap, it is necessary to increase the aluminum content of each of the clad layers 62 and 64. However, in the case of using Zn as an impurity of the clad layer 64, the increase in the aluminum content brings about reduction in the carrier concentration, leading to a high resistivity of the clad layer 64. Such being the situation, it was difficult to expand the flow of the injected current depending on the element structure formed on the GaAs substrate 61, with the result that the light emission was achieved only a region right under the electrode and, thus, the efficiency of taking out the emitted light was very low in the conventional light emitting device.

On the other hand, where the crystal-growing major surface of the GaAs substrate 61 is inclined from the (100) plane by 5° to 15° in the direction of [011] as shown in FIGS. 25 and 26, it is possible to achieve a Zn doping in a high concentration even if the p-clad layer 64 has a high aluminum content, making it possible to form the p-InGaAlP clad layer 64 having a low resistivity.

Figure 27:
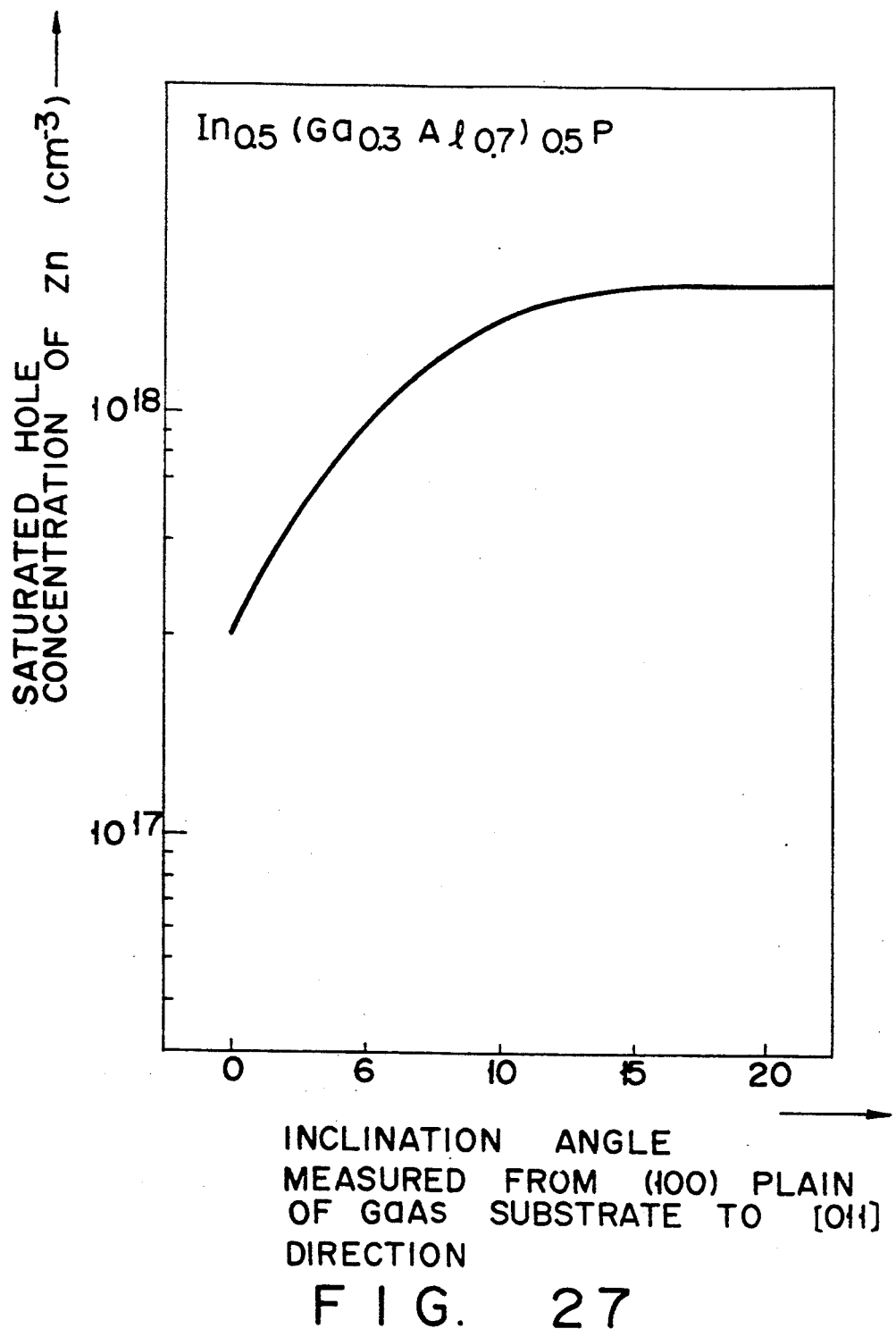
FIG. 27 is a graph showing the relationship between the inclination angle and the saturated hole concentration of Zn.

FIG. 27 shows the relationship between the saturated hole concentration in the case where InGaAlP having an aluminum content of 0.7 is doped with Zn and the angle of inclination of the GaAs substrate from the (100)

plane in the direction of [011]. As apparent from the graph of FIG. 27, the saturated hole concentration is increased with increase in the angle of inclination. Particularly, where the angle of inclination is larger than 5°, the saturated hole concentration is as high as $1 \times 10^{18}$ cm$^{-3}$ or more. In this case, the intensity of the emitted light is more than three times as high as that in the case where the crystal-growing major surface of the substrate is not inclined at all.

As described above, the element structure according to the third embodiment of the present invention makes it possible to expand the flow of current injected through the electrode 67 within the p-InGaAlP clad layer 64 having a low resistivity. As a result, it is possible to achieve light emission in a wide region other than the region right under the electrode 67, as apparent from the current distribution shown in FIG. 26. As a matter of fact, the resistivity of the p-InGaAsP clad layer 64 of an element formed on the crystal-growing major surface of the GaAs substrate, which was inclined from the (100) plane by 15° in the direction of [011] as in the present invention was found to be 0.2 O.cm. On the other hand, the resistivity of the p-InGaAlP clad layer of an element formed on the crystal-growing major surface, (100) plane as in the conventional device, of the GaAs substrate was found to be as high as 2 O.cm under the condition that the aluminum content and the carrier concentration of the p-clad layer were the same as in the case of the present invention.

Figure 28:
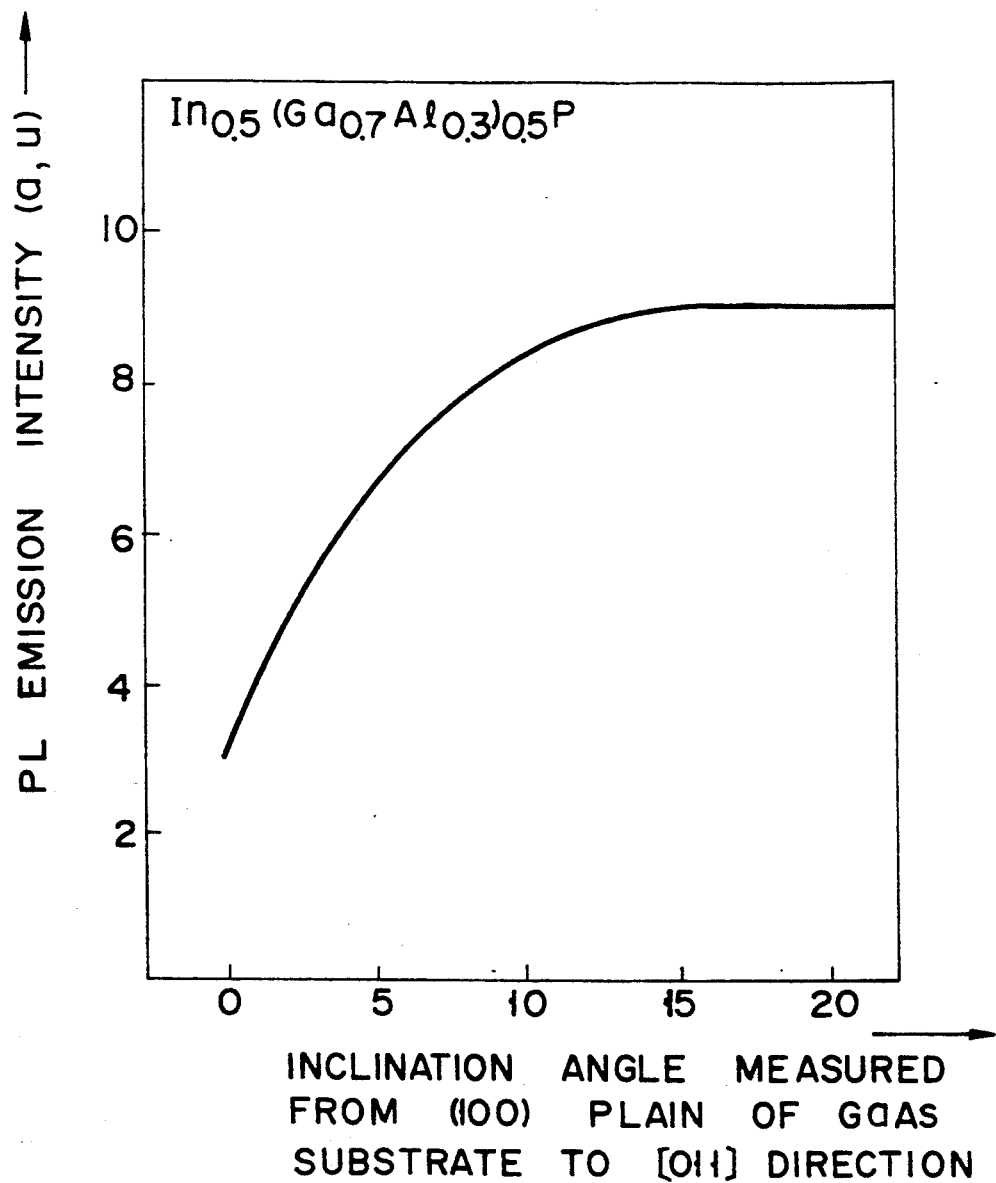
FIG. 28 is a graph showing the relationship between the inclination angle and the intensity of the PL emitted light.
Figure 29:
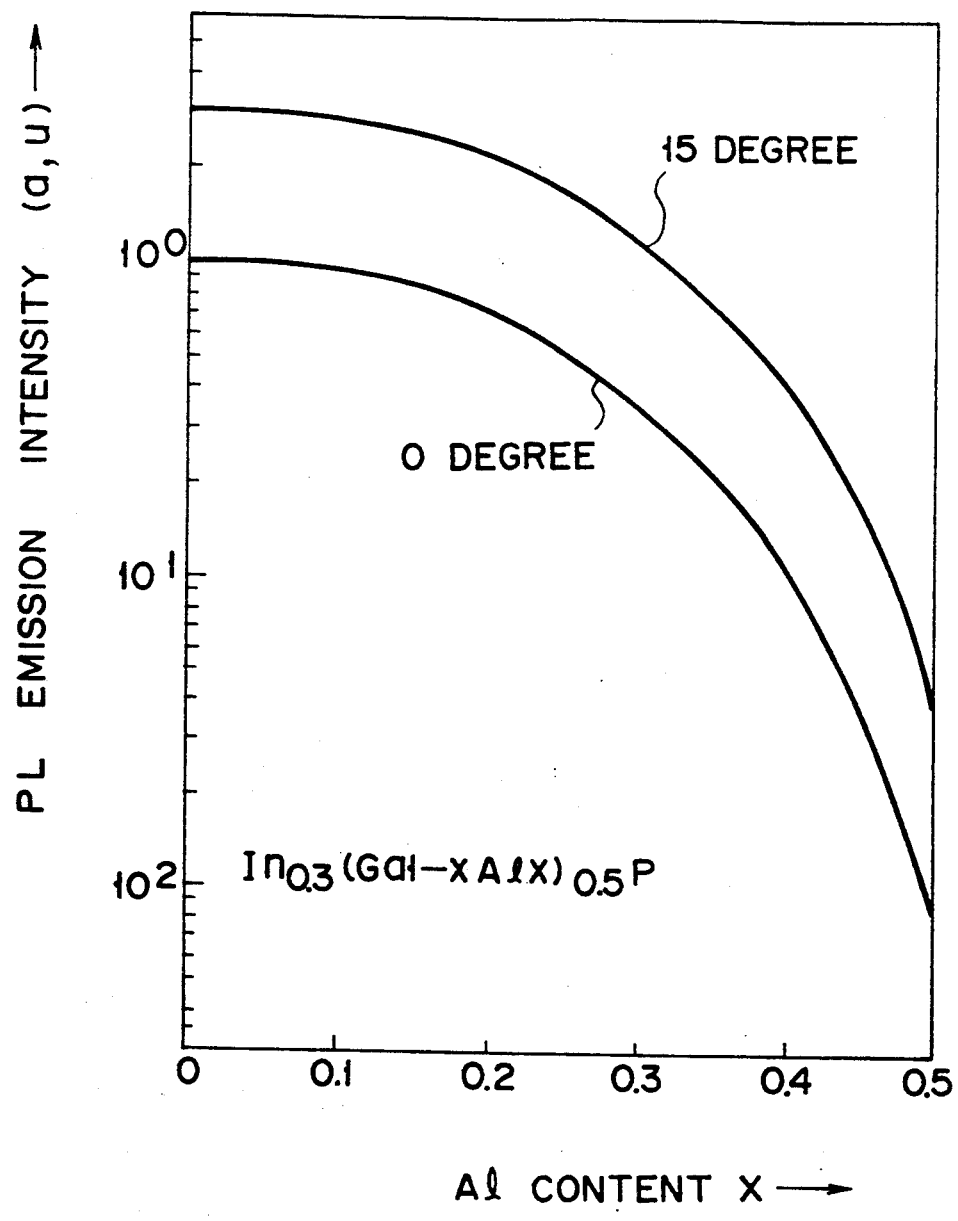
FIG. 29 is a graph showing the relationship between the Al content and the intensity of the PL emitted light.

Further, the photo luminescence (PL) of the active layer 64 was evaluated with respect to the light emitting device of the present invention and the conventional light emitting device, with the result that the device according to the embodiment of the present invention was found to be higher in the light emitting efficiency. FIG. 28 shows the relationship between the intensity of the emitted light (PL) and the angle of inclination, which covers the case where the aluminum content "x" of the active layer was set at 0.3. As seen from the graph of FIG. 28, the PL light emission intensity is increased with increase in the angle of inclination. To be more specific, where the angle of inclination is 5° or more, the intensity of the emitted light was found to be at least three times as high as in the case of no inclination. Of course, the intensity of the emitted light is sufficiently high. FIG. 29 shows the relationship between the aluminum content and the PL light emission intensity, covering the cases where the angle of inclination is 0° and 15°. As seen from the graph of FIG. 29, the effect of increasing the intensity of the emitted light, which is brought about by the inclination of the substrate, is recognized over a wide range of the aluminum content.

As apparent from the above description, the semiconductor light emitting device according to the third embodiment of the present invention permits improving the brightness. In addition, the InGaAlP mixed crystal formed on a GaAs substrate which is inclined from the (100) plane in the direction of [011] is known to suppress the generation of natural super lattice, with the result that the band gap is made greater than that of the mixed crystal grown on the (100) plane. The increase in the band gap makes it possible to use an active layer of a smaller aluminum content for obtaining a light emission of a certain wavelength. It follows that it is possible to improve the brightness of the emitted light in the short wavelength region.

An element of the laminate structure described above was manufactured, in which the active layer was formed of $In_{0.5}(Ga_{1-x2}Al_{x2})_{0.5}P$ (the aluminum content 2x being 0.3. Where current was allowed to flow through the element by applying voltage in the forward direction, the current distribution was as shown in FIG. 25 so as to obtain emission of light having a peak wavelength at 600 nm from a wide surface region of the element except for the p-side electrode 67. Incidentally, it is possible to obtain the similar effect in the case where the carrier concentration gradient in the direction of the crystal growth is formed within the p-clad layer doped with Zn, said p-clad layer being formed on the light emitting portion consisting of InGaAlP.

As described above, used is the crystal-growing major surface of the GaAs substrate 61 which is inclined from the (100) plane by 15° in the direction of [011] in the semiconductor light emitting device according to the third embodiment of the present invention. The particular construction makes it possible to lower the resistivity of the p-InGaAlP clad layer 64 formed on the InGaAlP active layer 63 of the light emitting portion, with the result that it is possible to expand the flow of current injected through the electrode 67 widely within the p-clad layer 64. It follows that the light emitting region can be expanded to the region outside the region right under the electrode, leading to an improved efficiency in the take-out of the light from the peripheral region of the electrode and, thus, to an improved brightness.

FIG. 30 is a cross sectional view showing the construction of a semiconductor light emitting device according to a fourth embodiment of the present invention. The reference numerals shown in FIG. 30, which are common with those shown in FIG. 25, denote the members of the device equal to those shown in FIG. 25 and, thus, detailed descriptions thereof are omitted in the following description of the fourth embodiment.

The fourth embodiment shown in FIG. 30 differs from the third embodiment described previously in that, in the fourth embodiment, the p-InGaAlP clad layer is of two-layer structure consisting of two layers differing from each other in the aluminum content "x". To be more specific, the p-InGaAlP clad layer consists of a first p-clad layer 64 positioned in contact with the active layer 63 and a second p-clad layer 73 formed on the first p-clad layer 63. The first p-clad layer 64 is formed of p-$In_{0.5}(Ga_{0.3}Al_{0.7})_{0.5}P$. The aluminum content "x" of the first p-clad layer 64 is set at a high value in order to confine the light and the carriers. On the other hand, the second p-clad layer 73 is formed of p-$In_{0.5}(Ga_{0.6}Al_{0.4})_{0.5}P$ and serves to promote the current diffusion. Further, an intermediate band gap layer 65 and a contact layer 66 are formed on the second p-clad layer 73.

The first p-clad layer 64 has a thickness of 1 micron and a carrier concentration of $2 \times 10^{17}$ cm$^{-3}$ On the other hand, the second p-clad layer 73 has a thickness of 3 microns and a carrier concentration of $6 \times 10^{18}$ cm$^{-3}$. The other layers are equal to those of the third embodiment in the thickness and carrier concentration.

The device of the fourth embodiment differs from the conventional device in that, in the fourth embodiment, the second p-clad layer 73 having an aluminum content lower than that of the first p-clad layer 64 is formed on the first p-clad layer 64. As described previously, in the p-InGaAlP doped with Zn, the carrier concentration depends greatly on the aluminum content. Where the Zn doping is set constant, the carrier concentration is decreased with increase in the aluminum content, leading to in increased resistivity. Thus, in the fourth embodiment described above, it is possible to make the resistivity of the second p-clad layer 73 having an aluminum content "x" of 0.4 lower than that of the first p-clad layer 64 having an aluminum content "x" of 0.7.

What should also be noted is that the crystal-growing major surface of the GaAs substrate 61 is inclined from the (100) plane by 15° in the direction of [011], with the result that the carrier concentration can be made higher, leading to further decrease in the resistivity. It follows that it is possible to make greater the difference in resistivity between the first p-clad layer 64 and the second p-clad layer 73. Since a sharp resistivity gradient is formed within the p-clad layers 64 and 73, the flow of current injected through the electrode 67 can be expanded widely in the p-clad layer 73 having a lower resistivity. It follows that it is possible to achieve light emission in a wide region other than the region right under the electrode.

The resistivity of the first p-clad layer 64 having the carrier concentration noted previously was found to be 2 O.cm. On the other hand, the resistivity of the second p-clad layer 73 having the carrier concentration noted previously was found to be as low as 0.2 O.cm. Because of this large difference in resistivity, the flow of current injected through the electrode is expanded greatly within the second p-clad layer 73 before the current reaches the first p-clad layer 64. As a result, the current distribution becomes as in the third embodiment, making it possible to light emission from a wide surface area of the element except for the p-side electrode. Further, the light emitted from the element of the laminate structure of the fourth embodiment had a peak wavelength of 600 nm as in the light emitted from the element of the third embodiment.

In the fourth embodiment, the second p-clad layer 73 was formed of p-$In_{0.5}(Ga_{0.6}Al_{0.4})_{0.5}P$. However, the composition of the second p-clad layer 73 need not be restricted to the above as far as the aluminum content of the composition is lower than that of the first p-clad layer 64 and, thus, exhibits a lower resistivity, and the composition has a band gap energy greater than that of the active layer 63. It is also possible to increase the carrier concentration of the second p-clad layer 73 alone without changing the composition. Further, the second p-clad layer 73 need not be of a single layer structure. In other words, it is possible to employ a laminate structure consisting of a plurality of layers differing from each other in composition as far as the second p-clad layer 73 is formed of an InGaAlP layer having an aluminum content lower than that of the first p-clad layer 64 and a band gap larger than that of the active layer 63. Of course, such a laminate structure produces the similar effect. It is also possible to form a composition gradient layer in which the aluminum content is gradually lowered from the first p-clad layer 64.

In each of the fourth embodiment and fifth embodiment described above, the crystal-growing major surface of the GaAs substrate was inclined from the (100) plane by 15° in the direction of [011]. However, the angle of inclination need not be restricted to 15°. Needless to say, the similar effect can be obtained if the angle of inclination is at least 5°. Further, the construction of the layers of the light emitting portion including the active layer need not be restricted to a double hetero structure. For example, it is possible to employ the single hetero structure or a homogeneous junction structure. In addition, various modifications are available within the technical scope of the present invention.

FIG. 31 is a cross sectional view schematically showing the construction of a semiconductor light emitting device according to a fifth embodiment of the present invention. In this embodiment, an active layer consisting of InGaAlP is formed on the front surface of a semiconductor substrate, and the emitted light is taken to the outside from the back surface of the substrate except for the electrode formed on a part of the back surface of the substrate. It should by noted that the band gap of the semiconductor substrate is set smaller than the energy of the wavelength of the emitted light. Also, the distance between the semiconductor substrate and the active layer is set smaller than the distance between the active layer and the light emitting plane. The particular construction enables the semiconductor light emitting device to diminish the light emitting point and achieve light emission with a high efficiency.

To be more specific, the semiconductor light emitting device according to the fifth embodiment of the present invention comprises an n-GaAs substrate 101, an n-InGaAlP clad layer 102, an InGaAlP active layer 103, a p-InGaAlP clad layer 104, a p-GaAlAs layer 105, a GaAs contact layer 106, a AuZn p-side electrode 107 and a AuGe n-side electrode 108, as shown in FIG. 31. The mixed crystal composition is determined such that the energy gap of the InGaAlP active layer 103 is smaller than that of the clad layers 102 and 104 so as to form a double hetero structure which is effective for confining the emitted light and the carriers to the active layer. Also, the composition of the p-GaAlAs layer is set to be substantially transparent to the wavelength of the emitted light. The device of the fifth embodiment is of a double hetero structure. However, it is possible for the device to be of a single hetero structure or of a homogeneous junction structure. Also, in the fifth embodiment shown in FIG. 31, the substrate is of p-type conductivity. However, it is possible to reverse the conductivity type.

The thickness and carrier concentration of each of the layers included in the semiconductor light emitting device shown in FIG. 31 are as follows:

|  | Thickness (microns) | Carrier Concentration |
| --- | --- | --- |
| n-GaAs substrate 101 | 250 | $3 \times 10^{18} cm^{-3}$ |
| n-InGaAlP clad layer 102 | 1 | $5 \times 10^{17} cm^{-3}$ |
| InGaAlP active layer 103 | 0.5 | undoped |
| p-InGaAlP clad layer 104 | 1 | $7 \times 10^{17} cm^{-3}$ |
| p-GaAlAs layer 105 | 5 | $3 \times 10^{18} cm^{-3}$ |
| GaAs contact layer 106 | 0.1 | $3 \times 10^{18} cm^{-3}$ |

The semiconductor light emitting device of the fifth embodiment differs from the conventional semiconductor light emitting device in that, in the fifth embodiment, the active layer is formed of InGaAlP and the distance of the active layer from the light emitting plane is shorter than the distance from the GaAs substrate which provides an absorbing layer with respect to the wavelength of the emitted light. The particular construction permits producing a prominent effect as described below.

Specifically, the light beam emitted from the InGaAlP active layer runs partly toward the substrate and partly toward the light emitting plane. Where the energy of the light beam reaching the GaAs substrate is smaller than the energy gap of the substrate, the light beam is absorbed by the substrate. As a result, as the light beam running toward the substrate cannot be taken out to the outside. It follows that expansion in the area of the light emission, which is caused by the reflection from the back surface of the substrate in the conventional device, does not take place in the fifth embodiment of the present invention, with the result that the fifth embodiment makes it possible to obtain a small light emitting point. On the other hand, where the active layer is formed of an InGaAlP material, it is possible to obtain a good epitaxially grown crystal layer by means of an organic metal gaseous phase growth method over a wide wavelength range covering green, yellow, orange and red regions. It is also possible to form easily a double hetero structure which is absolutely necessary for obtaining a light emission with a high efficiency while achieving a lattice alignment with the GaAs substrate. Where the values of "x" and "y" in the composition of $In_{1-y}(Ga_{1-x}Al_x)_yP$ forming the active layer were set at 0.45 and 0.5, respectively, it was possible to obtain an external light emitting efficiency as high as 0.5% for the emission of green light (560 nm). Where the values of "x" and "y" were set at 0.3 and 0.5, respectively, it was possible to obtain an external light emitting efficiency as high as 1.5% for the emission of yellow light (585 nm) and 4.5% for the emission of orange light (610 nm). In this experiment, the substrate was not transparent to the wavelength of the emitted light. In the conventional device using a transparent substrate and a GaAsP active layer, however, the external light emitting efficiency with respect to each of the yellow light emission and orange light emission was only about 0.3%. In other words, the particular construction of the present invention makes it possible to achieve an external light emitting efficiency about 5 to 10 times as high as that in the conventional device. The prominent effect of the present invention is considered to be derived from the fact that the InGaAlP series material used in the present invention has a direct transition type band gap within the wavelength region noted above. In conclusion, the active layer included in the semiconductor light emitting device according to the fifth embodiment of the present invention is formed of an InGaAlP series material, and the light absorption by the substrate is utilized in the fifth embodiment of the present invention, making it possible to obtain a light emission with a high efficiency while maintaining a small light emitting point.

Figure 32:
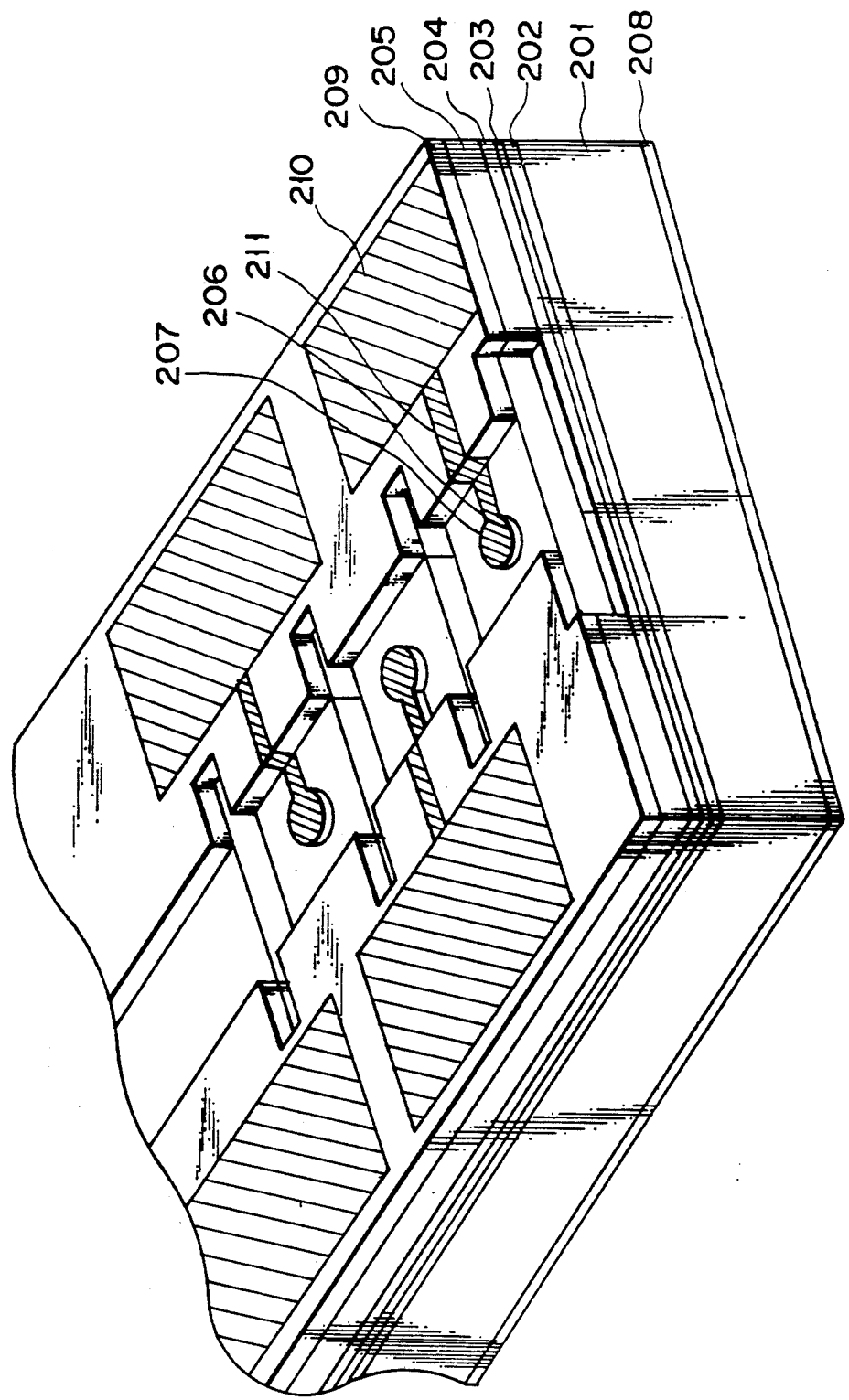
FIG. 32 is a cross sectional view showing the construction of a semiconductor light emitting device according to a sixth embodiment of the present invention.

FIG. 32 is an oblique view schematically showing the construction of a semiconductor light emitting device according to a sixth embodiment of the present invention. Reference numerals 201 to 208 shown in FIG. 32 correspond to members 101 to 108 in the fifth embodiment shown in FIG. 31. The sixth embodiment shown in FIG. 32 differs from the fifth embodiment shown in FIG. 31 in that the sixth embodiment comprises a plurality of electrodes and a mechanism for individually controlling the current injection. To be more specific, it is possible to individually control the light emission corresponding to each electrode by selectively removing the GaAlAs layer 205 positioned between two adjacent electrodes. It should also be noted that a bonding pad 210 is formed on an insulating layer 209 formed of, for example, n-InGaAlP. The bonding pad 21n is connected via a wiring 211 to the electrode 207 so as to make it possible to achieve the current injection from a power source corresponding to each element, said power source being disposed outside the element. In this embodiment, the diameter of the electrode 207 was set at 10 microns, the distance between the adjacent elements was 25 microns, and the separation width of the GaAlAs layer 205 was 5 microns.

In the device shown in FIG. 32, the characteristics of the individual element were found to be substantially equal to those of the fifth embodiments shown in FIG. 31. Also, the current injected through the electrode 207 was found to expand laterally within the GaAlAs layer 205, and it was possible to achieve a substantially uniform injection at the interface between the GaAlAs layer 205 and the p-InGaAlP clad layer 204. On the other hand, the resistivity of the p-InGaAlP clad layer 204 was found to be low, and the expansion of the current flow was about 1 micron or less, with the result that the current injection into the active layer 203 took place in substantially a region right under the GaAlPs layer and, thus, the point of light emission was restricted to only that region. Such being the situation, it was possible to obtain easily a light emission with a small light emitting point and a high brightness. It was also possible to achieve printing with such a high precision as 1,000 dots per inch by using an array of 200 to 2,000 yellow and orange light emitting devices. Further, the printing speed was 5 to 10 times as high as in the conventional GaAsP system.

In the sixth embodiment described above, the substrate was formed of GaAs. However, it is possible to use a substrate of another material with substantially the same effect, as far as the substrate permits a high absorption with respect to the wavelength of the light emitted from the InGaAlP active layer. To be more specific, it is possible to use Si, Ge, etc. for forming the substrate. Also, in the embodiment described above, the GaAlAs layer was selectively removed for the element isolation. Needless to say, however, any desired method can be employed as far as the element isolation can be achieved such that the current injected from each electrode does not affect the adjacent element. For example, it is possible to implant ions into the GaAlAs layer or the InGaAlP clad layer so as to increase the resistivity of these layers. It is also possible to form a current inhibiting layer by applying a crystal growth operation twice. Further, in the embodiment described above, an n-InGaAlP was used for forming the insulating layer positioned below the bonding pad. Needless to say, however, it is also possible to use another semiconductor material or insulating material such as n-GaAs or $SiO_2$ for forming the insulating layer positioned below the bonding pad. Still further, various modifications are available within the technical scope of the present invention.

As described above in detail, the present invention provides a semiconductor light emitting device comprising an in GaAlP active layer formed on the front surface of a semiconductor substrate and constructed such that the emitted light is taken out from the back surface of the substrate except for the electrode region formed on a part of the back surface of the substrate. The InGaAlP active layer is of p-type having a low impurity concentration and has a thickness of 0.25 to 0.75 micron. The particular construction permits the semiconductor light emitting device of the present invention to emit light of even a short wavelength with a high efficiency.

It is also important to note that, in the present invention, the major surface of the substrate is inclined from the (100) plane by at least 5° in the direction of [011], making it possible to improve the current distribution in the light emitting portion. It follows that the semiconductor light emitting device of the present invention permits improving the light take-out efficiency and the brightness.

Various types of modifications of the present invention will be described below with reference to the accompanying drawings.

Figure 33:
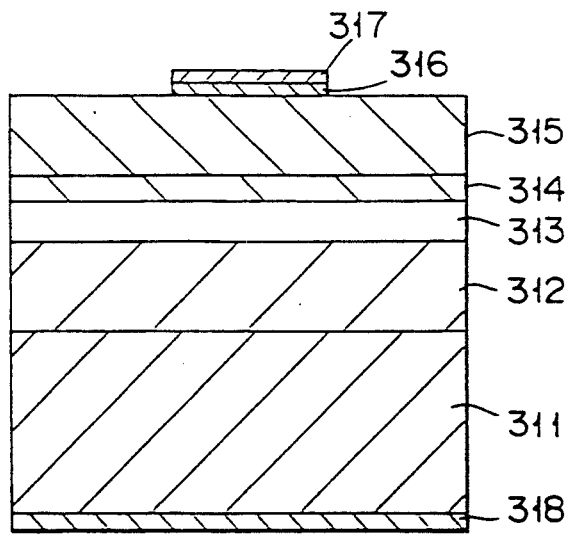
FIG. 33 is a sectional view showing an LED (light-emitting diode) according to one modification of the present invention.

FIG. 33 is a schematic sectional view showing a structure of a semiconductor light emitting device according to one embodiment of the present invention. as shown in FIG. 33, a lower clad layer 312 consisting of n-$In_{0.5}(Ga_{1-x}Al_x)_{0.5}P$, an active layer 313 consisting of $In_{0.5}(Ga_{1-y}Al_y)_{0.5}P$, an upper clad layer 314 consisting of p-$In_{0.5}(Ga_{1-z}Al_z)_{0.5}P$, a p-$Ga_{1-p}Al_pAs$ layer 315, and a contact layer 316 consisting of p-GaAs are sequentially stacked on one major surface of a substrate 311 consisting of n-GaAs. A p-type side first electrode 317 consisting of Au-Zn is formed on the contact layer 16, and an n-type side second electrode 318 consisting of Au-Ge is formed on the other major surface of the substrate 311. The thickness of the p-GaAlAs layer 315 us much larger than that of the upper clad layer 314.

Figure 34:
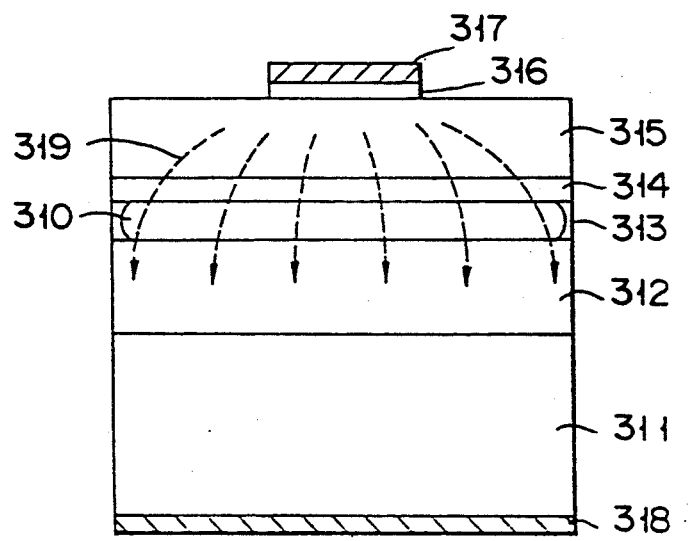
FIG. 34 is a sectional view showing a current distribution and a light emitting region of the LED shown in FIG. 33.

FIG. 34 shows current distribution and a light emitting portion inside the device shown in FIG. 33. Referring to FIG. 34, broken line arrows 319 indicate a current distribution in the device, and reference numeral 310 denotes a light emitting portion. In order to obtain a high light-emission efficiency, Al contents x, y, and z in each InGaAlP layer satisfy $y \leq x$ and $y \leq z$. That is, a double heterojunction is formed such that an energy gap of the active layer 313 serving as a light emitting layer is smaller than those of the two p- and n-type clad layer 312 and 314. Each of x, y, and z satisfies a corresponding one of the following inequalities;

$0 \leq x \leq 1$, preferably, $0.5 \leq x \leq 1$
$0 \leq y \leq 1$, preferably, $0 \leq y < 0.6$
$0 \leq z \leq 1$, preferably, $0.5 \leq z \leq 1$ A band gap larger than that of the active layer 313 is selected for the p GaAlAs layer 315 so that the layer 315 becomes transparent with respect to the wavelength of light emitted from the active layer 313. For example, p in $Ga_{1-p}Al_pAs$ preferably satisfies $0.45 \leq p \leq 1$.

Although an LED having the above double heterojunction structure will be described below, a layer structure of an active layer portion is not essential in terms of a light extraction efficiency. Therefore, a single heterojunction structure or a homojunction structure can be considered to be equivalent to the above double heterojunction structure.

In the structure shown in FIGS. 33 and 34, the thickness and carrier concentration of each layer are set as shown in the following parentheses: the substrate 311 (80 μm, $3 \times 10^{18}$ cm$^{-3}$), the lower clad layer 312 (1 μm, $5 \times 10^{17}$ cm$^{-3}$), the active layer 313 (0.5 μm, undoped), the upper clad layer 314 (0.2 μm, $4 \times 10^{17}$ cm$^{-3}$), the p-GaAlAs layer 315 (3 μm, $3 \times 10^{18}$ cm$^{-3}$), and the contact layer 315 (0.1 μm, $3 \times 10^{18}$ cm$^{-3}$). Note that the thickness of the p-GaAlAs layer 315 is preferably 1 μm to 20 μm.

One feature of the above structure is that the p-GaAlAs layer 315 having a much larger thickness than that of the lower clad layer 312 consisting of p-InGaAlP is formed on the layer 312. Superiority of this structure will be described below.

If the p-GaAlAs layer 315 is not present in the structure shown in FIG. 33 spread of a current in the upper clad layer consisting of p-InGaAlP is small because its resistivity is high. The current spread may be widened by increasing the thickness of the layer. Since, however, thermal conductivity is low in an InGaAlP system material, a large film thickness is not preferred because crystal quality is degraded and the overlying layer is adversely affected. In addition, in an InGaAlP system semiconductor material, since a growth speed is limited in consideration of the crystal quality, a growth time must be prolonged in order to grow a thick film. If an impurity having high diffusibility is used in the clad layer, therefore, impurity diffusion to the active layer occurs to degrade the device characteristics. For this reason, it is difficult to grow a thick InGaAlP layer. By forming the p-GaAlAs layer 315 which can be lattice-matched with GaAs to realize a low resistivity and a high growth speed on the upper clad layer 314 consisting of p-InGaAlP, a current injected from the electrode can be spread in the p-GaAlAs layer 315, thereby enabling light emission in a wide region except for a portion immediately below the electrode. The resistivities of the upper clad layer 314 consisting of p-$In_{0.5}(Ga_{0.3}Al_{0.7})_{0.5}P$ and the p-$(Ga_{0.2}Al_{0.8})As$ layer 315 used in this embodiment at the carrier concentration described above are 1 Ωcm and 0.05 Ωcm, respectively. Since, therefore, a resistivity difference is large, a current injected from the electrode is widely spread in the p-GAlAs layer 315 before reaching the p-type clad layer 314.

In the above stacking structure, a device was constituted by using 0.3 as the Al content y in the $In_{0.5}(Ga_{1-y}Al_y)_{0.5}P$ active layer, and a voltage was applied in the forward direction to flow a current. As a result, the current distribution shown in FIG. 34 as obtained, and light emission having a peak wavelength at 610 mm was obtained throughout a wide surface region of the device except for the p-type side electrode (Au-Zn) 317.

The present invention is not limited to the above embodiment. For example, although $In_{0.5}(Ga_{0.7}Al_{0.3})_{0.5}P$ is used as the composition of the active layer in the above embodiment, light emission of a visible light region from red to green regions can be obtained by changing the Al content. In addition, $In_{0.5}(Ga_{0.3}Al_{0.7})_{0.5}P$ is used as the composition of the clad layer in the above embodiment. The composition, however, is not limited to that of the above embodiment but may be any composition provided that a satisfactory band gap difference for entrapping carriers is obtained with respect to the active layer. Although the upper clad layer 314 consisting of p-InGaAlP is formed between the InGaAlP active layer 313 and the p-GaAlAs layer 315 in the above embodiment, the same effect can be obtained by a structure in which the p-GaAlAs layer 315 is formed directly on the active layer 313 consisting of InGaAlP. In this structure, however, a band gap difference with respect to the active layer 313 is smaller than that in the structure in which the upper clad layer 314 consisting of p-InGaAlP is formed. Therefore, overflow of carriers occurs more easily than in the structure of the above embodiment to slightly degrade the device characteristics. Since, however, a light extraction efficiency much higher than that obtained by a conventional structure can be obtained by current spread in the p-GaAlAs layer, the use of this structure is highly advantageous. In addition to the structures described above, the same effect can be obtained by a structure in which a GaAlAs layer is formed on a light emitting portion formed of InGaAlP having a different Al content or a structure in which a light emitting portion is constituted by an InGaAlP layer and a GaAlAs layer.

Although 0.8 is used as the Al content of the $Ga_{1-p}Al_pAs$ layer of the above embodiment, the composition is not limited to that of the above embodiment but may be any composition provided that a satisfactory band gap for obtaining transparency with respect to the wavelength of light emitted from the light emitting portion is obtained.

As described above, according to the LED shown in FIG. 33 the p-GaAlAs layer having a much larger film thickness and a lower resistivity than those of the p-InGaAlP clad layer is formed on the clad layer. Therefore, a current injected from the electrode portion is spread in the p-GaAlAs layer throughout a wide region except for a portion immediately below the electrode before reaching the p-InGaAlP clad layer. As a result, since a light emitting region can be spread throughout a wide region except for the portion immediately below the electrode, a light extraction efficiency is increased to realize high-luminance light-emission.

Figure 35:
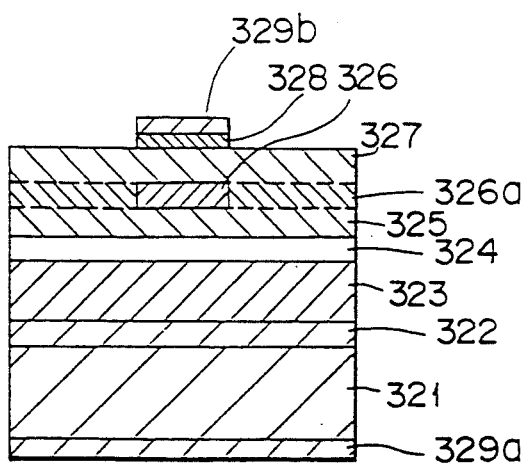
FIG. 35 is a sectional view showing an LED having a current blocking layer according to another modification of the present invention.

FIG. 35 is a sectional view showing a structure of an LED according to another embodiment of the present invention. As shown in FIG. 35, this LED has a double heterojunction structure formed by sequentially stacking a buffer layer 322 formed by Si doping to have an n-type impurity concentration of $2 \times 10^{18}$ cm$^{-3}$ and a thickness of 0.5 μm and consisting of n-GaAs, a lower clad layer 323 formed by Si doping to have an n-type impurity concentration of $2 \times 10^{18}$ cm$^{-3}$ and a thickness of 2 μm and consisting of n-In$_{0.5}$(Ga$_{0.3}$Al$_{0.7}$)$_{0.5}$P, an undoped active layer 324 having a thickness of 0.5 μm and consisting of In$_{0.5}$(Ga$_{0.55}$Al$_{0.45}$)$_{0.5}$P, a first upper clad layer 325 formed by Zn doping to have a p-type impurity concentration of $4 \times 10^{17}$ cm$^{-3}$ and a thickness of 1 μm and consisting of p-In$_{0.5}$(Ga$_{0.3}$Al$_{0.7}$)$_{0.5}$p, a current blocking layer 326 formed by Si doping to have an n-type impurity concentration of $2 \times 10^{17}$ cm$^{-3}$ and a thickness of 0.5 μm and consisting of n-In$_{0.5}$(Ga$_{0.3}$Al$_{0.7}$)$_{0.5}$P, a second upper clad layer 327 formed by Zn doping to have a p-type impurity concentration of $7 \times 10^{17}$ cm$^{-3}$ and a thickness of 1 μm and consisting of p-In$_{0.5}$(Ga$_{0.3}$Al$_{0.7}$)$_{0.5}$P, and a contact layer 321 formed by Zn doping to have a p-type impurity concentration of $1 \times 10^{18}$ cm$^{-3}$ and a thickness of 0.05 μm and consisting of p-In$_{0.5}$Ga$_{0.5}$P on a substrate 321 formed by Si doping to have an n-type impurity concentration of $3 \times 10^{18}$ cm$^{-3}$ and consisting of n-GaAs. An n-type side electrode, i.e., a first electrode 329a consisting of Au-Ge is formed on the lower surface of the substrate 321, and a p-type side electrode, i.e., a second electrode 329a consisting of Au-Zn is formed on the contact layer 328.

A method of manufacturing the LED shown in FIG. 35 will be described below with reference to FIGS. 36A to 36D.

Figures 36A, 36B:
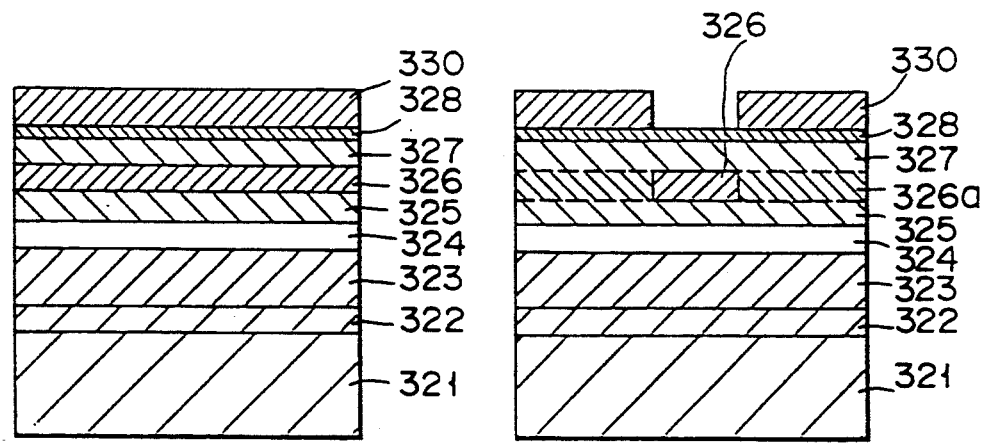
FIGS. 36A to 36D are sectional views for explaining manufacturing steps of the LED shown in FIG. 35.

Firstly, the substrate 321 formed by Si doping to have an n-type impurity concentration of $3 \times 10^{18}$ cm$^{-3}$ and consisting of n-GaAs is prepared, and Si is doped in its upper surface by a reduced-pressure atganometallic chemical vapor deposition method (to be abbreviated to a reduced pressure MOCVD method hereinafter), thereby forming the buffer layer 322 consisting of n-GaAs and having n-type impurity concentration of $3 \times 10^{18}$ cm$^{-3}$ and a thickness of 0.5 μm. Thereafter, Si is similarly doped to form the lower clad layer 322 consisting of n-In$_{0.5}$(Ga$_{0.3}$Al$_{0.7}$)$_{0.5}$P and having an n-type impurity concentration of $3 \times 10^{18}$ cm$^{-3}$ and a thickness of and the active layer 324 consisting of In$_{0.5}$(Ga$_{0.55}$Al$_{0.45}$)$_{0.5}$p and having a thickness of 0.5 μm is formed without doping. Zn is doped to form the first upper clad layer 325 consisting of p-In$_{0.5}$(Ga$_{0.3}$Al$_{0.7}$)$_{0.5}$P and having a p-type impurity concentration of $4 \times 10^{17}$ cm$^{-3}$, and a thickness of 1 μm, and Si is doped to form the current blocking layer 326 consisting of n-In$_{0.5}$(Ga$_{0.3}$Al$_{0.7}$)$_{0.5}$P and having an n-type impurity concentration of $2 \times 10^{17}$ cm$^{-3}$ and a thickness of 0.5 μm. Subsequently, Zn is doped to form the second upper clad layer 327 consisting of p-In$_{0.5}$(Ga$_{0.3}$Al$_{0.7}$)$_{0.5}$P and having a p-type impurity concentration of $7 \times 10^{17}$ cm$^{-3}$ and a thickness of 1 μm, and Zn is doped to form the contact layer 328 consisting of p-In$_{0.5}$Ga$_{0.5}$P and having a p-type impurity concentration of $1 \times 10^{18}$ cm$^{-3}$ and a thickness of 0.05 μm. These layers are thus sequentially grown to form a double heterojunction structure. Subsequently, Si is doped to grow a cap layer 330 consisting of n-GaAs and having an n-type impurity concentration of $8 \times 10^{18}$ cm$^{-3}$ and a thickness of 0.5 μm (FIG. 36A). The above reduced-pressure MOCVD method was performed at a substrate temperature of 730° C., a pressure in a reaction tube of 25 Torr, and a growth rate of 3 μm/h.

After a portion of the cap layer 330 consisting of n-GaAs to which a p-type side electrode is to be connected is removed by etching as shown in FIG. 36B, annealing is performed at 650° C. for 30 minutes. In this case, annealing is performed in a PH3 atmosphere in order to prevent evaporation of P from an exposed surface of the contact layer 318 consisting of p-In$_{0.5}$Ga$_{0.5}$P. By this annealing, the conductivity type of a portion 326a of the current blocking layer 326 consisting of n-In$_{0.5}$(Ga$_{0.3}$Al$_{0.7}$)$_{0.5}$P corresponding to a lower portion of the cap layer 30 consisting of n-GaAs is changed to p type.

Figures 36C, 36D:
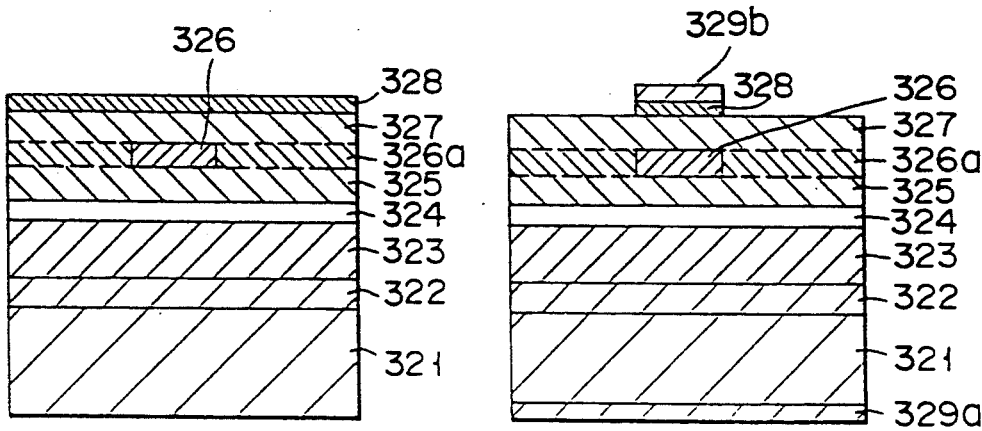

Subsequently, after the n-GaAs cap layer 330 is removed by etching as shown in FIG. 36C, an Au-Ge electrode 329a is formed on the entire lower surface of the substrate 321 consisting of n-GaAs, the Au-Zn electrode 329a is formed on the contact layer 328 consisting of p-In$_{0.5}$Ga$_{0.5}$P, and a portion of the cap layer 330 consisting of p-In$_{0.5}$Ga$_{0.5}$P except for a portion corresponding to the Au-Zn electrode 329b is removed by etching, as shown in FIG. 36D.

When a voltage was applied in a forward direction to flow a current through a 0.3-mm×0.3-mm square device having the above stacking structure, green light emission having a peak wavelength at 550 mm was observed from a peripheral portion except for the Au-Zn electrode portion. This device was molded by an epoxy resin, and a luminance of the molded device was measured. As a result, a green light emitting diode having a high luminance of more than 500 mcd was obtained. This result is remarkable as compared with a light emission luminance obtained by conventional GaP not exceeding 200 mcd.

A modification of the LED shown in FIG. 35 will be described below with reference to FIG. 37.

Figure 37:
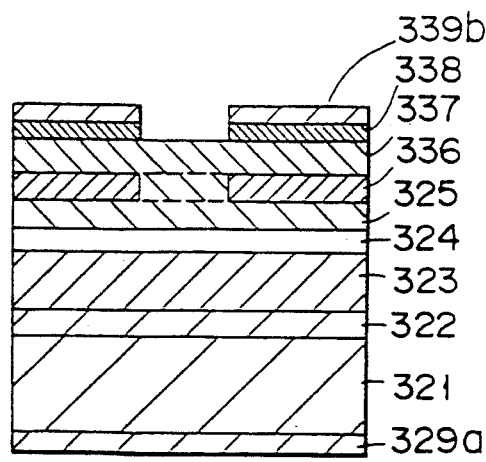
FIG. 37 is a sectional view showing a modification of the LED shown in FIG. 35.

Since an LED shown in FIG. 37 the same as that shown in FIG. 35 except for the shapes of a current blocking layer, a contact layer, and an Au-Zn electrode, the other portions are represented by the same reference numerals as in the FIG. 35 and a detailed description thereof will be omitted.

As shown in FIG. 37, each of a current blocking layer 336, and a contact layer 338 and an Au-Zn electrode 339b both of which oppose the layer 336 is formed on a peripheral portion.

This structure can be manufactured by the same manufacturing method as shown in FIGS. 36A to 36D by forming a cap layer 330 consisting of n-GaAs shown in FIG. 36C on a central portion.

According to the light emitting diode having the above structure, a current density in a light emitting region can be easily increased to be higher than that of the light emitting diode of the embodiment shown in FIG. 35, thereby realizing a light emitting diode having a higher luminance.

In the embodiment shown in FIGS. 35 to 37, $In_{0.5}(Ga_{0.3}Al_{0.7})_{0.5}P$ is used as the composition of the current blocking layer. The composition of the current blocking layer, however, is not limited to that of the above embodiment but may be any composition provided that a satisfactory band gap for obtaining transparency with respect to the wavelength of light emitted from the active layer is obtained. Although $In_{0.5}(Ga_{0.55}Al_{0.45})_{0.5}P$ is used as the composition of the active layer in the above embodiment, light emission of a visible light region from red to green regions can be obtained by changing the Al content. In the above embodiment, $In_{0.5}(Ga_{0.3}Al_{0.7})_{0.5}P$ is used as the composition of the clad layer. The composition of the clad layer, however, is not limited to that of the above embodiment but may be any composition provided that a satisfactory band gap difference for entrapping carriers is obtained with respect to the active layer. Although n-type GaAs is used as the cap layer in the above embodiment, the same effect can be obtained by using n-type GaAlAs or n-type InGaAlP. In addition, although Zn is used as an impurity to be doped in the p-type clad layer in the above embodiment, the same effect can be obtained by using another p-type impurity such as Mg.

A principle of the embodiment shown in FIGS. 35 to 37 described above will be described in detail below. A conventional light emitting diode consisting of $In_{1-y}(Ga_{1-x}Al_x)_yP$ ($0 \leq x \leq 1$ and $0 \leq y \leq 1$) has a problem in that light emission is limited to a peripheral portion of a surface electrode. The present inventors, however, have made extensive studies and found that the above conventional problem can be solved by forming an n-type current blocking portion in a p-type cad layer and the current blocking portion can be formed by selective diffusion of a p-type impurity contained in the p-type clad layer. That is, in this structure, a current flow in the p-type clad layer is bent toward a peripheral portion by a p-n junction potential barrier formed because the current blocking portion has n conductivity type. As a result, light emission occurs in a region corresponding to a portion outside a p-side electrode to improve an emission light extraction efficiency. In addition, it is found that diffusion of the p-type impurity contained in the p-type clad layer depends on the structure of a cap layer formed on the p-type clad layer. That is, a p-type InGaAlP layer containing Zn as an impurity was formed on an n-type InGaAlP layer, and a cap layer consisting of n-type GaAs was formed thereon. Thereafter, a part of the cap layer was removed by etching to form a portion at which the surface of the p-type InGaAlP layer was exposed and a portion at which its surface was covered with the cap layer, and annealing was performed. As a result, while Zn was diffused in the n-type InGaAlP layer below the portion on which the cap layer was left to convert the conductivity type of the layer to p type, no Zn was diffused in the n-type InGaAlP layer located below the portion from which the cap layer was removed and the conductivity type of the layer was still n type. Diffusion of Zn occurs more easily when the concentration of Zn contained in the p-type InGaAlP layer is higher and the Al content of the n-type InGaAlP layer is larger. Therefore, by increasing the Al content of the n-type InGaAlP layer inserted in the p-type clad layer to be larger than that of an active layer consisting of InGaAlP and setting the concentration of Zn in the p-type clad layer to be a proper value, an n-type InGaAlP layer having a shape corresponding to that of the n-type GaAs cap layer formed on the surface of the p-type clad layer can be buried in the p-type clad layer. The effect can be similarly obtained by using n-type GaAlAs or n-type InGaAlP in place of n-type GaAs as the cap layer.

As described above, according to the embodiment shown in FIGS. 35 to 37, in the light emitting diode using the $In_{1-y}(Ga_{1-x}Al_x)_yP$ system material ($0 \leq x \leq 1$ and $0 \leq y \leq 1$), the current blocking portion for spreading a current in the p type clad layer is formed and buried. Therefore, since emitted light can be extracted by current spread without being interrupted by an electrode, a high-luminance visible light emitting diode can be realized.

In addition, the present invention is very practical since the current blocking portion can be advantageously formed and buried by performing crystal growth only once.

Still another embodiment of the present invention will be described blow with reference to FIGS. 38 to 39.

Figure 38:
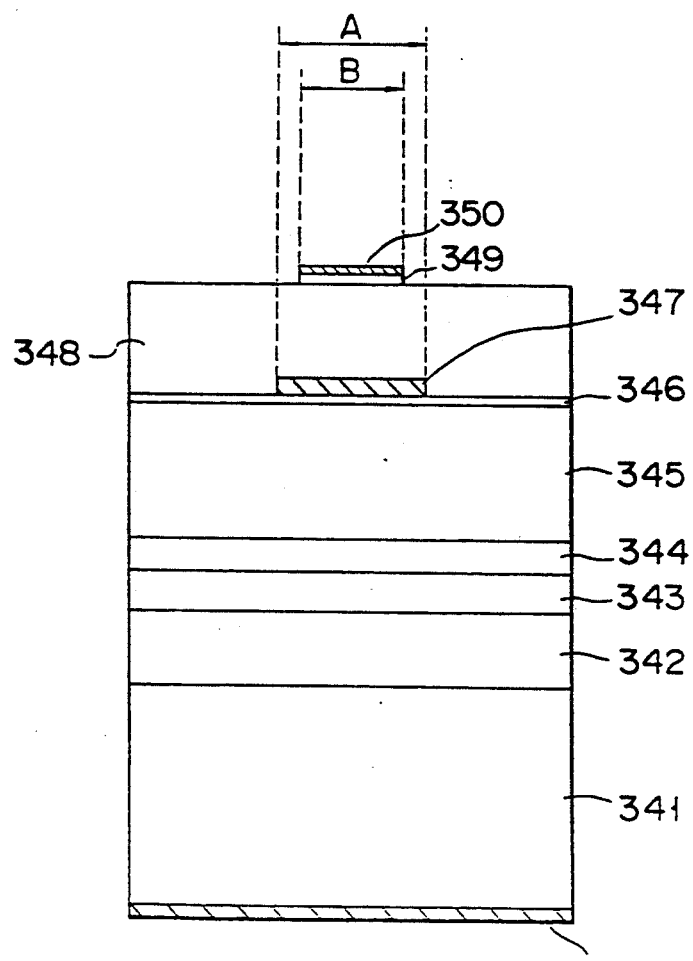

In FIG. 38, reference numerals 341 to 345 correspond to reference numerals 311 to 315 in FIG. 33. A cap layer 346 consisting of p-InGaP and a current blocking layer 347 consisting of $n-In_{0.5}(Ga_{1-z}Al_z)_{0.5}P$ are sequentially formed by a single crystal growth on a $p-Ga_{1-p}Al_pAs$ layer 345, and selective etching is performed by using hot phosphoric acid to form the current blocking layer 347 consisting of n-InGaAlP. Thereafter, a $p-Ga_{1-p}Al_pAs$ layer 348 and a contact layer 349 consisting of p-GaAs are sequentially stacked by the second crystal growth, a p-type side electrode 350 consisting of Au-Zn is formed on the contact layer 349, and an n-type side electrode 351 consisting of Au-Ge is formed on the other major surface of an n-GaAs substrate 341.

The p-type side electrode 350 is formed immediately above the current blocking layer by a lift-off method using a resist or the like or etching. A portion of the contact layer 349 consisting of p-GaAs except for a portion corresponding the electrode 350 is removed by an ammonia hydrogen peroxide system selective etchant.

If an Al composition y of the active layer 343 consisting of $In_{0.5}(Ga_{1-y}Al_{1-y})_{0.5}P$ is increased, the p-InGaP cap layer 346 serves as an absorption layer with respect to light emission of the active layer. In general, however, crystal growth cannot be performed well on a GaAlAs layer because its GaAlAs surface as a growth major surface is easily oxidized to form an oxide film, and a material having selectivity with respect to an etchant must be used in order to form the current blocking layer 347 consisting of n-InGaAlP. In this embodiment, therefore, the p-InGaP layer 346 is formed. The layer 346 need only have a thickness which can satisfy the above conditions. As the thickness is decreased, the above-mentioned absorbing effect with respect to light emission of the active layer is weakened. In this embodiment, the thickness of the layer 46 is 500 Å. The thicknesses and carrier concentrations of the layer 341 to 345 are the same as those of the layer 311 to 315 in FIG. 33, respectively. The thicknesses and carrier concentrations of the other layers are shown in the following parentheses: the current blocking layer consisting of n-In$_{0.5}$(Ga$_{1-z}$Al$_z$)$_{0.5}$P (0.15 μm, 2×10$^{18}$ cm$^{-3}$), p-Ga$_{1-p}$Al$_p$As layer 48 (5 μm, 2×10$^{18}$ cm$^{-3}$), and the contact layer 349 consisting of p-GaAs (0.1 μm, 3×10$^{18}$ cm$^{-3}$).

The above structure differs from conventional structures and the embodiment shown in FIG. 33 in that the p-GaAlAs layer 345 having a much larger thickness than that of an upper clad layer 344 consisting of p-InGaAlP is formed on the layer 344, the p-InGaP thin film and the current blocking layer 347 consisting of n-InGaAlP located immediately below the p-type side electrode are formed on the p-GaAlAs layer 345, and the p-GaAlAs layer 348 is formed on the upper surface of the layer 347 by the second crystal growth. Superiority of this structure will be described below.

As has been described above in the embodiment shown in FIG. 33, in conventional structrures, current spread in the upper clad layer consisting of p-InGaAlP is small because the resistivity of the layer is high. Since, therefore, light emission mainly occurs immediately below a current, no highly efficient LED can be obtained. In the embodiment shown in FIG. 33, however, the p-GaAlAs layer having a low resistivity is used to spread a current and therefore a light emitting region, thereby realizing a highly efficient LED. In the embodiment shown in FIG. 38, the current blocking layer 347 is formed on the p-GaAlAs layer 345 to further spread the current and the light emitting region. That is, a current injected from the electrode 350 flows into a region of the p-GaAlAs layer 348 having no current blocking layer therebelow. The current injected into the p-GaAlAs layer 345 by the effect of the embodiment shown in FIG. 33 is spread more widely to enable light emission in a wide range except for a portion immediately below the current. At this time, by setting the outer surface of the p-type side electrode to coincide with or be included in the outer surface of the current blocking layer, an influence of the electrode covering the light emitting region can be reduced. Actually, in the above stacking structure, the p-type side electrode having a diameter A of 200 μm and the current blocking layer having a diameter B of 240 μm were concentrically formed, the device was constituted by using 0.3 as the Al content y of the In$_{0.5}$(Ga$_{1-y}$Al$_y$)$_{0.5}$P active layer, and a voltage was applied in a forward direction to flow a current. As a result, light emission exceeding a luminous intensity of 1 cd and having a peak wavelength at 585 nm was obtained from a wide area of the device surface except for the p-type side electrode 350 portion. An influence of light absorption by the p-Ga$_{1-p}$Al$_p$As layer can be reduced with respect to light emission of a shorter wavelength by setting a higher content p. Actually, light emission having a luminous intensity of 1 cd was obtained in a green light emitting device having a peak wavelength at 555 nm in which p was set to be 0.7 to 0.8 and the content y of the active layer In$_{0.5}$(Ga$_{1-y}$Al$_y$)$_{0.5}$P was set to be 0.5.

In the embodiment shown in FIG. 38, the p-type side electrode and the current blocking layer are circular. The same effect as that of the above embodiment, however, can be obtained as long as the outer surface of the p-type side electrode coincides with or is included in that of the current blocking layer. In addition, although n-InGaAlP is used as the current blocking layer in the above embodiment, any material, e.g., n-GaAs can be used as long as it prevents an easy flow of an injection current and has a selective etching property with respect to the underlying cap layer. In this case, GaAs serves as an absorption layer with respect to light emission of the active layer. Since however, a light extraction efficiency obtained in the other region is increased to be much higher than that obtained in conventional structures, the use of this structure is very advantageous. Furthermore, although p-GaAlAs is used as the buried layer formed upon second crystal growth in the embodiment shown in FIG. 38, any material, e.g., p-InGaAlP may be used as long as it has a band gap capable of obtaining transparency with respect to light emission of the active layer. In this case, however, in order to obtain transparency with respect to light emission of the active layer, the Al content of the buried layer must be layer than that of the active layer.

The structure using the current blocking layer according to he embodiment shown in FIG. 38 is not limited to that shown in FIG. 38. For example, as shown in FIG. 39, a satisfactory effect of obtaining light emission in a region except for a portion immediately below an electrode can be obtained by forming a layer directly on an upper clad layer consisting of p-InGaAlP and forming a current blocking layer by a buried layer. Note that in FIG. 39, reference numerals 361 to 364 and 366 to 371 correspond to reference numerals 341 to 344 and 346 to 351 in FIG. 38, respectively.

FIG. 40 is a partially cutaway perspective view showing an LED according to still another embodiment of the present invention.

Referring to FIG. 40, reference numeral 381 denotes a substrate consisting of p-GaAs; 382, an intermediate energy gap layer consisting of p-InGaP; 383, a lower clad layer consisting of p-In$_{0.5}$(Ga$_{1-x}$Al$_x$)$_{0.5}$P, 384, an active layer consisting of In$_{0.5}$(Ga$_{1-z}$Al$_z$)$_{0.5}$P; 385, an upper clad layer consisting of n-In$_{0.5}$(Ga$_{1-y}$Al$_y$)P; 386, a contact layer consisting of n-GaAs; 387, an n-type side electrode; and 388, a p-type side electrode. The intermediate energy gap layer 382 is formed in a complementary pattern of that of the electrode 387. That is, the intermediate energy gap layer 382 is not present immediately below the n-type side electrode 378, and the lower clad layer 383 consisting of p-InGaAlP is in direct contact with an exposed portion 381a of the p-GaAs substrate 381 immediately below the electrode 387.

FIG. 41 is a sectional view showing a structure of the device shown in FIG. 40, in which a current distribution and a light emitting portion in the device are illustrated. Referring to FIG. 41, an arrow 391 indicates a current distribution in the device, and a hatched portion 392 indicates a light emitting portion. In order to obtain a high light emission efficiency, Al contents x, y, and z of each layer satisfy z≦x and z≦y, i.e., a double hetrojunction is formed such that an energy gap of an active layer 394 serving as a light emitting layer is smaller than those of the two, p- and n-type clad layer 383 and 385. Note that although an LED having such a double heterojunction structure will be described below, a layer structure of an active layer portion is not essential in terms of a light extraction efficiency, and a single heterojunctin structure or a homojunction structure can be similarly used.

In the structure as shown in FIGS. 40 and 41, a voltage drop in an interface between the substrate 381 consisting of p-GaAs and the lower clad layer 383 consisting of p-InGaAlP is much larger than those in interfaces between the substrate 381, the intermediate energy gap layer 382 consisting of p-InGaP, and the clad layer 382 consisting of p-InGaAlP. Therefore, a current selectively flows through a portion in which the intermediate energy gap layer 382 consisting of p-InGaP is present. In this case, since the resistivity of the lower clad layer 383 consisting of p-InGaAlP is higher than that of the upper clad layer 385 consisting of n-InGaAlP, the current is widely spread in the upper clad layer 385. Therefore, in the active layer 384 consisting of InGaAlP, the current flows through a peripheral portion immediately below the electrode 387.

According to this embodiment as described above, since the intermediate energy gap layer 382 is not present immediately below the electrode 387, most of light emission takes place in a portion in which the electrode 387 is not present. Therefore, emitted light is externally extracted without being interrupted by neither the contact layer 386 nor the electrode 387, thereby realizing a high extraction efficiency and therefore high-luminance light emission.

FIG. 42 is a perspective view showing a schematic arrangement of still another embodiment of the present invention, and FIG. 43 is a schematic view showing a positional relationship between an intermediate energy gap layer and an n-type side electrode in this embodiment viewed from the device surface side. In FIGS. 42 and 43, reference numerals 401 to 408 correspond to reference numerals 381 to 388 in FIG. 40, and materials and composition ratios of the respective portions are the same as those of the embodiment shown in FIG. 40 This embodiment differs from the above embodiment in patterns of the n-type side electrode and the intermediate energy gap layer. That is, a plurality of n-type side electrodes 407 are arranged to form stripes, and a plurality of intermediate energy gap layers 402 are arranged to form stripes in a direction perpendicular to the direction of the electrodes 407.

In such an arrangement of the intermediate energy gap layers 402 and the n-type side electrodes 407, portions in which the layers 402 are placed immediately below the electrodes 407 are present. Since, however, current spread to portions not covered with the electrodes 407 is large, a high light extraction efficiency can be realized. The structure shown in FIG. 42 an advantage in that no complicated mask alignment need be performed upon formation of the intermediate energy gap layers 402 and the n-type side electrodes 407.

In this embodiment, a light extraction efficiency can be further increased by arranging the intermediate energy gap layers 402 parallel to the n-type side electrodes 407, i.e., arranging the layers 402 in a complementary pattern to that of the electrodes 407. In this case, however, mask alignment must performed for the layers 402 and the electrodes 407.

The present invention is not limited to the above embodiments. In each of the embodiments shown in FIGS. 40 to 42, a semiconductor light emitting device using p-InGaP as the intermediate energy gap layer has been described. The same effect can be obtained by using a material having an intermediate energy gap between the InGaAlP or GaAlAs as the intermediate energy gap layer. In the present invention, the structure of the light emitting portion is not limited to a double heterojunction but may be a single heterojunction or a homojunction. In addition, the conductivity type of each portion can be reversed. In this case, a positional relationship of the p- and n-type clad layer is vertically reversed. Although current spread in the active layer becomes smaller than that in the above embodiments, it is still much larger than that obtained in conventional structures.

As has been described above in detail, according to the embodiments shown in FIGS. 40 to 42, the intermediate energy gap layer is selectively formed between the substrate and the light emitting portion, at least a portion immediately below the electrode at the light extraction side has no intermediate energy gap layer, and the intermediate energy gap layer is present in a region immediately below the electrode. Therefore, a current flowing from the electrode to the intermediate energy gap layer is spread to a region except for the region immediately below the electrode. As a result, a light emitting region can be spread to the region except for the region immediately below the electrode to increase a light extraction efficiency, thereby realizing a semiconductor light emitting device having a high luminance.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

What is claimed is:

1. A semiconductor light emitting device, comprising a semiconductor substrate, a double hetero structure portion formed on the substrate and consisting of an InGaAsP active layer and upper and lower clad layers having the active layer sandwiched therebetween, a first electrode formed on a part of the surface of the double hetero structure portion, and a second electrode formed on the surface of the substrate opposite to the double hetero structure portion, wherein the active layer is set to be of p-type having a carrier concentration of $1 \times 10^{17}$ cm$^{-3}$ or less and has a thickness falling within a range of between 0.05 and 0.75 micron, and a current spreading layer is interposed between the double hetero structure portion and the first electrode.

2. The semiconductor light emitting device according to claim 1, wherein the substrate is formed of GaAs, and the planar direction of the substrate is inclined from the (100) plane by 10° to 20° in the direction of [011].

3. The semiconductor light emitting device according to claim 1, wherein a reflective layer and a transparent buffer layer are formed between the substrate and the double hetero structure such that the reflective layer is in contact with the substrate and the transparent buffer layer is formed in contact with the double hetero structure portion, and the transparent buffer layer has a thickness of 20 to 100 microns.

4. The semiconductor light emitting device according to claim 1, wherein said lower clad layer is of n-conductivity type and has a carrier concentration of $1 \times 10^{16}$ cm$^{-3}$ to $7 \times 10^{17}$ cm$^{-3}$, and said upper clad layer is of p-conductivity type and has a carrier concentration of $5 \times 10^{17}$ cm$^{-3}$ to $2 \times 10^{18}$ cm$^{-3}$.

5. The semiconductor light emitting device according to claim 1, wherein said active layer has a quantum well structure.

6. A semiconductor light emitting device, comprising a semiconductor substrate, a double hetero structure, portion formed on the substrate and consisting of an InGaAsP active layer and upper and lower clad layers having the active layer sandwiched therebetween, a first electrode formed on a part of the surface of the double hetero structure portion, and a second electrode formed on the surface of the substrate opposite to the double hetero structure portion, wherein a GaAlAs current diffusion layer is interposed between the double hetero structure portion and the first electrode, said current diffusion layer having a thickness of 5 to 30 microns and a carrier concentration of $5 \times 10^{17}$ cm$^{-3}$ to $5 \times 10^{18}$ cm$^{-3}$.

7. A semiconductor light emitting device, comprising a semiconductor substrate of a first conductivity type, a reflective layer of the first conductivity type formed on the front surface of the substrate, a transparent buffer layer of the first conductivity type formed on the reflective layer, a double hetero structure portion formed of an InGaAlP series material, positioned on the transparent buffer layer, and consisting of a lower clad layer of the first conductivity type, an upper clad layer of a second conductivity type and an active layer interposed between the lower and upper clad layers, a current spreading layer of the second conductivity type formed on the double hetero structure portion, a first electrode formed on the current spreading layer, a second electrode formed on the back surface of the substrate, and a current inhibiting layer of the first conductivity type formed in a part between the double hetero structure portion and the first electrode in a manner to face the first electrode.

8. A semiconductor light emitting device, comprising a semiconductor substrate, a double hetero structure portion formed on the front surface of the substrate and consisting of an InGaAlP active layer and lower and upper clad layers having the active layer sandwiched therebetween, a first electrode formed in a part of the surface of the double hetero structure portion, and a second electrode formed on the back surface of the substrate, wherein the substrate is formed of GaAs, and the planar direction of the crystal-growing major surface of the substrate is inclined from the (100) plane by at least 5° in the [011] direction, and a current spreading layer is interposed between the double hetero structure portion and the first electrode.

9. A semiconductor light emitting device, comprising a semiconductor substrate, a double hetero structure portion formed on the front surface of the substrate and consisting of an InGaAlP active layer and lower and upper clad layers having the active layer sandwiched therebetween, a first electrode formed in a part of the surface of the double hetero structure portion, and a second electrode formed on the back surface of the substrate, wherein a current spreading layer is formed between the double hetero structure portion and the first electrode.

10. A semiconductor light emitting device, comprising a semiconductor substrate, a double hetero structure portion formed on the substrate and consisting of an InGaAsP active layer and upper and lower clad layers having the active layer sandwiched therebetween, a first electrode formed on a part of the surface of the double hetero structure portion, and a second electrode formed on the surface of the substrate opposite to the double hetero structure portion, wherein the active layer is set to be of n-type having a carrier concentration of $5 \times 10^{16}$ cm$^{-3}$ or less and has a thickness falling within a range of between 0.05 and 0.75 micron, and a current spreading layer is interposed between the double hetero structure portion and the first electrode.

* * * * *

UNITED STATES PATENT AND TRADEMARK OFFICE
CERTIFICATE OF CORRECTION

PATENT NO. : 5,153,889
DATED : OCTOBER 06, 1992
INVENTOR(S) : Hideto Sugawara, et al.

It is certified that error appears in the above-indentified patent and that said Letters Patent is hereby corrected as shown below:

Column 1, line 58, change "InGaAsP" to --InGaAlP--.

Column 2, line 19, change "InCaAlP" to --InGaAlP--

Column 3, lines 42-43, change "InGaAsP" to --InGaAlP--.

Column 6, line 68 - Column 7, lines 4 & 5, in the table change "InGaAlp" to --InGaAlP-- (three occurrences).

Column 19, line 39, change "GaAlPs" to --GaAlAs--.

Column 23, line 18, "p-InGaAsP" to --p-InGaAlP--.

Column 27, line 64, change "2ln" to --210--.

Column 31, line 36, change "p-$In_{0.5}(Ga_{0.3}Al_{0.7})_{0.5}p$" to --p-$In_{0.5}(Ga_{0.3}Al_{0.7})_{0.5}P$--.

Signed and Sealed this

Ninth Day of November, 1999

Attest:

Q. TODD DICKINSON

Attesting Officer

Acting Commissioner of Patents and Trademarks